(12) United States Patent
Kijima et al.

(10) Patent No.: US 7,371,473 B2
(45) Date of Patent: May 13, 2008

(54) FERROELECTRIC FILM, FERROELECTRIC CAPACITOR, FERROELECTRIC MEMORY, PIEZOELECTRIC ELEMENT, SEMICONDUCTOR ELEMENT, METHOD OF MANUFACTURING FERROELECTRIC FILM, AND METHOD OF MANUFACTURING FERROELECTRIC CAPACITOR

(75) Inventors: Takeshi Kijima, Matsumoto (JP); Yasuaki Hamada, Suwa (JP); Eiji Natori, Chino (JP); Koji Ohashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 255 days.

(21) Appl. No.: 11/286,286

(22) Filed: Nov. 25, 2005

(65) Prior Publication Data
US 2006/0083933 A1 Apr. 20, 2006

Related U.S. Application Data

(62) Division of application No. 10/690,021, filed on Oct. 22, 2003, now Pat. No. 7,255,941.

(30) Foreign Application Priority Data

| Oct. 24, 2002 | (JP) | ............................. 2002-309487 |
| Mar. 19, 2003 | (JP) | ............................. 2003-076129 |
| Mar. 26, 2003 | (JP) | ............................. 2003-085791 |
| Aug. 18, 2003 | (JP) | ............................. 2003-294072 |
| Aug. 27, 2003 | (JP) | ............................. 2003-302900 |

(51) Int. Cl.
*B32B 9/00* (2006.01)

(52) U.S. Cl. .......... 428/702; 252/62.9 R; 252/62.9 PZ; 257/295; 428/697; 428/701

(58) Field of Classification Search ............... 428/702, 428/701, 697; 257/295; 252/62.9 R, 62.9 PZ
See application file for complete search history.

(56) References Cited

U.S. PATENT DOCUMENTS

| 4,051,465 A | 9/1977 | Brody |
| 5,164,882 A | 11/1992 | Kanai et al. |

(Continued)

FOREIGN PATENT DOCUMENTS

CN 1301992 A 7/2001

(Continued)

OTHER PUBLICATIONS

Ryu et al., "Effect of Heating Rate on the Sintering Behavior and the Piezoelectric Properties of Lead Zirconate Titanate Ceramics," J. Am Ceram. Soc., 84, pp. 902-904, 2001.

(Continued)

*Primary Examiner*—John J. Zimmerman
*Assistant Examiner*—Aaron Austin
(74) *Attorney, Agent, or Firm*—Oliff & Berridge, PLC

(57) ABSTRACT

A ferroelectric film is formed by an oxide that is described by a general formula $AB_{1-x}Nb_xO_3$. An A element includes at least Pb, and a B element includes at least one of Zr, Ti, V, W, Hf and Ta. The ferroelectric film includes Nb within the range of: $0.05 \leq x < 1$. The ferroelectric film can be used for any of ferroelectric memories of 1T1C, 2T2C and simple matrix types.

9 Claims, 46 Drawing Sheets

U.S. PATENT DOCUMENTS

| | | | |
|---|---|---|---|
| 5,279,996 A | 1/1994 | Hase et al. | |
| 5,471,363 A | 11/1995 | Mihara | |
| 5,625,529 A | 4/1997 | Lee et al. | |
| 5,858,451 A | 1/1999 | Boyle | |
| 6,465,260 B1 | 10/2002 | Hong et al. | |
| 6,548,342 B1 | 4/2003 | Suzuki et al. | |
| 6,559,003 B2 | 5/2003 | Hartner et al. | |
| 6,624,462 B1 | 9/2003 | Kohara et al. | |
| 6,777,248 B1 | 8/2004 | Nabatame et al. | |
| 7,008,669 B2 | 3/2006 | Natori et al. | |
| 2004/0136891 A1 | 7/2004 | Kijima et al. | |
| 2004/0229384 A1 | 11/2004 | Kijima et al. | |
| 2005/0271823 A1* | 12/2005 | Kijima et al. | 427/376.6 |
| 2006/0088731 A1* | 4/2006 | Kijima et al. | 428/701 |
| 2006/0138382 A1* | 6/2006 | Kijima et al. | 252/62.9 PZ |
| 2007/0119343 A1* | 5/2007 | Kijima et al. | 106/287.19 |
| 2007/0278545 A1* | 12/2007 | Kijima | 257/295 |
| 2007/0296008 A1* | 12/2007 | Natori | 257/295 |

FOREIGN PATENT DOCUMENTS

| | | |
|---|---|---|
| CN | 1303128 A | 7/2001 |
| EP | 0 238 241 | 9/1987 |
| EP | 1 031 545 | 8/2000 |
| EP | 1 071 121 A1 | 1/2001 |
| EP | 1 078 998 | 2/2001 |
| JP | A 62-241826 | 10/1987 |
| JP | A 1-148750 | 6/1989 |
| JP | A 1-225304 | 9/1989 |
| JP | A 4-37076 | 2/1992 |
| JP | A 6-150716 | 5/1994 |
| JP | A 8-335676 | 12/1996 |
| JP | A 9-116107 | 5/1997 |
| JP | A 11-209173 | 8/1999 |
| JP | A 2000-114484 | 4/2000 |
| JP | A 2000-236075 | 8/2000 |
| JP | A 2000-299512 | 10/2000 |
| JP | A 2000-319065 | 11/2000 |
| JP | A 2001-19432 | 1/2001 |
| JP | A-2001-36030 | 2/2001 |
| JP | A 2001-80995 | 3/2001 |
| JP | A 2003-204088 | 7/2003 |
| JP | 2005100660 A * | 4/2005 |
| JP | 2005101512 A * | 4/2005 |
| JP | 2006182642 A * | 7/2006 |
| JP | 2006188427 A * | 7/2006 |
| KR | A-2001-4363 | 1/2001 |
| KR | 2001-0031913 | 4/2001 |
| WO | WO 98/08255 | 2/1998 |
| WO | WO 00/17936 | 3/2000 |
| WO | WO 02/32809 A1 | 4/2002 |
| WO | WO 02/102712 | 12/2002 |
| WO | WO 03/017479 | 2/2003 |
| WO | WO 2004038733 A1 * | 5/2004 |

OTHER PUBLICATIONS

Bellaiche et al., "Intrinsic Piezoelectric Response in Perovskite Alloys: PMN-PT versus PZT," Physical Review Letters, vol. 83, No. 7, pp. 1347-1350, Aug. 16, 1999.

Miyazawa et al., "Electronic States of Perovskite-Type Oxides and Ferroelectricity," Jpn. J. Appl. Phys., vol. 39, pp. 5679-5682, 2000.

Kijima et al., "New Development of Ferro-electric Material for FeRAM," Abstracts of the 49$^{th}$ Meeting of the Japan Society of Applied Physics and Related Societies, 2002.

I. Pintilic, "Enhancement of the Photoconductive Properties of PbS Films Deposited on Ferroelectric Substrates", *Materials Science and Engineering B44*, pp. 292-296, (1997).

\* cited by examiner

NONE 0.5%

1%

120nm

150nm

200nm

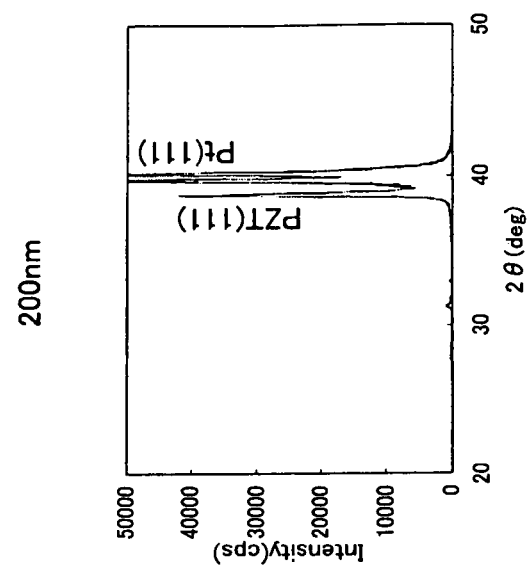
FIG. 7A 120nm
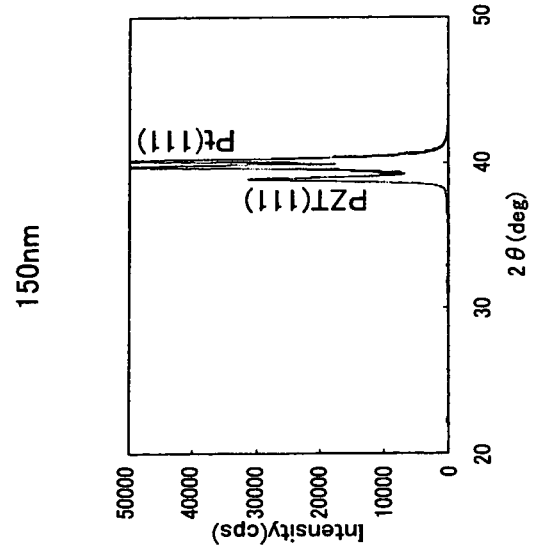
FIG. 7B 150nm
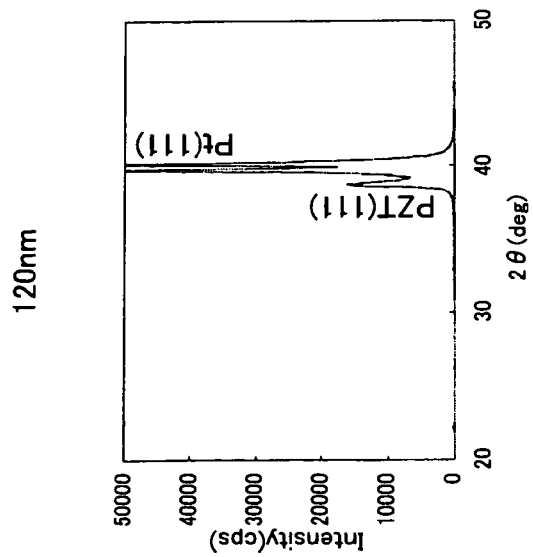
FIG. 7C 200nm

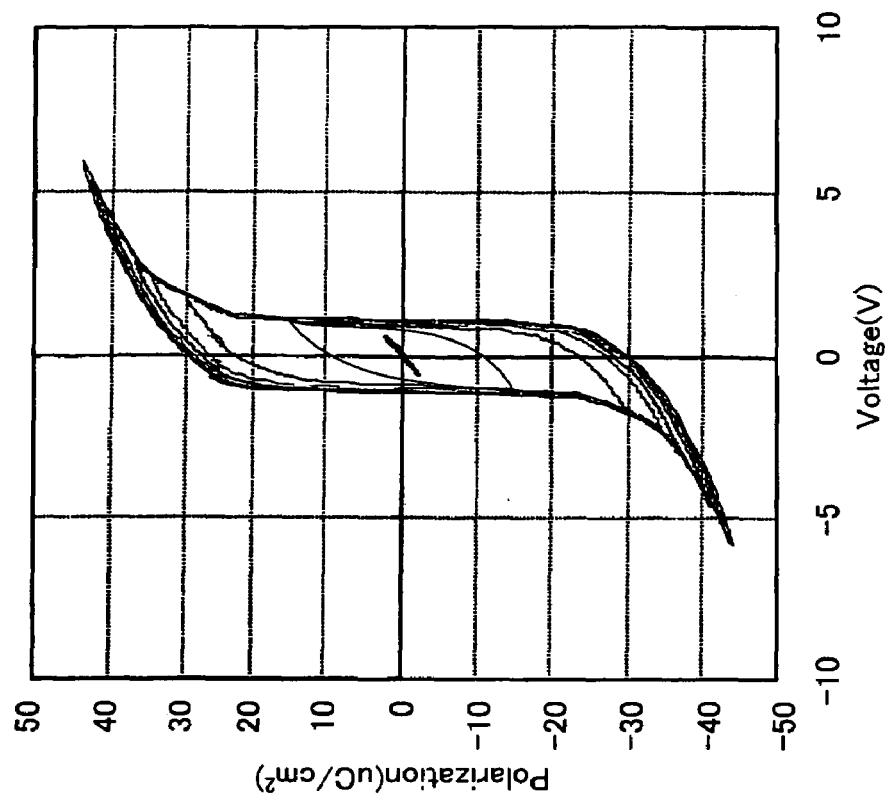
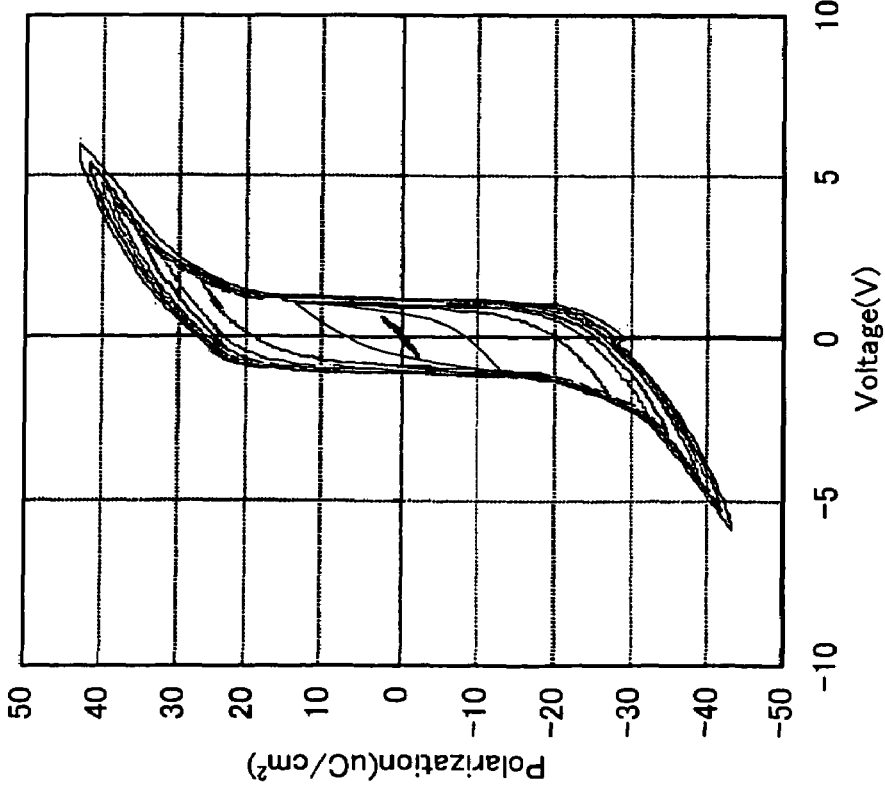

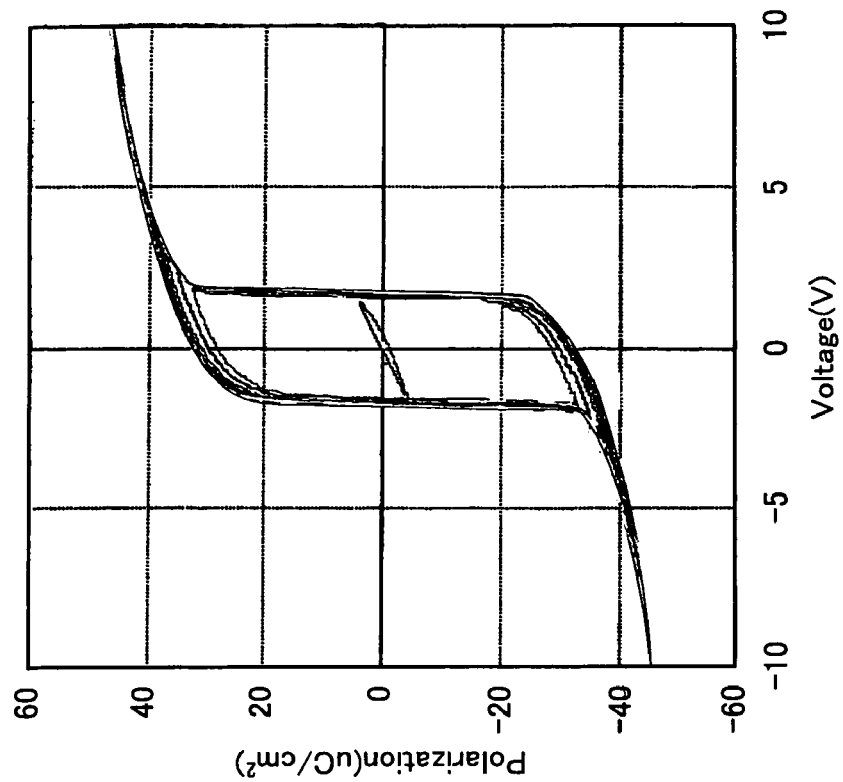
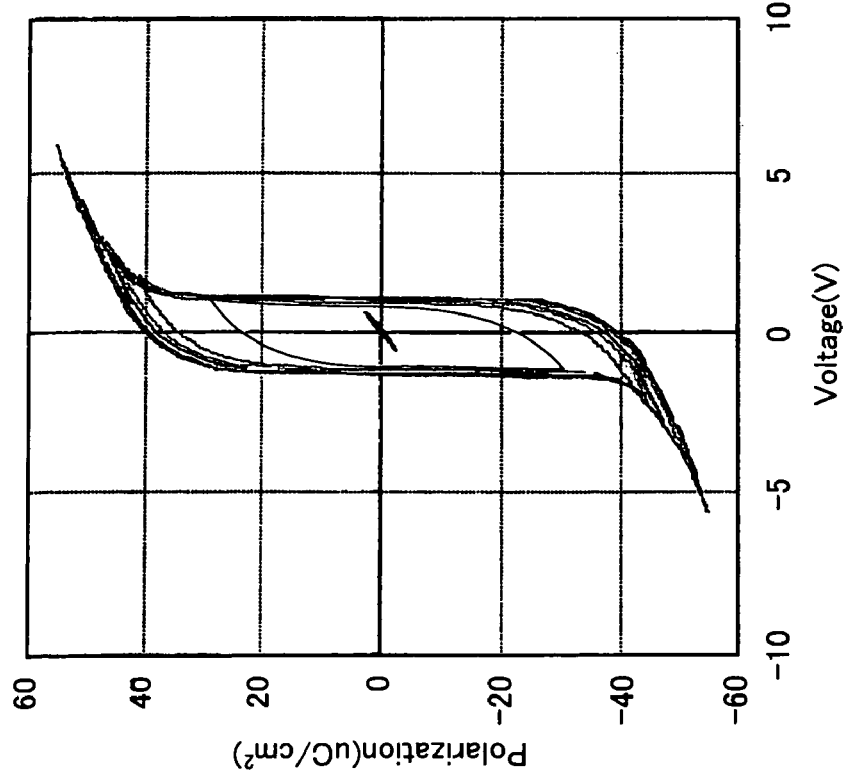

Nb=40 [mol%]

Nb=30 [mol%]

WO₃

| | QUANTITY OF ADDED Nb (mol%) | | | | |
|---|---|---|---|---|---|
| | 0 | 5 | 10 | 20 | 30 |
| a | 4.04 | 4.04 | 4.01 | 4.00 | 4.00 |
| c | 4.11 | 4.11 | 4.10 | 4.05 | 4.03 |
| V(abc) | 67.0818 | 67.0818 | 65.9284 | 64.8000 | 64.4800 |
| V/V₀ | 100.0 | 100.0 | 98.3 | 96.6 | 96.1 |

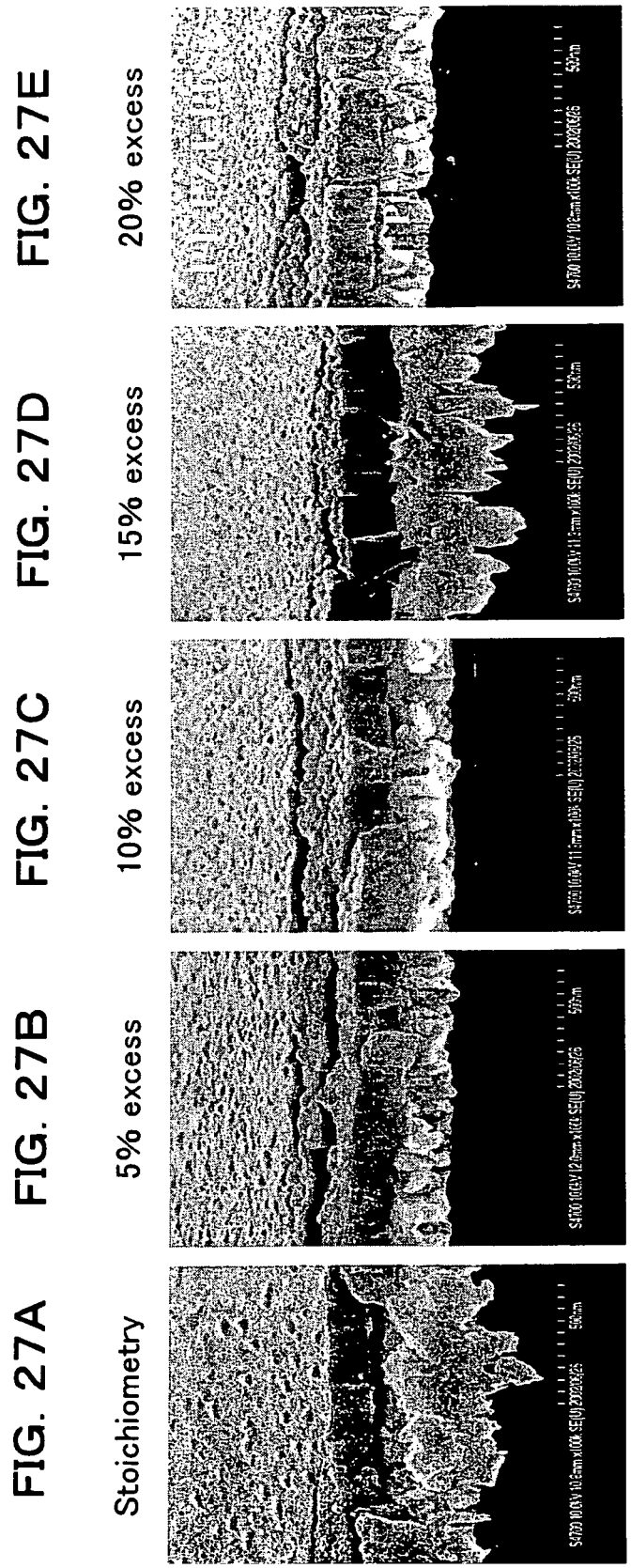

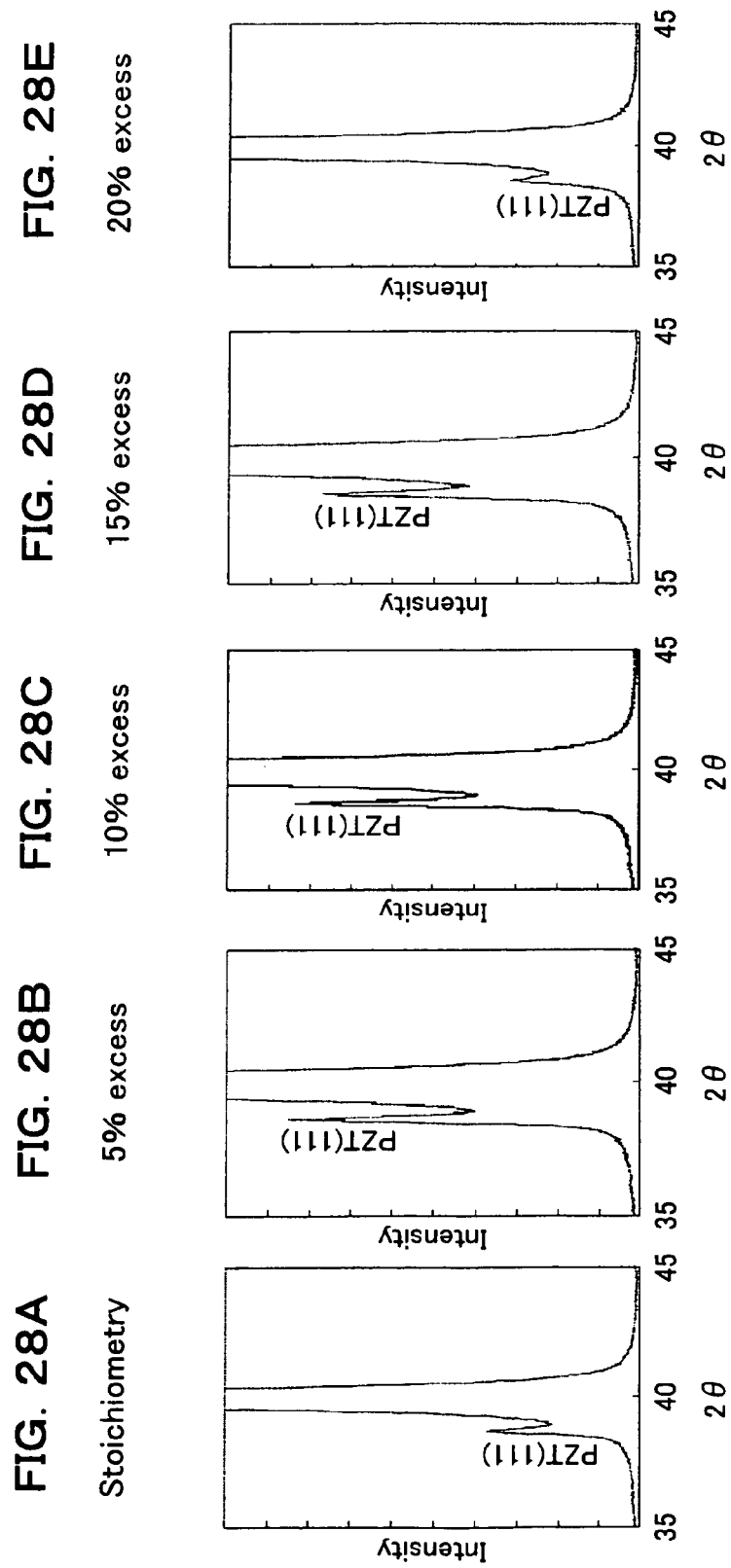

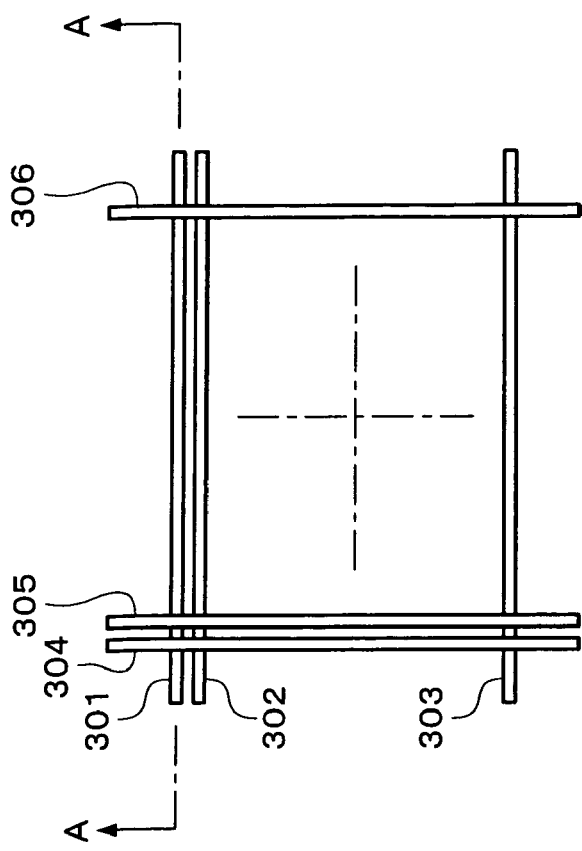
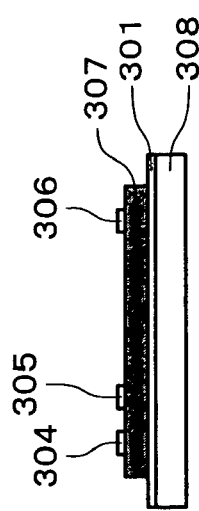

FIG. 44

| ELEMENT | ATOMIC WEIGHT | VALENCE (IONIC RADIUS (Å)) | ATOMIC RADIUS (Å) | BOND ENERGY(M-O) (kcal/mol) | IONIC ENERGY (eV) |
|---|---|---|---|---|---|
| Pb | 207.2 | +2(1.08),+4(0.78) | 1.33 | 38.8 | 7.416 |
| Zr | 91.224 | +4(0.72) | 1.6 | | 6.84 |
| Ti | 47.88 | +2(0.86),+3,+4(0.61) | 1.47 | 73 | 6.82 |
| Nb | 92.906 | +3,+4,+5(0.64) | 1.47 | | 6.88 |
| O | 54.36 | −1,−2(1.4) | | | 13.618 |

NEGATIVE ION VACANCY

CONTRIBUTES TO INCREASING LEAKAGE CURRENT

POSITIVE ION VACANCY

DOES NOT CONTRIBUTE TO INCREASING LEAKAGE CURRENT

BROWNMILLERITE STRUCTURE ($ABO_{2.5}$)

FIG. 46
POLARIZATION
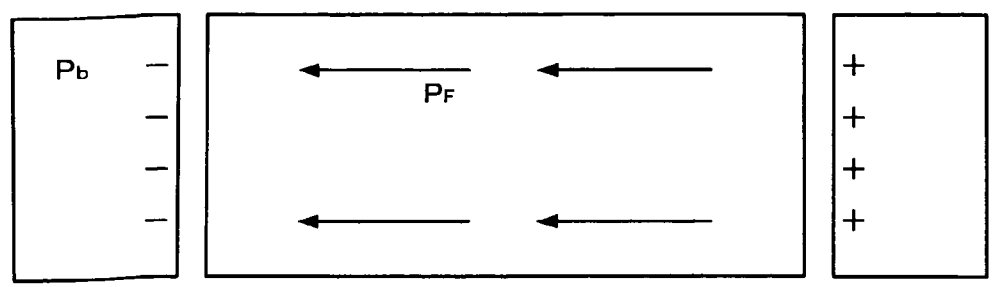
LEAVE UNDER Tc
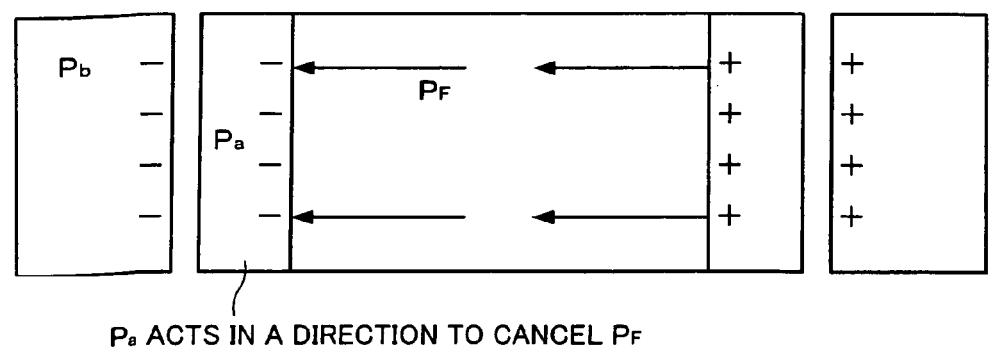
$P_a$ ACTS IN A DIRECTION TO CANCEL $P_F$

FERROELECTRIC FILM, FERROELECTRIC CAPACITOR, FERROELECTRIC MEMORY, PIEZOELECTRIC ELEMENT, SEMICONDUCTOR ELEMENT, METHOD OF MANUFACTURING FERROELECTRIC FILM, AND METHOD OF MANUFACTURING FERROELECTRIC CAPACITOR

CROSS-REFERENCE TO RELATED APPLICATION

This application is a divisional of Application No. 10/690,021, now U.S. Pat. No. 7,255,941 filed Mar. 8, 2002, which application is incorporated herein by reference in its entirety.

The disclosures of Japanese Patent Application No. 2002-309487, filed on Oct. 24, 2002, Japanese Patent Application No. 2003-76129, filed on Mar. 19, 2003, Japanese Patent Application No. 2003-85791, filed on Mar. 26, 2003, Japanese Patent Application No. 2003-294072 filed on Aug. 18, 2003, and Japanese Patent Application No. 2003-302900 filed on Aug. 27, 2003 are hereby incorporated by reference in their entirety.

BACKGROUND OF THE INVENTION

The present invention relates to a ferroelectric film, a ferroelectric capacitor, a ferroelectric memory, a piezoelectric element, a semiconductor element, a method of manufacturing a ferroelectric film, and a method of manufacturing a ferroelectric capacitor.

It has recently become popular to perform research and development into ferroelectric films of PZT or SBT or the like, as well as devices such as ferroelectric capacitors and ferroelectric memory devices that use such films. The configurations of ferroelectric memory devices are categorized into 1T type, 1T1C type, 2T2C type, and simple matrix type. Of these, the structure of the 1T type leads to the generation of internal electrical fields which shorten the retention (data preservation) to one month, so it is thought to be impossible to provide a guarantee of ten years, which is generally requested of semiconductors. The 1T1C type and the 2T2C type have mostly the same configuration as DRAM and have selection transistors, so DRAM fabrication techniques can be used therefor. Since the 1T1C type and the 2T2C type implement write speeds similar to those of SRAM, they are currently being used in small-capacitance capacitance products of 256 Kbit or less.

The ferroelectric materials used up until now have mainly been Pb(Zr, Ti)O$_3$ (PZT). With PZT, the ratio of Zr to Ti is 52/48 or 40/60 and the composition that is used is a region that is a mixture of trigonal and tetragonal crystals, or the vicinity thereof. With PZT, materials that have also been doped with elements such as Lz, Sr, or Ca are used. These regions are used because they guarantee the reliability that is most necessary for a memory element. A tetragonal region that is rich in Ti has a favorable hysteresis shape, but Schottky defects caused by the ionic crystal structure occur therein. For that reason, failures occur in the leakage current characteristic or imprint characteristic (measures of hysteresis distortion), making it difficult to ensure reliability.

A simple matrix type of memory cell, on the other hand, has a cell size smaller than those of the 1T1C and 2T2C types, and it is also possible to stack capacitors, so it is promising for high integration, inexpensive applications.

Details of a conventional simple matrix type of ferroelectric memory device are given in Japanese Patent Laid-Open No. 9-116107. This publication discloses a drive method by which a voltage that is ⅓ of the write voltage is applied to non-selected memory cells when data is written to the memory cells.

However, details concerning the hysteresis loop of the ferroelectric capacitor, which is necessary for operation, are not specifically disclosed therein. Good squareness of hysteresis loop is essential for obtaining a simple matrix type of ferroelectric memory device that can operate in practice. Ti-rich tetragonal PZT can be considered as a candidate for the ferroelectric material that can be applied thereto, but the guaranteeing of reliability is the most important technical concern therewith, in a similar manner to the 1T1C and 2T2C types of ferroelectric memory.

PZT tetragonal crystals exhibit a hysteresis characteristic that has the squareness suitable for memory applications, but they lack reliability and cannot be used in practice. The reasons for this are discussed below.

First of all, a PZT tetragonal thin film tends to have a high leakage current density after crystallization, which increases as the ratio of Ti contained therein increases. In addition, static imprint testing in which data is written once in either the positive or negative direction and the memory device is heated and held at 100° C. has shown that most of the written data disappears after 24 hours. These problems are intrinsic to the ionic crystals of PZT and to the Pb and Ti that are constituent elements of PZT, and create the greatest technical problem relating to PZT tetragonal thin film in which large proportions of the constituent elements are Pb and Ti. This technical problems is great because PZT Perovskite is ionic crystals, and is intrinsic to PZT.

A list of the main energies involved in the bonds between the constituent elements of PZT is shown in FIG. 44. It is known that PZT includes many oxygen vacancies after crystallization. In other words, it can be expected from FIG. 44 that Pb—O bonds have the smallest bond energy among the constituent elements of PZT and will simply break during baking or polarization inversions. In other words, if Pb escapes, O will also escape for reasons of charge neutrality.

During sustained heating such as imprint testing, the constituent elements of PZT vibrate and collide repeatedly, and the Ti that is the lightest constituent element of PZT can easily be knocked out by these vibrational collisions during high-temperature retention. Therefore, if Ti escapes, O will also escape for reasons of charge neutrality. Since the maximum valence of +2 for Pb and +4 for Ti contribute towards bonding, there is no way to maintain charge neutrality other than allowing O to escape. In other words, two negative O ions escape readily for every positive ion of Pb or Ti, so that Schottky defects easily form.

The description now turns to the mechanism of the generation of leakage currents due to oxygen lack in PZT crystals. FIGS. 45A to 45C illustrate the generation of leakage currents in oxide crystals having a Brownmillerite type of crystal structure described by the general formula ABO$_{2.5}$. As shown in FIG. 45A, the Brownmillerite type of crystal structure is a crystal structure having an oxygen insufficiency in comparison with the Perovskite type of crystal structure of PZT crystals having the general formula ABO$_3$. As shown in FIG. 45B, since oxygen ions appear in the vicinity of positive ions in the Brownmillerite type of crystal structure, positive ion defects make it difficult for excessive leakage current to increase. However, oxygen ions link the entire PZT crystal in series as shown in FIG. 45C, and leakage currents increase accordingly in the case of a Brownmillerite type of crystal structure, in which the oxygen vacancy is larger than the above description.

In addition to the above-described generation of leakage currents, insufficiencies of Pb and Ti and the concomitant insufficiency of O, which are lattice defects, cause spatial charge polarization such as that shown in FIG. 46. When that happens, reverse electrical fields due to lattice defects are created by the electrical fields of ferroelectric polarization can occur, causing a state in which the bias potential is impeded in the PZT crystals, and hysteresis shift or collapse can occur as a result. Furthermore, these phenomena are likely to occur quicker as the temperature increases.

The above problems are intrinsic to PZT and it is considered difficult to analyze these problems in pure PZT, so that up until now it has not been possible to implement suitable characteristics for a memory element made by using tetragonal PZT.

In ferroelectric memory, one factor that determines the characteristics of the device is the crystallization state of the ferroelectric film included within the ferroelectric capacitor. The process of manufacturing ferroelectric memory has processes for forming an interlayer dielectric and a protective film, and processes that generate large quantities of hydrogen are used. Since the ferroelectric film at this point is mainly formed of oxides, the oxides are reduced by the generated hydrogen during the fabrication process, which has an undesirable effect on the characteristics of the ferroelectric capacitor.

For that reason, a resistance to reduction is secured for the ferroelectric capacitor in the conventional ferroelectric memory by covering the capacitor with a barrier film such as an aluminum oxide layer or an aluminum nitride layer, to prevent deterioration of the characteristics of the ferroelectric capacitor. However, such a barrier film necessitates the use of extra real estate during the integration of the ferroelectric memory, making it desirable to find a method that enables the manufacture of ferroelectric memory by a simpler process, from the productivity point of view as well.

BRIEF SUMMARY OF THE INVENTION

The present invention may provide a 1T1C, 2T2C, or simple matrix type of ferroelectric memory including a ferroelectric capacitor having a hysteresis characteristic that can be used in any of a 1T1C, 2T2C, or simple matrix type of ferroelectric memory. The present invention may also provide a ferroelectric film that is suitable for the above-described ferroelectric memory, together with a method of manufacturing the same. The present invention may further provide a piezoelectric element and semiconductor element in which the above-described ferroelectric film is used. The present invention may still further provide a ferroelectric capacitor, a method of manufacture thereof, and a ferroelectric memory in which the ferroelectric capacitor is used, wherein satisfactory characteristics are maintained by a simple process that does not necessitate a barrier film.

A ferroelectric film according to one aspect of the present invention is described by a general formula $AB_{1-x}Nb_xO_3$, an A element includes at least Pb, a B element includes at least one of Zr, Ti, V, W, Hf and Ta, and Nb is included within the range of: $0.05 \leq x < 1$.

BRIEF DESCRIPTION OF THE DRAWINGS

FIGS. 7A to 7C show the relationship between film thickness and crystallinity of PZTN films in accordance with the first embodiment;

FIGS. 17A and 17B show the hysteresis characteristics of PZTN films in accordance with a second embodiment.

FIGS. 18A and 18B show the hysteresis characteristics of PZTN films in accordance with a second embodiment.

FIGS. 27A to 27E show the surface morphologies of PZTN films, as a reference example;

FIGS. 28A to 28E show the crystallinities of PZTN films, as a reference example;

FIG. 35A is a schematic plan view of a simple matrix type of ferroelectric memory device and FIG. 35B is a schematic section through the simple matrix type of ferroelectric memory device;

FIG. 44 lists characteristics relating to bonds of constituent elements of PZT-family ferroelectric materials;

FIG. 46 is illustrative of ferroelectric spatial charge polarization.

DETAILED DESCRIPTION OF THE EMBODIMENT

Figure 1:
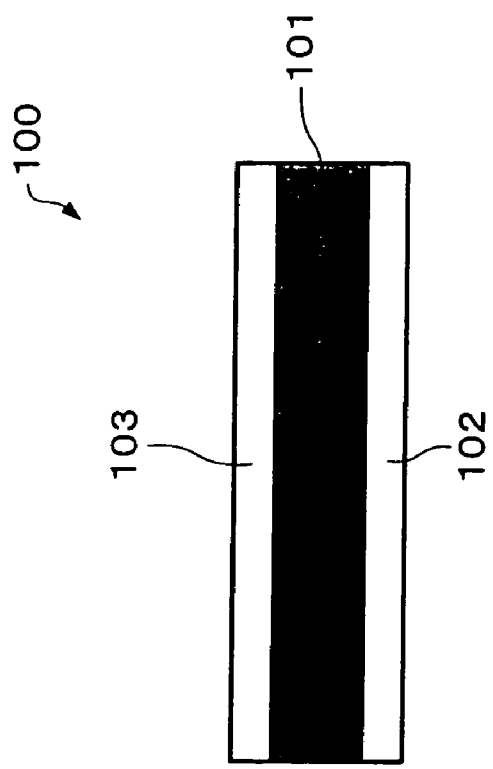
FIG. 1 is a schematic section through a ferroelectric capacitor.

1) A ferroelectric film according to an embodiment of the present invention is described by a general formula $AB_{1-x}Nb_xO_3$, an A element includes at least Pb, a B element includes at least one of Zr, Ti, V, W, Hf and Ta, and Nb is included within the range of: $0.05 \leq x < 1$.

The A element may include $Pb_{1-y}Ln_y$ ($0 < y \leq 0.2$). Ln includes at least one of La, Ce, Pr, Nd, Pm, Sm, Eu, Gd, Tb, Dy, Ho, Er, Tm, Yb and Lu.

2) A ferroelectric film according to an embodiment of the present invention is described by a general formula $(Pb_{1-y}A_y)(B_{1-x}Nb_x)O_3$, and an A element includes at least one of La, Ce, Pr, Nd, Pm, Sm, Eu, Gd, Th, Dy, Ho, Er, Tm, Yb and Lu, a B element includes at least one of Zr, Ti, V, W, Hf and Ta, and Nb is included within the range of: $0.05 \leq x < 1$ (more desirably $0.1 \leq x \leq 0.3$).

3) With a PZT-family ferroelectric film according to an embodiment of the present invention, a Ti composition is greater than a Zr composition, and at least 2.5 mol % and not more than 40 mol % (more desirably at least 10 mol % and not more than 30 mol %) of the Ti composition is substituted by Nb. This PZT-family ferroelectric film may have a crystal structure of at least one of tetragonal and rhombohedral systems. This PZT-family ferroelectric film may include Si, or Si and Ge of at least 0.5 mol % (more desirably at least 0.5 mol % and less than 5 mol %).

This PZT-family ferroelectric film may be formed by using a sol-gel solution.

4) A PZT-family ferroelectric according to an embodiment of the present invention is described by a general formula $ABO_3$, Pb is included as a constituent element in an A site and at least Zr and Ti are included as constituent elements in a B site. Amount of Pb vacancy in the A site is equal to or less than 20 mol % of the stoichiometric composition of the $ABO_3$. This PZT-family ferroelectric film may include Nb in the B site with a compositional ratio equivalent to twice the Pb vacancy in the A site. With this PZT-family ferroelectric film, a Ti composition may be higher than a Zr composition in the B site, and also the ferroelectric may have a crystal structure of rhombohedral system. This PZT-family ferroelectric film may be formed by using a sol-gel solution.

5) With a method of manufacturing the above ferroelectric film according to an embodiment of the present invention, a mixture of at least a sol-gel solution for $PbZrO_3$, a sol-gel solution for $PbTiO_3$, and a sol-gel solution for $PbNbO_3$ is used as the sol-gel solution for forming the ferroelectric film.

With this method of manufacturing a ferroelectric film, a sol-gel solution for forming $PbSiO_3$ may be further mixed into the mixture to be used as the sol-gel solution for forming the ferroelectric film.

6) With a method of manufacturing the above ferroelectric film according to an embodiment of the present invention, when the stoichiometric composition of Pb that is a constituent element of the A site is assumed to be 1, the ferroelectric film is formed by using a sol-gel solution in which Pb is included within the range of 0.9 to 1.2.

7) With this method of manufacturing the ferroelectric film, the PZT-family ferroelectric film may be formed on a metal film formed of a platinum-group metal.

8) With this method of manufacturing the ferroelectric film, the platinum-group metal may be at least one of Pt and Ir.

9) The ferroelectric memory in accordance with an embodiment of the present invention includes a first electrode leading up from the source or drain electrode of a CMOS transistor that has been formed on an Si wafer previously, a ferroelectric film formed on the first electrode, and a second electrode formed on the ferroelectric film. A capacitor formed of the first electrode, the ferroelectric film and the second electrode is a ferroelectric memory that performs a selection operation by the CMOS transistor that was formed on an Si wafer in advance. The ferroelectric film is formed from tetragonal PZT having a Ti ratio of at least 50%, at least 5 mol % but not more than 40 mol % of the Ti composition is substituted by Nb, and Si and Ge of at least 1 mol % is included therein.

10) The ferroelectric memory in accordance with an embodiment of the present invention is a ferroelectric memory including a previously formed first electrode, a second electrode arranged in a direction intersecting the first electrode, and a ferroelectric film disposed in at least an intersecting region between the first electrode and the second electrode. Capacitors form of the first electrode, the ferroelectric film, and the second electrode are disposed in a matrix. The ferroelectric film is formed from tetragonal PZT having a Ti ratio of at least 50%, at least 5 mol % but not more than 40 mol % of the Ti composition is substituted by Nb, and Si and Ge of at least 1 mol % is included therein.

11) A method of manufacturing a ferroelectric memory in accordance with an embodiment of the present invention includes crystallizing a sol-gel solution for forming $PbZrO_3$ that is a first raw material solution, a sol-gel solution for forming $PbTiO_3$ that is a second raw material solution, a sol-gel solution for forming $PbNbO_3$ that is a third raw material solution, and sol-gel solution for forming $PbSiO_3$ that is a fourth raw material solution, after the first to fourth solutions have been coated. The first, second, and third raw material solutions are liquids of raw materials for forming the ferroelectric layer and the fourth raw material solution is a liquid of a raw material for forming an ordinary paraelectric layer having a catalytic effect that is essential for forming the ferroelectric layer from the first, second, and third raw material solutions.

12) A method of manufacturing a ferroelectric capacitor according to an embodiment of the present invention includes:

forming a lower electrode on a given substrate;

forming a ferroelectric film on the lower electrode, the ferroelectric film being formed of a PZTN complex oxide including Pb, Zr, Ti and Nb as constituent elements;

forming an upper electrode on the ferroelectric film;

forming a protective film so as to cover the lower electrode, ferroelectric film, and upper electrode; and performing thermal processing for crystallizing the PZTN complex oxide, at least after forming the protective film.

This embodiment uses a PZTN complex oxide that includes Pb, Zr, Ti and Nb as constituent elements as the material of the ferroelectric film, and this PZTN complex oxide is crystallized after the formation of a protective film. Thus, even if the ferroelectric film should become damaged by hydrogen generated during the processing in the formation of the protective film, the thermal processing for crystallization is performed subsequently so that the PZTN complex oxide is crystallized while any such damage is repaired. It is therefore possible to omit the process of forming a barrier layer to protect the ferroelectric film from reductive reactions, which is necessary in the prior art, thus enabling an increase in productivity and a reduction in production costs.

13) With this method of manufacturing a ferroelectric capacitor, preliminary thermal processing may be performed on the ferroelectric film in an oxidizing atmosphere during the formation of the ferroelectric film, to put the PZTN complex oxide into an amorphous state until thermal processing for crystallizing the PZTN complex oxide is performed.

This feature enables an amorphous state until the ferroelectric film has been crystallized. This makes it possible to prevent deterioration of the crystal quality due to grain boundary diffusion by keeping the ferroelectric film in the amorphous state until the protective film is formed. Since the ferroelectric film in this amorphous state is subjected to the preliminary thermal processing in an oxidizing atmosphere, oxygen can enter the film. For that reason, it is possible to crystallize the PZTN complex oxide during the thermal processing for crystallization without depending on the gases included within the atmosphere therefor.

14) With this method of manufacturing a ferroelectric capacitor, the protective film may be a silicon dioxide film and is formed by using trimethylsilane.

Since this feature makes it possible to form the protective film of silicon dioxide film by using trimethylsilane (TMS) that does not generate much hydrogen during the processing, in comparison with the tetraethyl orthosilicate (TEOS) that is generally used in the formation of silicon dioxide films, it is possible to reduce damage due to reductive reactions in the ferroelectric film.

15) With this method of manufacturing a ferroelectric capacitor, the thermal processing for crystallizing the PZTN complex oxide may be performed in a non-oxidizing atmosphere.

Since this feature makes it possible to perform the thermal processing for crystallization in a non-oxidizing atmosphere, it makes it possible to prevent oxidation damage due to high-temperature thermal processing on peripheral components outside the capacitor (such as metal wiring), even if such peripheral components are included in the device being processed.

16) A ferroelectric capacitor according to an embodiment of the present invention is manufactured by using the above manufacture method of the ferroelectric capacitor.

17) The above ferroelectric film and ferroelectric capacitor can be applied to a ferroelectric memory, piezoelectric element, and semiconductor element using the same. Preferred embodiments of the present invention are described below in detail with reference to the accompanying figures.

1. Ferroelectric Film, Ferroelectric Capacitor, and Method of Manufacture Thereof A schematic section through a ferroelectric capacitor 100 that uses a ferroelectric film 101 in accordance with an embodiment of the present invention is shown in FIG. 1.

As shown in FIG. 1, the ferroelectric capacitor 100 is formed of the ferroelectric film 101, a first electrode 102, and a second electrode 103.

The first electrode 102 and the second electrode 103 are either formed of a precious metal such as Pt, Ir, or Ru alone, or a compound material in which that precious metal is the main part. Since the diffusion of ferroelectric elements into the lower electrode 102 or the upper electrode 103 would cause variations in the composition of the interface between that electrode and the ferroelectric film 101, which would adversely affect the squareness of the hysteresis loop, a compact structure that does not permit the diffusion of ferroelectric elements into the lower electrode 102 or the upper electrode 103 is desired. Among methods of increasing the compactness of the lower electrode 102 and the upper electrode 103 is a method of forming the films by sputtering by a gas having a large mass, or a method of dispersing an oxide of a substance such as Y or L into a precious metal electrode.

The ferroelectric film 101 is formed by using a PZT-family ferroelectric formed of an oxide including Pb, Zr and Ti as constituent elements. This embodiment is particularly characterized in the use of $Pb(Zr, Ti, Nb)O_3$ (PZTN) obtained by doping Nb into Ti sites of this ferroelectric film 101.

Nb is substantially the same size as Ti (the ionic radii thereof are close and the atomic radii are the same) but is twice the weight thereof, so the atoms thereof are unlikely to escape from the lattice even if there are collisions between atoms due to lattice vibration. The valence of Nb is stable at +5, so that even if the Pb escapes, the atomic weight after the Pb has escaped can be compensated for by the $Nb^{5+}$. During the crystallization, even if Pb escape occurs, it is simpler for the small-sized Nb to enter than the large-sized O to escape.

Since there are also some Nb atoms of valence +4, it is possible that the substitution of $Ti^{4+}$ will be performed sufficiently. In addition, it is thought that the covalence of Nb is extremely strong in practice, making it difficult for Pb to escape (refer to H. Miyazawa, E. Natori, S. Miyashita; Jpn. J. Appl. Phys. 39 (2000) 5679).

Up to now, the Nb doping into PZT has been mainly performed into Zr-rich trigonal crystal regions and is extremely small, on the order of 0.2 to 0.025 mol % (refer to J. Am. Ceram. Soc, 84 (2001) 902 and Phys. Rev. Let, 83 (1999) 1347). The reason why it has not been possible to dope large quantities of Nb in this manner is considered to be because the addition of 10 mol % of Nb, for example, would require an increase in crystallization temperature to at least 800° C.

In such a case, it is preferable to further add $PbSiO_3$3 silicate in the proportion of 1 to 5 mol %, for example, during the formation of the ferroelectric film 101. This makes it possible to reduce the crystallization energy of the PZTN. In other words, if PZTN is used as the material of the ferroelectric film 101, the addition of $PbSiO_3$ silicate makes it possible to design a reduction in the crystallization temperature of the PZTN.

The description now turns to an example of a film formation method for the PZTN ferroelectric film 101 employed in the ferroelectric capacitor 100 of this embodiment.

The ferroelectric film 101 can be obtained by preparing mixed solutions formed of first to third raw material solutions including at least one of Pb, Zr, Ti and Nb, then subjecting the oxides included within these mixed liquids to thermal processing or the like, to cause them to crystallize.

An example of the first raw material solution could be a solution in which a condensation polymer for forming $PbZrO_3$ Perovskite crystals by Pb and Zr, from among constituent metal elements for the PZTN ferroelectric phase, is dissolved in a non-aqueous state in a solvent such as n-butanol.

An example of the second raw material solution could be a solution in which a condensation polymer for forming $PbTiO_3$ Perovskite crystals by Pb and Ti, from among constituent metal elements for the PZTN ferroelectric phase, is dissolved in a non-aqueous state in a solvent such as n-butanol.

An example of the third raw material solution could be a solution in which a condensation polymer for forming $PbNbO_3$ Perovskite crystals by Pb and Nb, from among constituent metal elements for the PZTN ferroelectric phase, is dissolved in a non-aqueous state in a solvent such as n-butanol.

When the ferroelectric film 101 is formed from $PbZr_{0.2}Ti_{0.8}Nb_{0.2}O_3$ (PZTN) by using the above first, second, and third raw material solutions, by way of example, the ratios of (the first raw material solution):(the second raw material solution):(the third raw material solution) could be 2:6:2. However, any attempt to use these mixed solutions for crystallization as they are would necessitate a high crystallization temperature for the manufacture of the PZTN ferroelectric film 101. In other words, since the mixing in of Nb will cause the crystallization temperature to rise abruptly, making crystallization impossible within the temperature range that enables the creation of the component at not more than 700° C., a substitution for Ti by Nb has not been used more than 5 mol % in the conventional art and it has been used only as an additive. In addition, there have been absolutely no examples of PZT tetragonal crystals in which there is more Ti than Zr. This is discussed in the previously cited J. Am. Ceram. Soc, 84 (2001) 902 and Phys. Rev. Let, 83 (1999) 1347.

This embodiment makes it possible to solve the above-described technical problems by further adding to the above-described mixed solution at least 1 mol % but less than 5 mol % of a fourth raw material solution in which a condensation polymer for forming $PbSiO_3$ crystals is dissolved in a non-aqueous state in a solvent such as n-butanol.

In other words, the use of the above-described mixture of the first, second, third, and fourth solutions makes it possible to move the crystallization temperature of the PZTN to a practicable temperature range of not more than 700° C.

Figure 2:
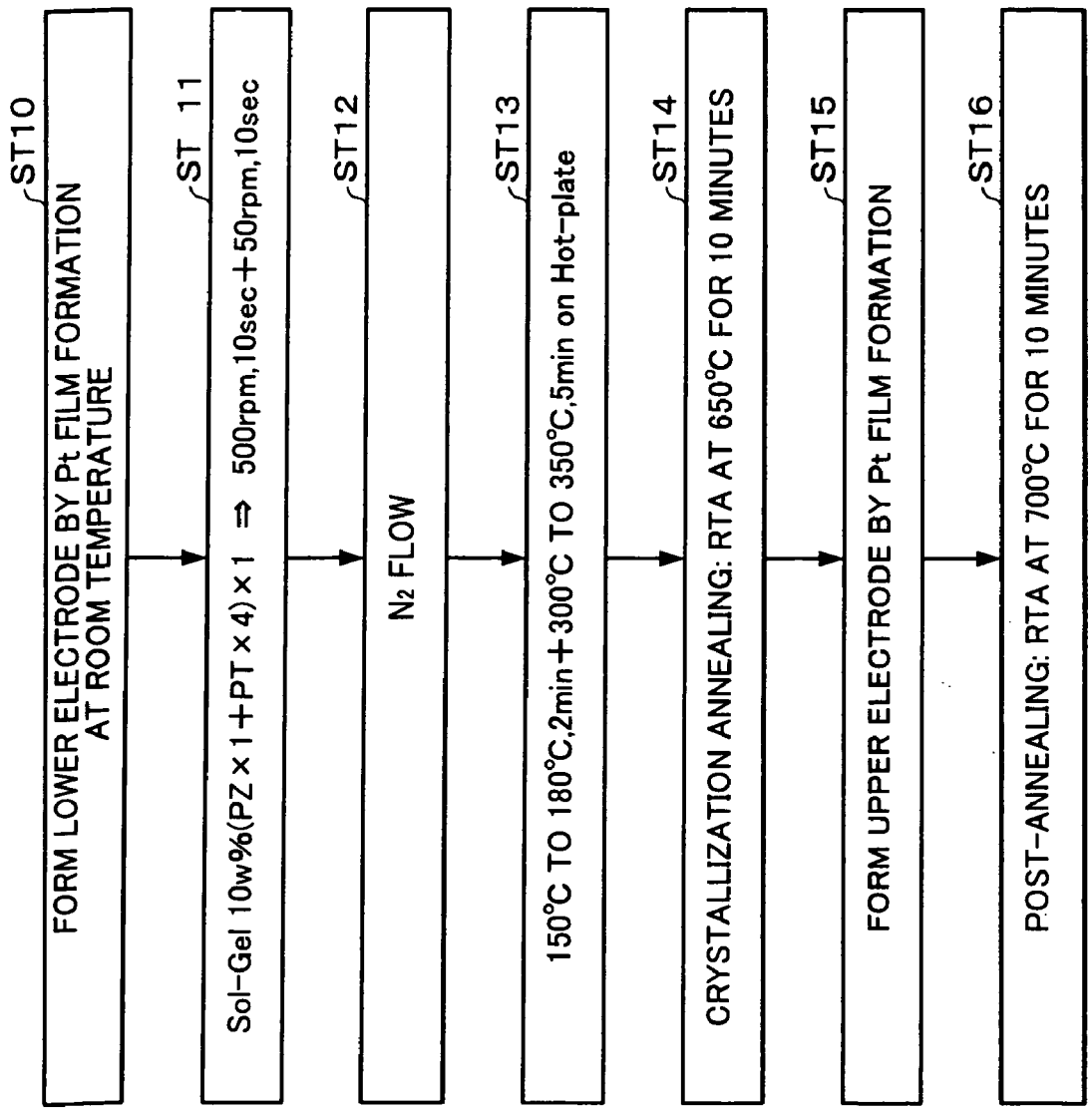
FIG. 2 is a flowchart of the formation of a PZTN film by a spin-coating method

More specifically, the ferroelectric film 101 is formed in accordance with the flowchart of FIG. 2. The ferroelectric film 101 is formed by repeating a mixed solution painting process (step ST11) then a series of an alcohol removal process, a dry thermal process, and an absorbent thermal process (steps ST12 and ST13) a desired number of times, followed by baking by crystallization annealing (step ST14).

Examples of the conditions for these processes are given below.

First of all, the film for the lower electrode is formed to cover a precious metal for the electrode, such as Pt, on a Si substrate (step ST10). A mixed liquid is then painted thereon by a method such as spin-coating (step ST11). More specifically, the mixed solution is dropped onto the Pt-covered substrate. After spinning at approximately 500 rpm with the objective of spreading the dropped solution over the entire surface of the substrate, the angular velocity is dropped to not more than 50 rpm for about 10 seconds. The dry thermal processing is done at 150° C. to 180° C. (step ST13). The dry thermal processing is done by using a hot-plate or the like in the atmosphere. Similarly, the absorbent thermal processing is done in the atmosphere on the hot-plate, which is held at 300° C. to 350° C. (step ST13). The baking for crystallization is done by using rapid thermal annealing (RTA) or the like in an oxygen atmosphere (step ST14).

The film thickness after baking can be on the order of 100 to 200 nm. After the upper electrode has been formed by sputtering or the like (step ST15), post-annealing is done with the objective of forming an interface between the second electrode and the ferroelectric thin film and improving the crystallinity of the ferroelectric thin film, using RTA or the like in an oxygen atmosphere in a similar manner to the baking (step ST16), to achieve the ferroelectric capacitor 100.

The effects of the use of the PZTN ferroelectric film 101 in the ferroelectric capacitor 100 on the hysteresis characteristic are discussed below.

Figure 3:
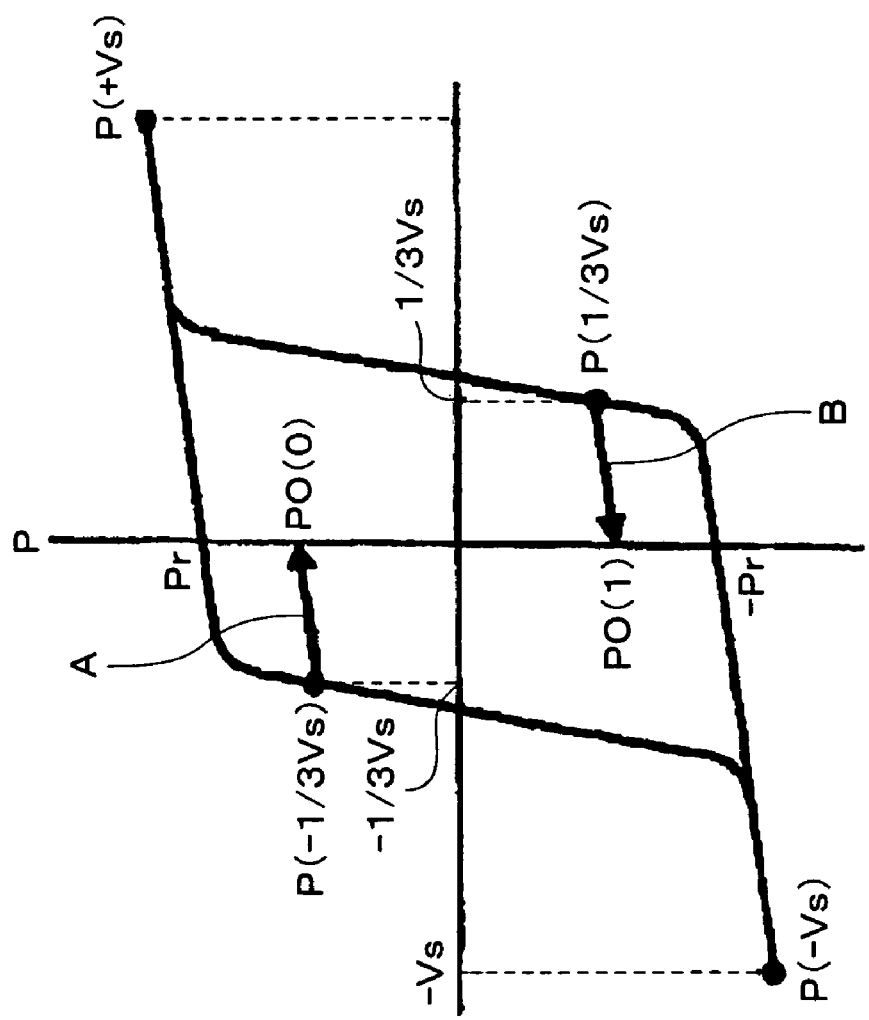
FIG. 3 is a hysteresis curve of polarization (P) versus voltage (V) of the ferroelectric capacitor.

A hysteresis curve of electric polarization (P) versus voltage (V) of the ferroelectric capacitor 100 is shown schematically in FIG. 3. First of all, when a voltage +Vs is applied, the polarization magnitude is P(+Vs), then when the voltage becomes 0 the polarization magnitude becomes Pr. When the voltage changes to −⅓Vs, the polarization magnitude is P(−⅓Vs). When the voltage then becomes −Vs, the polarization magnitude becomes (−Vs), and when the voltage is again 0, the polarization magnitude becomes −Pr. When the voltage becomes +⅓Vs, the polarization magnitude becomes P(+⅓Vs), and when the voltage is again +Vs, the polarization magnitude returns to P(+Vs).

The ferroelectric capacitor 100 also has the features described below, with respect to the hysteresis characteristic. If a voltage Vs is applied and the polarization magnitude has gone to P(+Vs) then the applied voltage goes to 0, the hysteresis loop follows the path indicated by the arrow A in FIG. 3 and the polarization magnitude holds the stable value PO(0). If a voltage −Vs is applied and the polarization magnitude has gone to P(−Vs) then the applied voltage goes to 0, the hysteresis loop follows the path indicated by the arrow B in FIG. 3 and the polarization magnitude holds the stable value PO(1). Thorough utilization of this difference between the polarization magnitude PO(0) and the polarization magnitude PO(1) makes it possible to operate a simple matrix type of ferroelectric memory device by the drive method disclosed in Japanese Patent Laid-Open No. 9-116107.

The ferroelectric capacitor 100 of this embodiment enables a reduction in the crystallization temperature, an improvement in the squareness of hysteresis loop, and an improvement in Pr. The improvement in squareness of hysteresis loop achieved by the ferroelectric capacitor 100 has the obvious effect of stabilizing major disturbances in the driving of the simple matrix type of ferroelectric memory device. In a simple matrix type of ferroelectric memory device, a voltage of $\pm\frac{1}{3}$Vs is applied even to cells that are not being written to or read, so it is necessary to have a stable disturbance characteristic to ensure that the polarization does not change with these voltage changes. The present inventors have confirmed for a general PZT that a deterioration of approximately 80% of the polarization magnitude is seen when a $\frac{1}{3}$Vs pulse is applied 108 times in the direction opposite to the polarization from a stable polarization state, but the deterioration in the ferroelectric capacitor 100 of this embodiment is not more than 10%. The use of the ferroelectric capacitor 100 of this embodiment in a ferroelectric memory device therefore makes it possible to realize a simple matrix type of memory.

A detailed description of these embodiments is given below.

FIRST EMBODIMENT

This embodiment compares the PZTN of the present invention and the PZT of the conventional art. The entire film formation flow shown in FIG. 2 was used.

Ratios of Pb:Zr:Ti:Nb=1:0.2:0.6:0.2, 1:0.2:0.7:0.1, and 1:0.3:0.65:0.5 were used. In other words, the total quantity of added Nb is 5 to 20 mol %. In this case, 0 to 1% of $PbSiO_3$ is added.

Figure 4A:
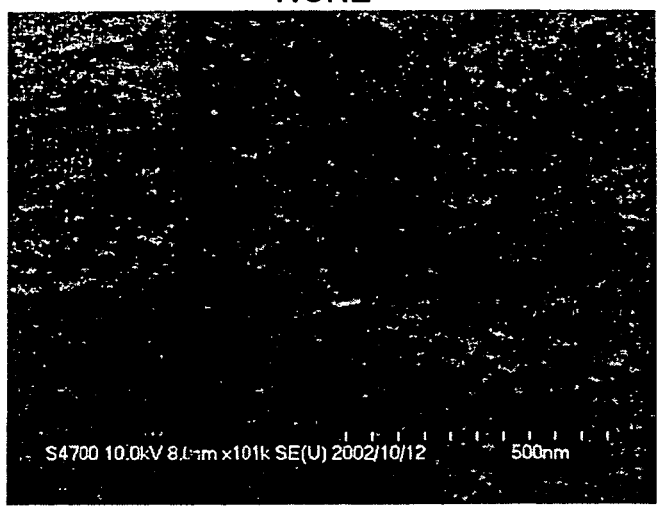
FIGS. 4A to 4C show the surface morphologies of PZTN films in accordance with a first embodiment.
Figure 4B:
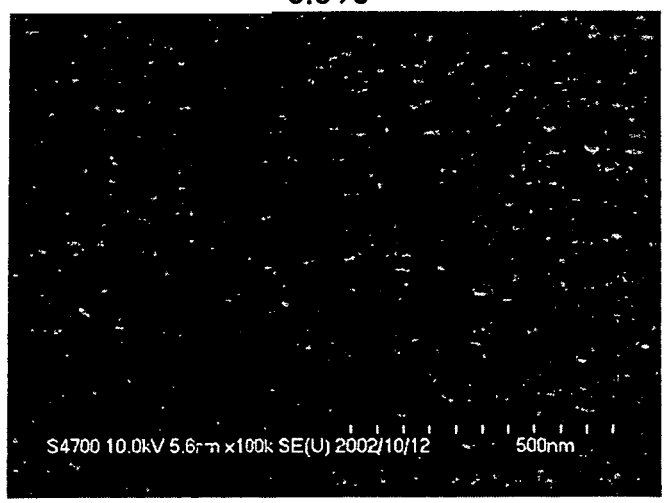
Figure 4C:
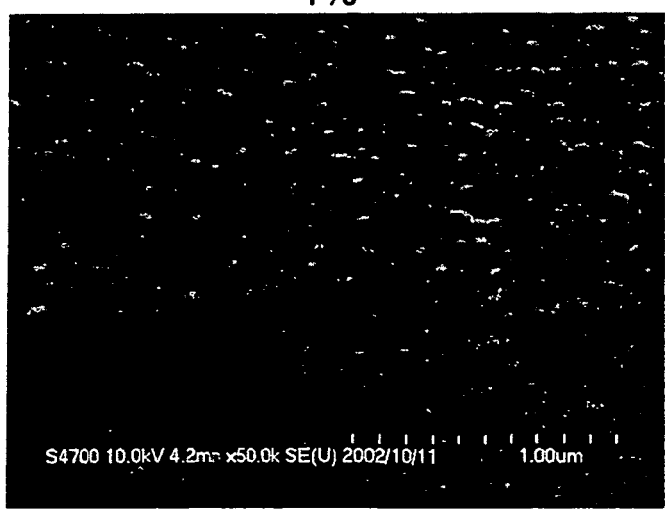
Figure 5C:
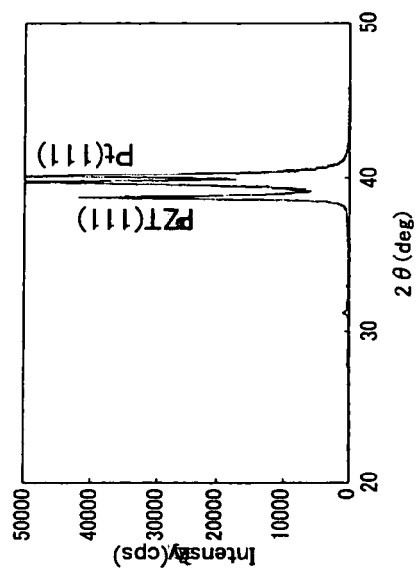
FIGS. 5A to 5C show the crystallinities of PZTN films in accordance with the first embodiment.
Figure 5B:
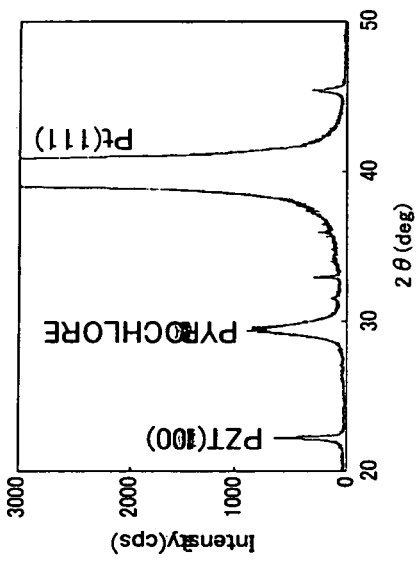
Figure 5A:
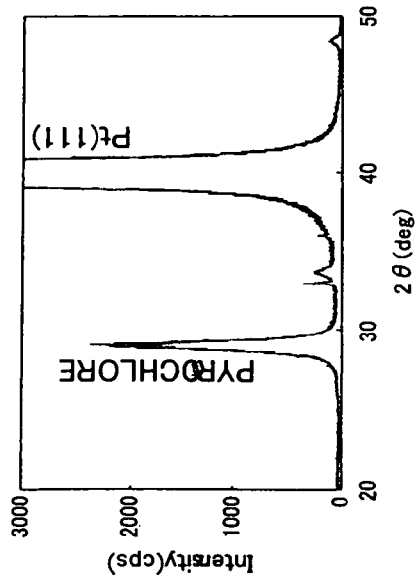

The surface morphologies of the films in this case are shown in FIGS. 4A to 4C. When the crystallinity of these films were measured by an X-ray diffraction method, the results were as shown in FIGS. 5A to 5C. With the 0% (none) case shown in FIG. 5A, only ordinary paraelectric pyrochlore is obtained, even when the crystallization temperature rises to 800° C. With the 0.5% case shown in FIG. 5B, PZT and the pyrochlore are mixed. With the 1% case shown in FIG. 5C, a single orientated film of PZT (111) is obtained. The crystallinity thereof is also good, of a quality that can not be achieved up to now.

Figure 6A:
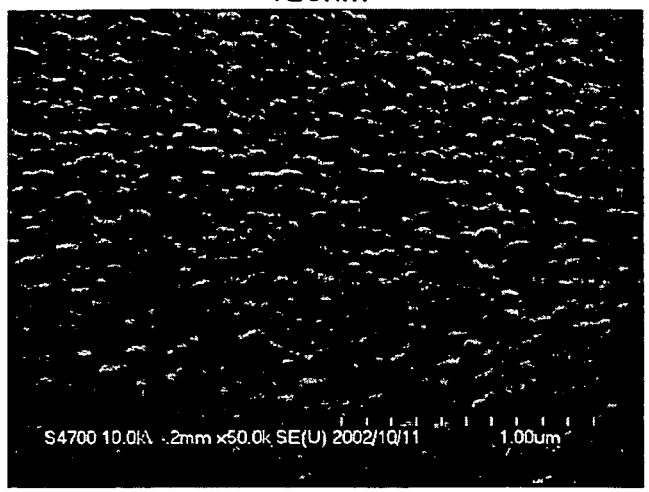
FIGS. 6A to 6C show the relationship between film thickness and surface morphology of PZTN films in accordance with the first embodiment.
Figure 6B:
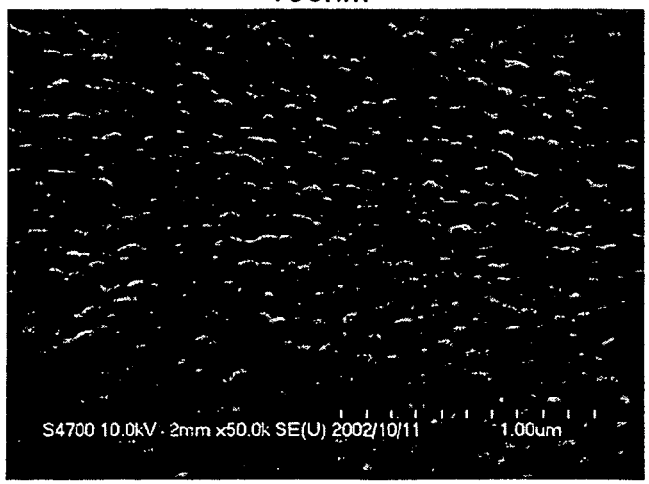
Figure 6C:
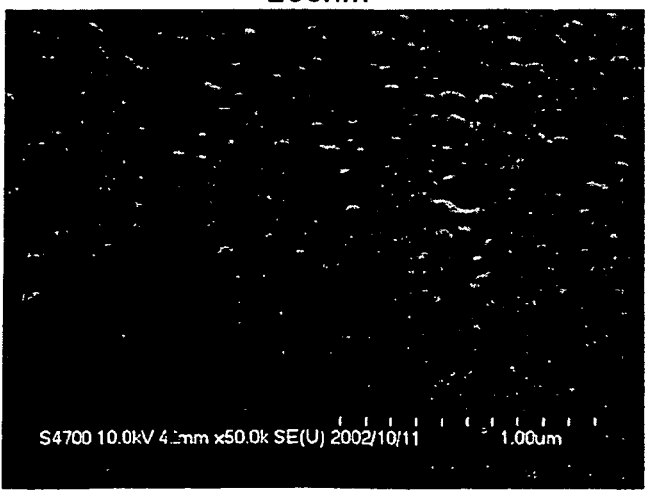
Figure 8A:
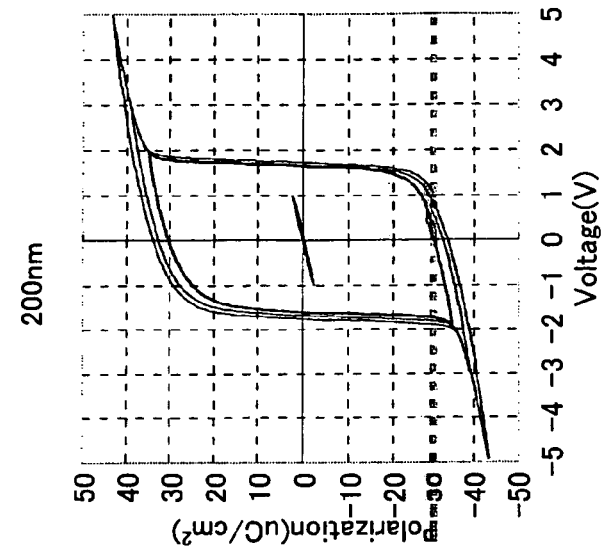
FIGS. 8A to 8C show the hysteresis characteristics for film thicknesses of PZTN films in accordance with the first embodiment.
Figure 8B:
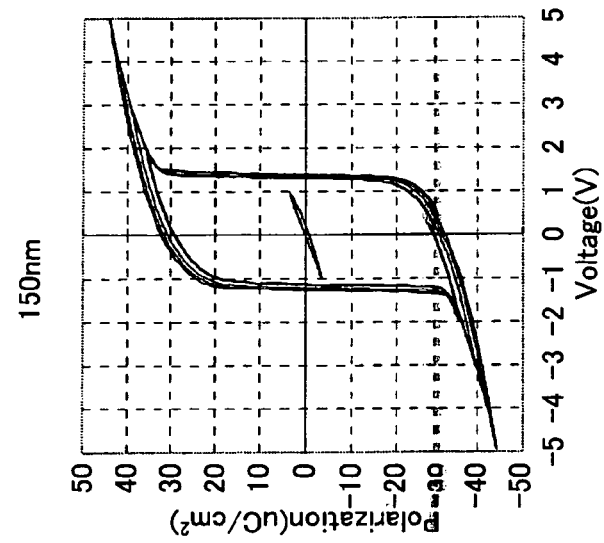
Figure 8C:
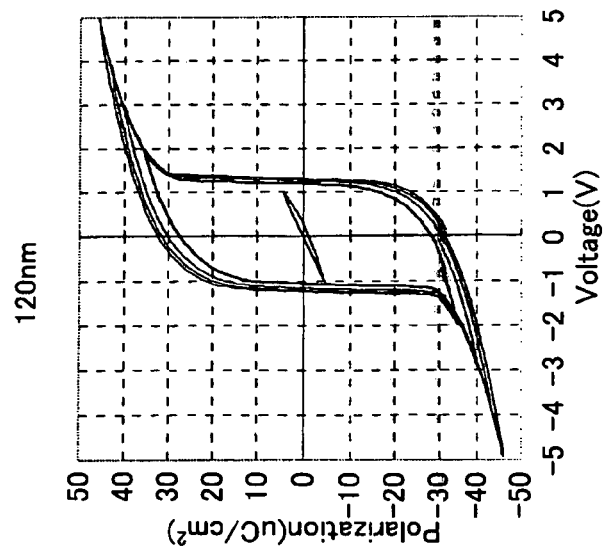
Figure 9C:
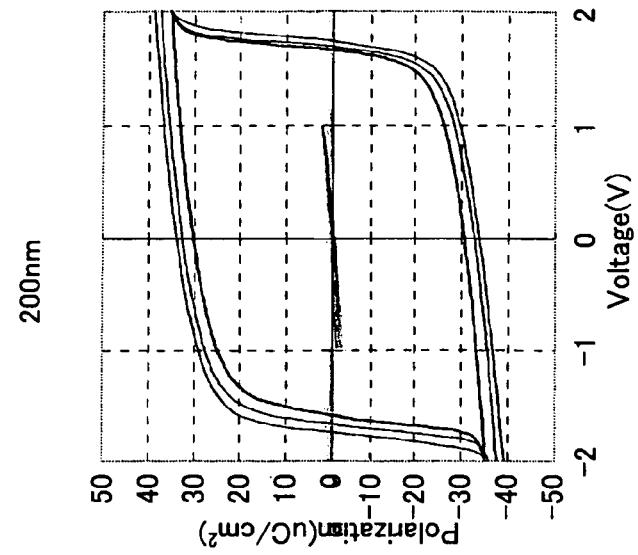
FIGS. 9A to 9C show the hysteresis characteristics for film thicknesses of PZTN films in accordance with the first embodiment.
Figure 9B:
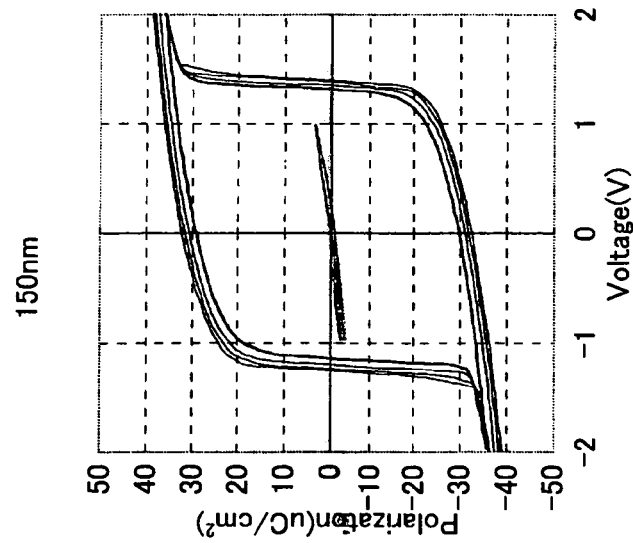
Figure 9A:
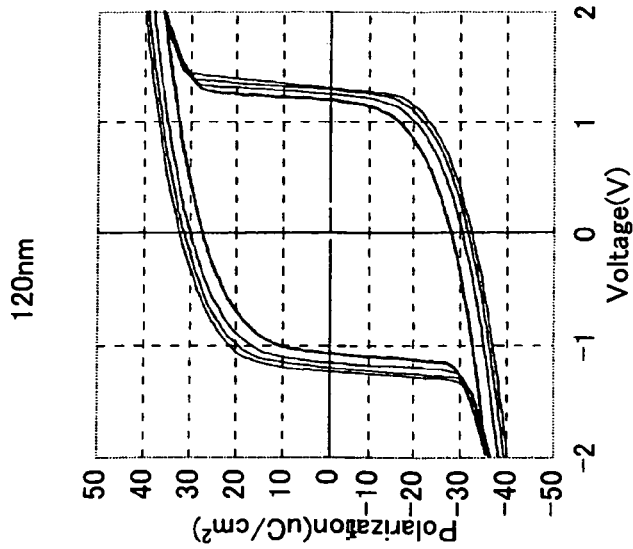

Next, the crystallinity of comparative examples of PZTN thin films with 1% of $PbSiO_3$ added thereto, for different film thicknesses of 120 to 200 nm, are shown in FIGS. 6A to 6C and FIGS. 7A to 7C. Note that FIGS. 6A to 6C are electron microphotographs of the surface morphologies for film thicknesses 120 nm to 200 nm and FIGS. 7A to 7C shown the results of measurements done by an X-ray diffraction method to demonstrate the crystallinity of PZT thin films of film thicknesses 120 nm to 200 nm. As shown in FIGS. 8A to 8C and FIGS. 9A to 9C, hysteresis characteristics with good squareness were obtained over the entire range of film thickness of 120 nm to 200 nm. Note that FIGS. 9A to 9C are enlargements of the hysteresis curves of FIGS. 8A to 8C. These results confirmed that the hysteresis curves clearly opened up and also reached saturation at low voltages of less than or equal to 2 V, in the ZPTN thin films of these examples.

Figure 10B:
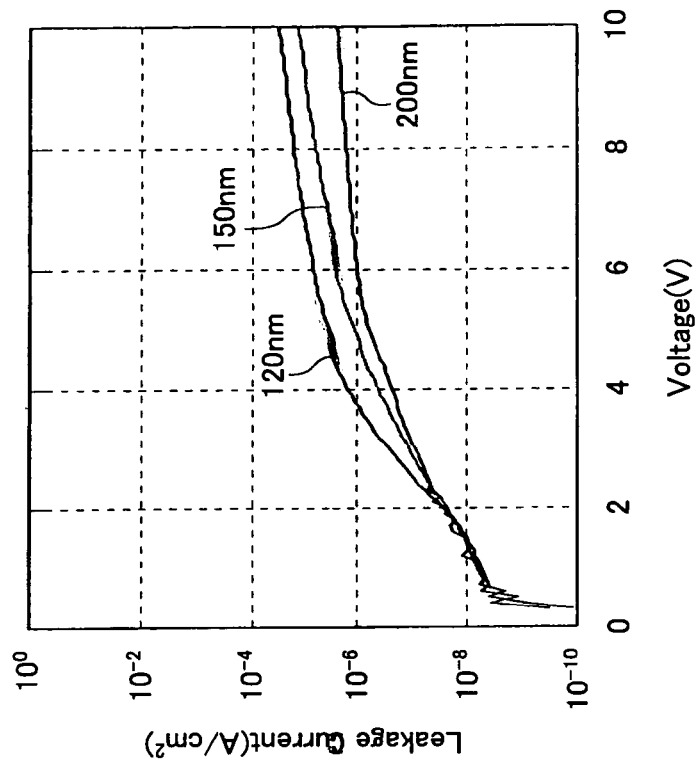
FIGS. 10A and 10B show the leakage current characteristics of PZTN films in accordance with the first embodiment.
Figure 10A:
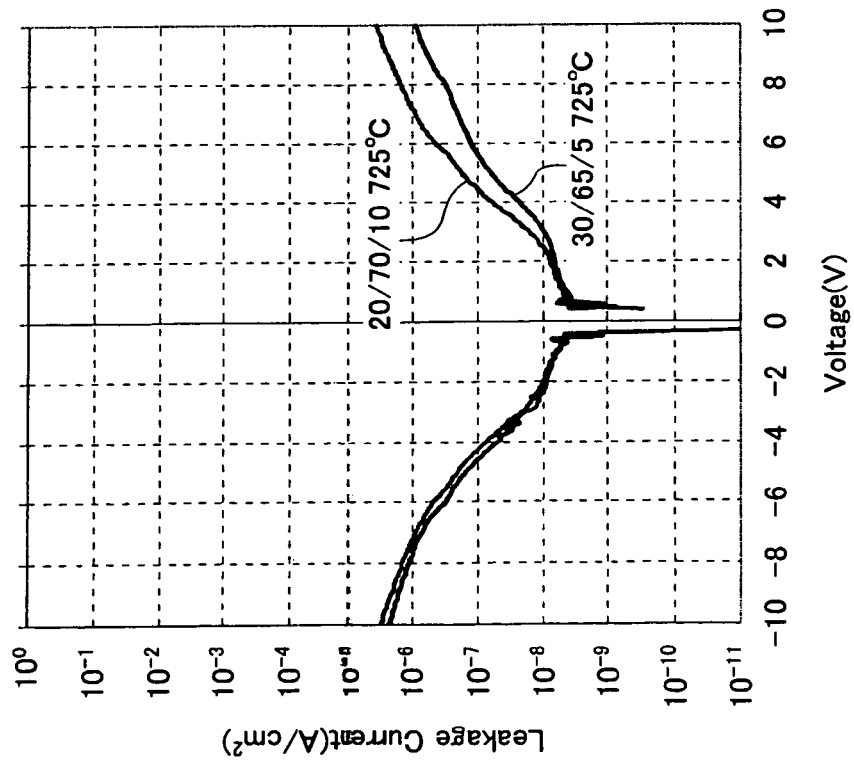

The leakage characteristics were also extremely good at $5 \times 10^{-8}$ to $7 \times 10^{-9}$ A/cm² when 2 V (saturation) was applied thereto, regardless of the film composition and film thickness, as shown in FIGS. 10A and 10B.

Figure 11B:
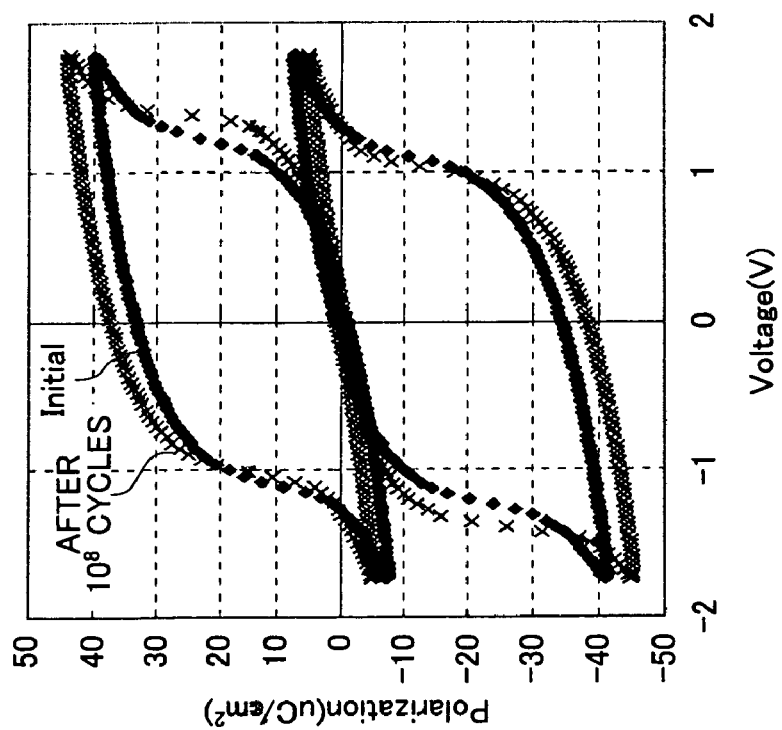
FIG. 11B shows the static imprint characteristic of a PZTN film in accordance with the first embodiment.
Figure 11A:
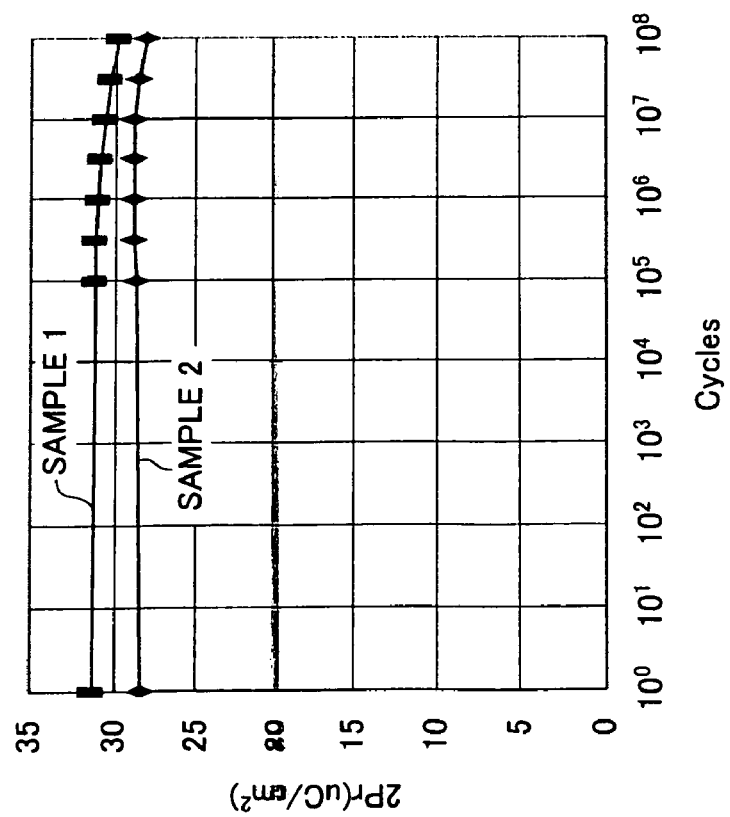
FIG. 11A shows the fatigue characteristic of a PZTN film in accordance with the first embodiment.

The results of measurements of fatigue characteristics and static imprinting of $PbZr_{0.2}Ti_{0.8}Nb_{0.2}$ thin films were also good, as shown in FIGS. 11A and 11B. In particular, the fatigue characteristic of FIG. 11A is extremely good, regardless of whether Pt was used in the upper and lower electrodes.

Figure 12:
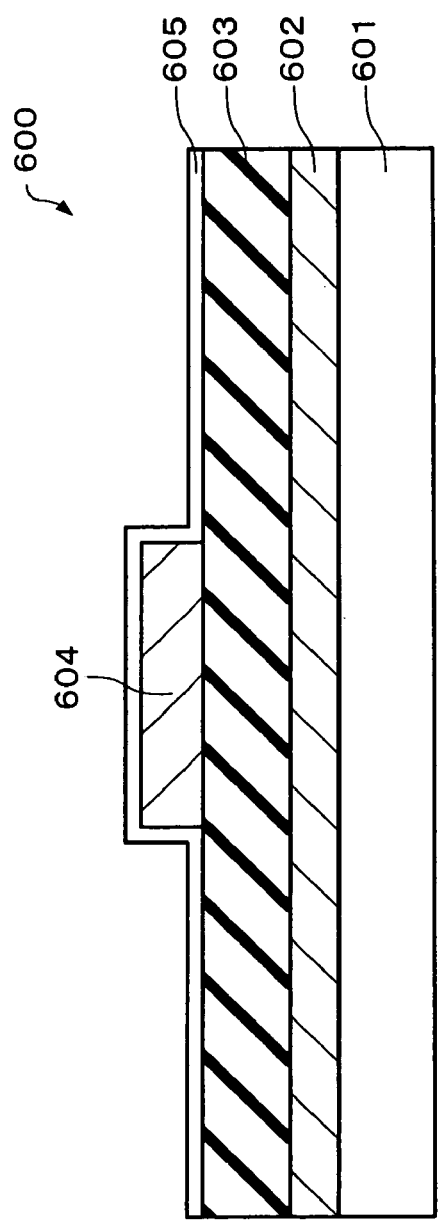
FIG. 12 shows the configuration of a ferroelectric capacitor in accordance with the first embodiment in which a $SiO_2$ protective film is formed by ozone TEOS.

Tests were also performed on an $SiO_2$ film 605 formed by ozone TEOS on a ferroelectric capacitor 600 in which a lower electrode 602, a PZTN ferroelectric film 603 of this embodiment, and an upper electrode 604 are formed on a substrate 601, as shown in FIG. 12. It is known in the art that, if an $SiO_2$ film is formed by ozone TEOS on PZT, the hydrogen emitted by the TEOS passes through the upper Pt and reduces, and the PZT crystal is so destroyed that the hysteresis phenomenon does not occur.

Figure 13:
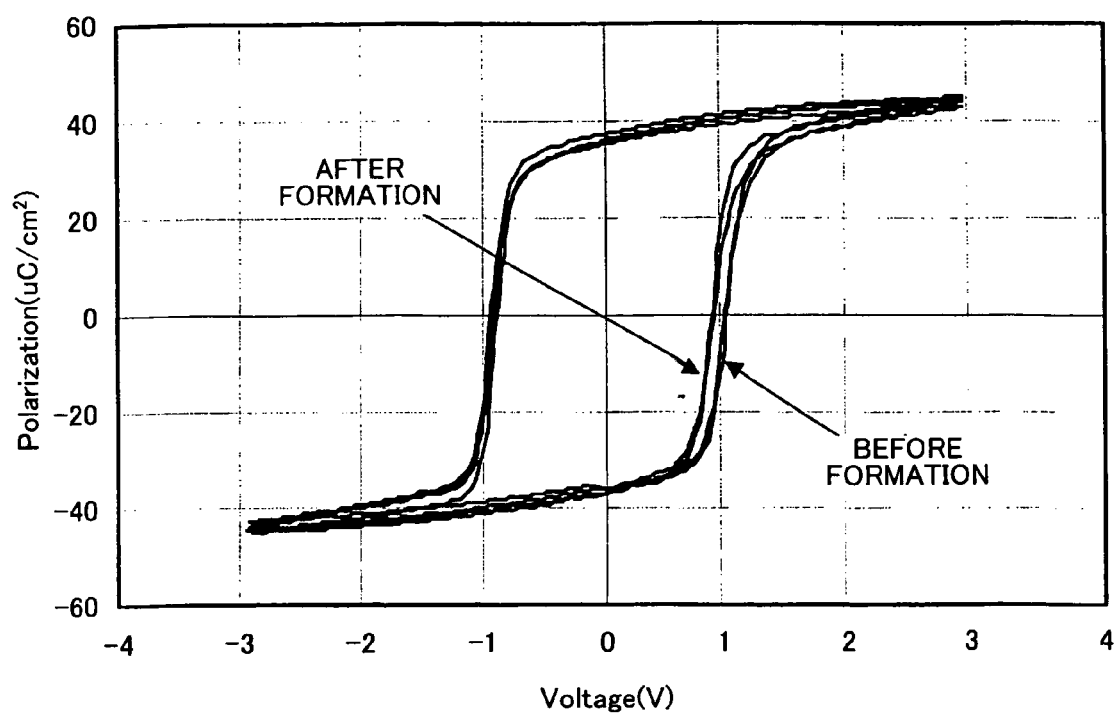
FIG. 13 shows the hysteresis characteristic of the ferroelectric capacitor in accordance with the first embodiment in which a $SiO_2$ protective film is formed by ozone TEOS.

With the PZTN ferroelectric film 603 of this embodiment, however, favorable hysteresis is maintained with substantially no deterioration, as shown in FIG. 13. In other words, it is clear that the PZTN ferroelectric film 603 of this embodiment also has a strong resistance to reduction. If the proportion of Nb in the tetragonal PZTN ferroelectric film 603 of the present invention does not exceed 40 mol %, favorable hysteresis is obtained in proportion to the quantity of Nb added.

Figure 14:
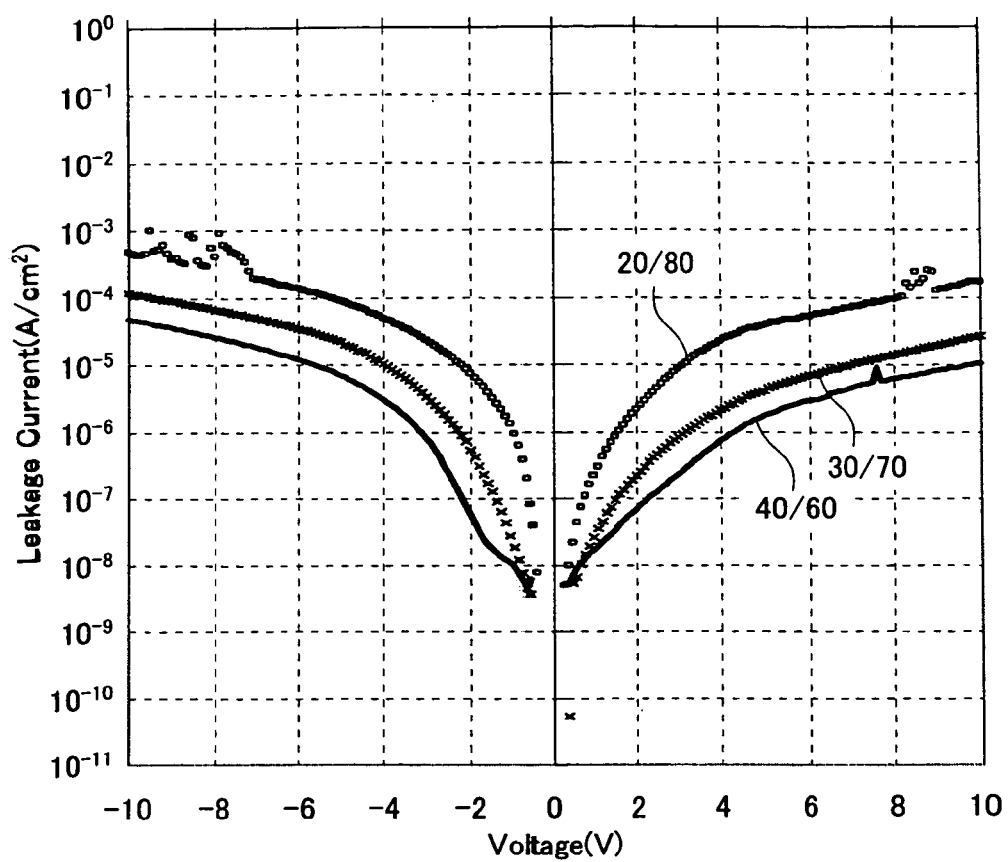
FIGS. 14 shows the leakage current characteristics of a conventional PZTN film.
Figure 15:
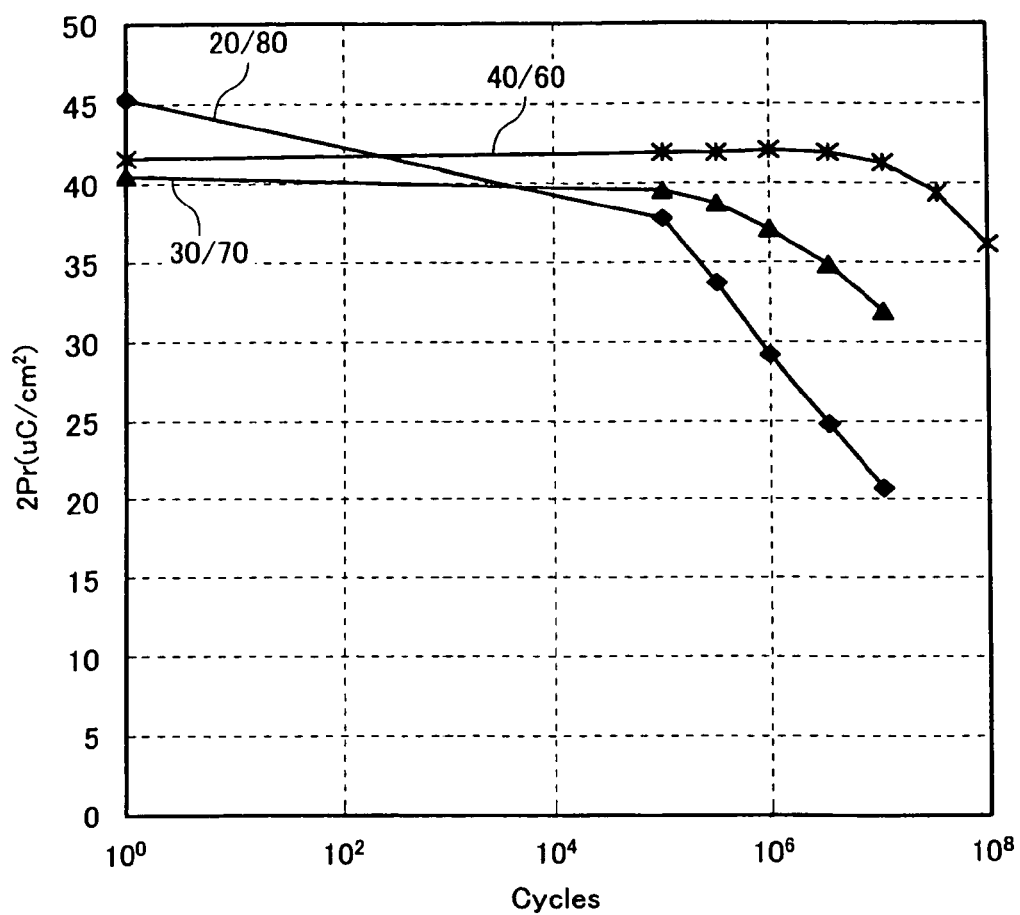
FIG. 15 shows the fatigue characteristic of a ferroelectric capacitor using a conventional PZTN film.
Figure 16:
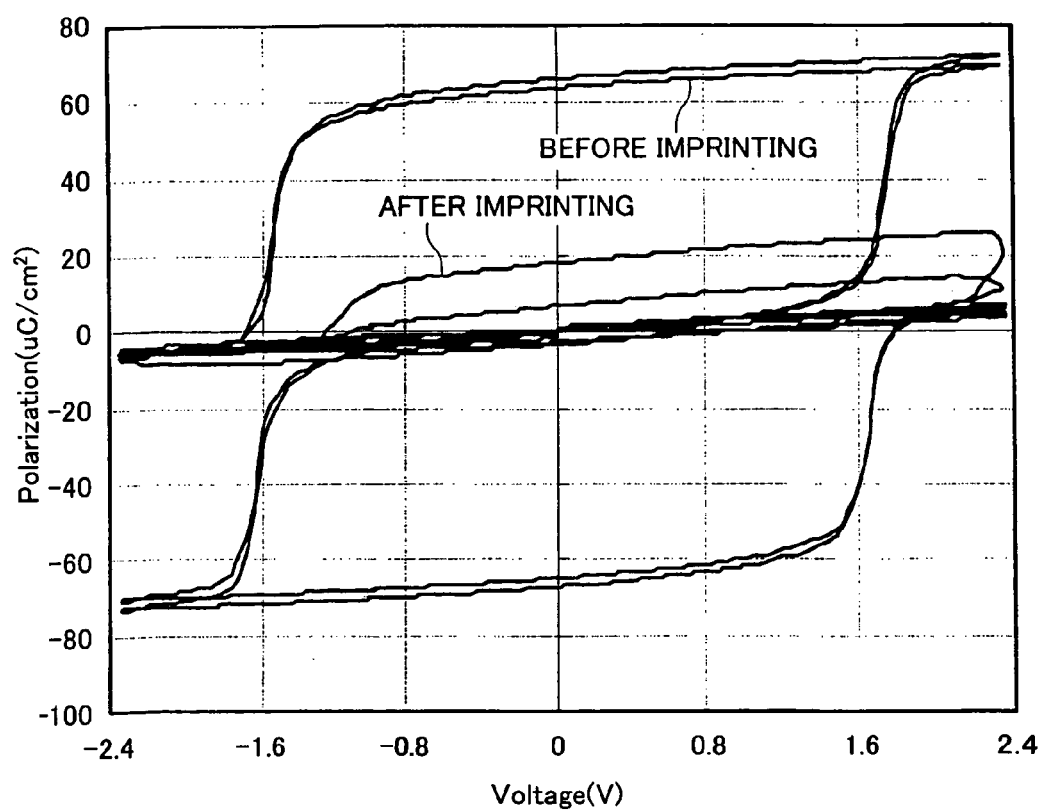
FIG. 16 shows the static imprint characteristic of a ferroelectric capacitor in accordance with the first embodiment, which uses a conventional PZT film.

Evaluation with a conventional PZT ferroelectric film was done for comparison, the conventional PZT samples had Pb:Zr:Ti ratios of 1:0.2:0.8, 1:0.3:0.7, and 1:0.6:0.4. The leakage characteristics thereof are such that the leakage characteristics deteriorate with increasing T1 content, as shown in FIG. 14, so that it is clear that when Ti is 80% and 2 V was applied, the characteristic was $10^{-5}$ A/cm², making it unsuitable for memory applications. Similarly, the fatigue characteristic deteriorated with increasing Ti content, as shown in FIG. 15. After imprinting, it was clear that most of the data could not be read, as shown in FIG. 16.

As is clear from the above description, the PZTN ferroelectric film in accordance with this embodiment has simply solved the problem of the increase in leakage current together with the deterioration in the imprint characteristic, which are thought to be intrinsic to PZT in the conventional art, making it possible to use tetragonal PZT in memory applications without concern of memory type or configuration. For the same reason, this material can also be used in piezoelectric component applications in which tetragonal PZT could not be used before.

SECOND EMBODIMENT

This embodiment is a comparison of the ferroelectric characteristics obtained when the amount of Nb added to the PZTN ferroelectric film was varied to 0, 5, 10, 20, 30, 40 mol %. 5 mol % of $PbSiO_3$ was added to all the testpieces. In addition, methyl succinate was added to the sol-gel solutions for forming the ferroelectric films, includes of raw materials for film formation, to adjust the pH to 6. The entire film formation flow shown in FIG. 2 was used therefor.

Measured hysteresis characteristics of PZTN ferroelectric films in accordance with this embodiment are shown in FIGS. 17 to 19.

FIG. 17A shows that when the quantity of added Nb is 0, leaky hysteresis is obtained, whereas FIG. 17B shows that when the quantity of added Nb is 5 mol %, a good hysteresis characteristic with a high level of insulation is obtained.

FIG. 18A shows that substantially no change is seen in the ferroelectric characteristic until the quantity of added Nb reaches 10 mol %. Even when the quantity of added Nb is 0, it is leaky by no change is seen in the ferroelectric characteristic. FIG. 18B shown that when the quantity of added Nb is 20 mol %, a hysteresis characteristic with an extremely good squareness is obtained.

Figure 19B:
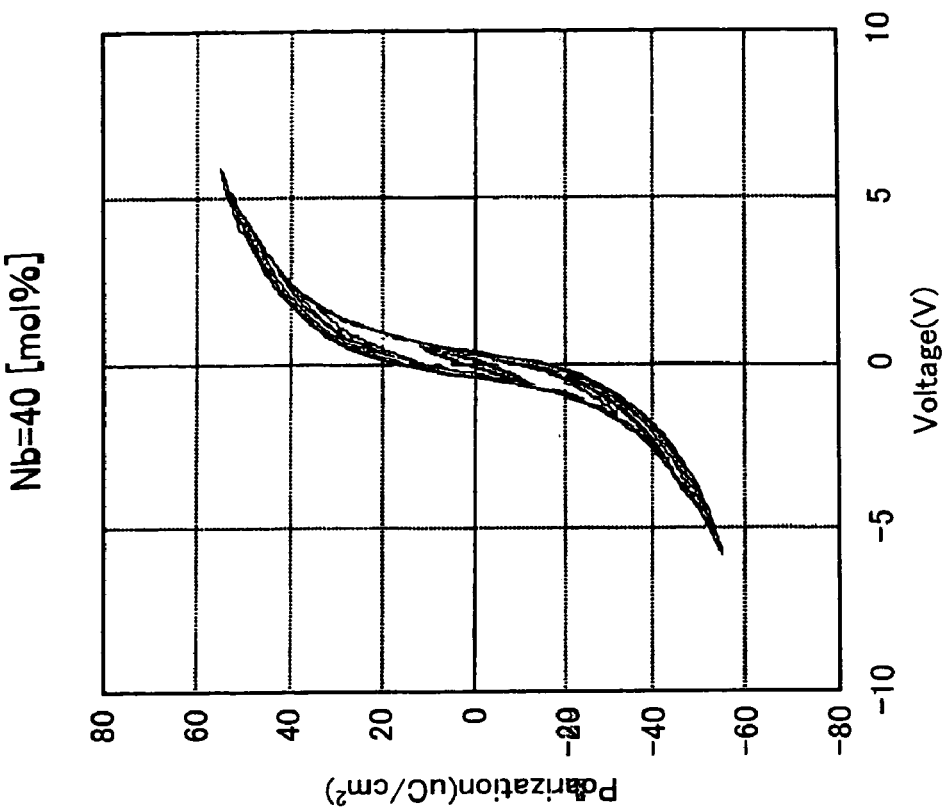
FIGS. 19A and 19B show the hysteresis characteristics of PZTN films in accordance with a second embodiment.
Figure 19A:
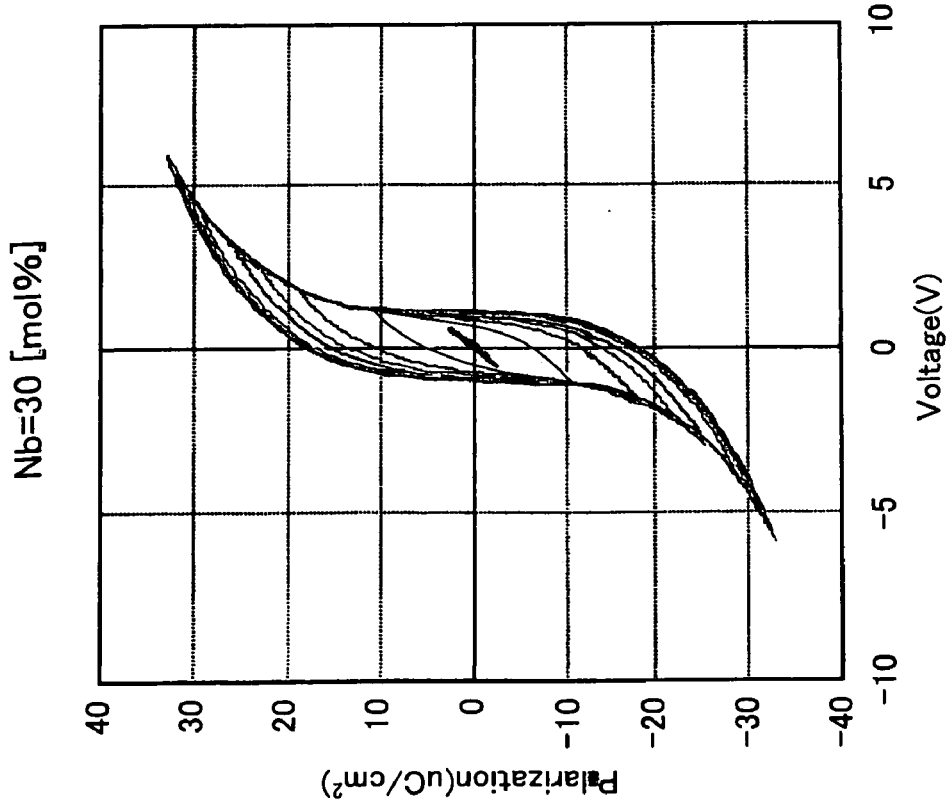

However, it has been confirmed that if the quantity of Nb added exceeds 20 mol %, the hysteresis characteristic changes greatly and tends to deteriorate, as shown in FIGS. 19A and 19B.

Figure 20:
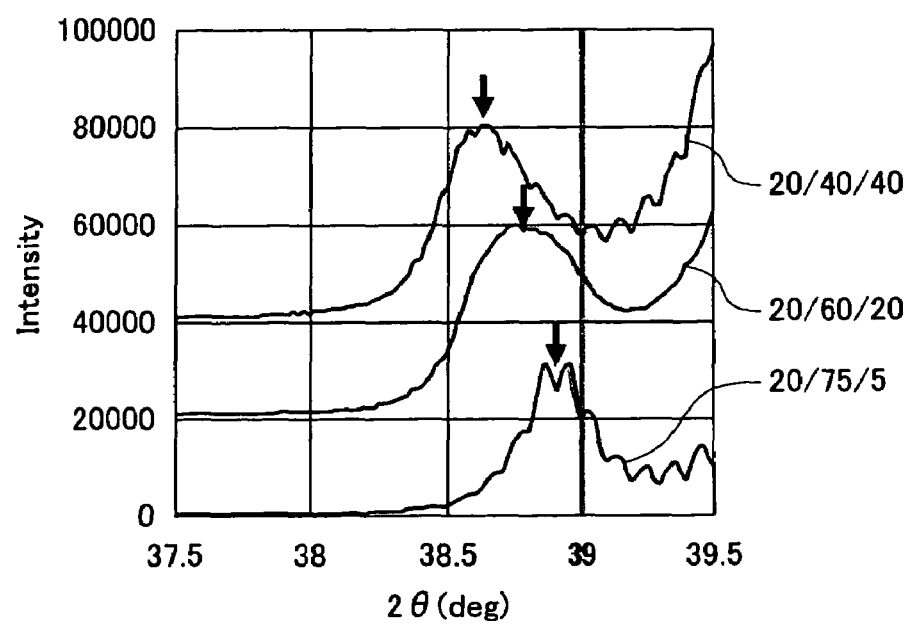
FIG. 20 shows X-ray diffraction patterns of PZTN films in accordance with the second embodiment.

Comparisons of X-ray diffraction patterns are shown in FIG. 20. When the quantity of added Nb is 5 mol % (Zr/Ti/Nb=20/75/5), the (111) peak position does not change from that of a PZT film of the conventional art in which no Nb is added, but the (111) peak does shift towards the low-angle side in accordance with the increases in the quantity of added Nb to 20 mol % (Zr/Ti/Nb=20/60/20) and 40 mol % (Zr/Ti/Nb=20/40/40). In other words, it is clear that the actual crystal is trigonal, regardless of whether there are Ti-rich tetragonal regions in the PZT composition. It is clear that the ferroelectric characteristics change as the crystal composition changes.

In addition, when the quantity of added Nb reaches 45 mol %, a sufficient hysteresis loop could not be obtained and it was not possible to confirm the ferroelectric characteristics (not shown in the figures).

Figure 21:
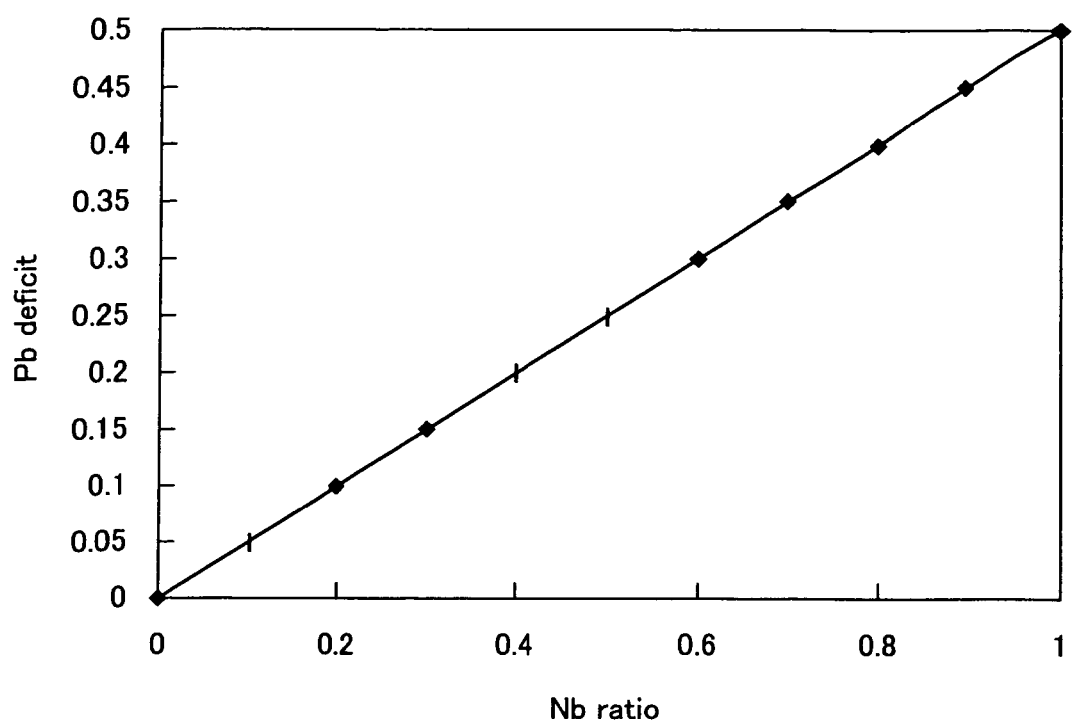
FIG. 21 shows the relationship between Pb insufficiency and Nb compositional ratio in a PZTN crystal in accordance with the second embodiment.
Figure 22:
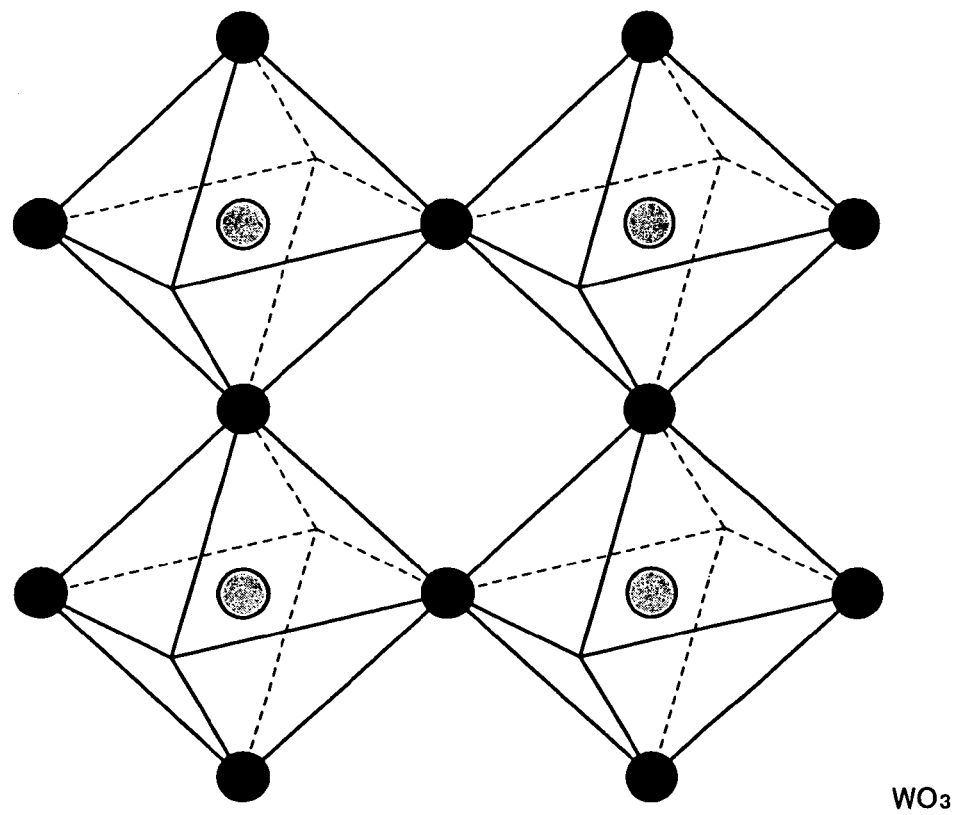
FIG. 22 is illustrative of the $WO_3$ crystal structure that is a Perovskite crystal.

It has already been stated that the PZTN of the present invention has an extremely high level of insulation, but FIG. 21 shows this from the viewpoint of obtaining conditions that ensure that the PZTN is a dielectric.

In other words, the PZTN of the present invention has an extremely high level of insulation and this effect can be achieved by ensuring that Nb is added to Ti sites in compositional ratio equivalent to twice an insufficiency of Pb.

With PZTN, therefore, the addition of Nb enables active control of Bb insufficiency, and also control over the crystal configuration.

This shows that the PZTN of this embodiment would be extremely useful when applied to piezoelectric element. In general, when PZT is applied to piezoelectric elements, a trigonal crystal region with a Zr-rich composition is used. In this case, Zr-rich PZT is called soft PZT. This literally means that the crystal is soft. Soft PZT is used in a nozzle that ejects ink in an inkjet printer, but since it is excessively soft, ink that is too viscous would impart stress thereto, making it impossible to push out.

Ti-rich tetragonal PZT, on the other hand, is called hard PZT, which means it is hard and brittle. While the PZTN film of the present invention is hard, the crystals can be changed into trigonal crystals by artificial means. Since it is also possible to change the crystal form arbitrarily by the quantity of added Nb and since a Ti-rich PZT-family ferroelectric film has a small relative permittivity, it is possible to drive such a component at a low voltage.

This makes it possible to use hard PZT in applications in which it could not be used previously, such as in the ink ejection nozzles of an inkjet printer. In addition, since Nb makes the PZT softer, it is possible to provide a PZT that is suitably hard, but not brittle.

Finally, it is also possible to reduce the crystallization temperature of this embodiment by adding not just Nb, but a silicate simultaneously with the addition of the Nb.

THIRD EMBODIMENT

This embodiment investigates the validity of using a PZTN film from the viewpoint of lattice regularity, when the PZTN film has been formed on a metal film formed of a platinum-group metal such as Pt or Ir as an electrode material for a ferroelectric capacitor that forms a memory cell portion of ferroelectric memory or a piezoelectric actuator that configures an ink ejection nozzle portion of an inkjet printer, by way of example. Platinum-group metals act as underlayer films that determine the crystal orientation of ferroelectric films, and are also useful as electrode materials. However, since the lattice regularities of the two materials are not sufficient, a problem arises concerning the fatigue characteristics of ferroelectric films when applied to elements.

In this case, the present inventors have developed a technique designed to ameliorate lattice mismatches between a PZT-family ferroelectric film and a platinum-group metal thin film, by incorporating Nb into the constituent elements of the PZT-family ferroelectric film. The process of manufacturing this PZT-family ferroelectric film is shown in FIGS. 23A to 23C.

Figure 23A:
FIGS. 23A to 23C are schematic sections illustrating the process of manufacturing a PZTN film in accordance with a third embodiment.

First of all, a given substrate 11 was prepared, as shown in FIG. 23A. A TiOx layer formed on an SOI substrate was used as the substrate 11. Note that a preferred material could be selected from known materials as this substrate 11.

Figure 23B:
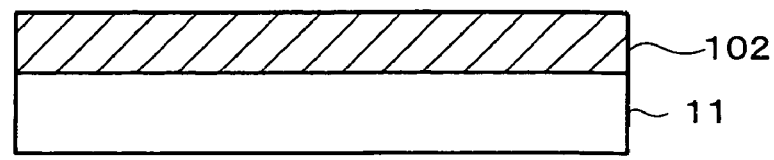
Figure 23C:
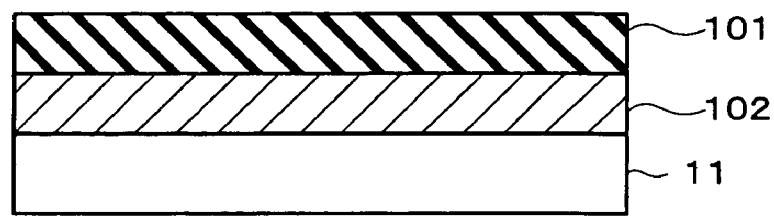

Next, as shown in FIG. 23B, a metal film (first electrode) 102 is formed by sputtering Pt, by way of example, onto the substrate 11, then a PZTN film is formed as the ferroelectric film 101 on the metal film 102, as shown in FIG. 23C. sol-gel solutions can be used as the materials for forming the PZTN film. More specifically, a mixture of a sol-gel solution for $PbZrO_3$, a sol-gel solution for $PbTiO_3$, and a sol-gel solution for $PbNbO_3$ is used, with a sol-gel solution for $PbNbO_3$ added thereto. Note that since a constituent element of the PZTN film is Nb, the crystallization temperature thereof is high. For that reason, it is preferable to further add the sol-gel solution for $PbSiO_3$, to reduce the crystallization temperature. With this embodiment, the abovementioned sol-gel mixed solution is painted onto the Pt metal film 102 by a spin-coating method, then is subjected to predetermined thermal processing to crystallize it. The film formation flow was similar to shown in FIG. 2.

Figures 24A, 24B:
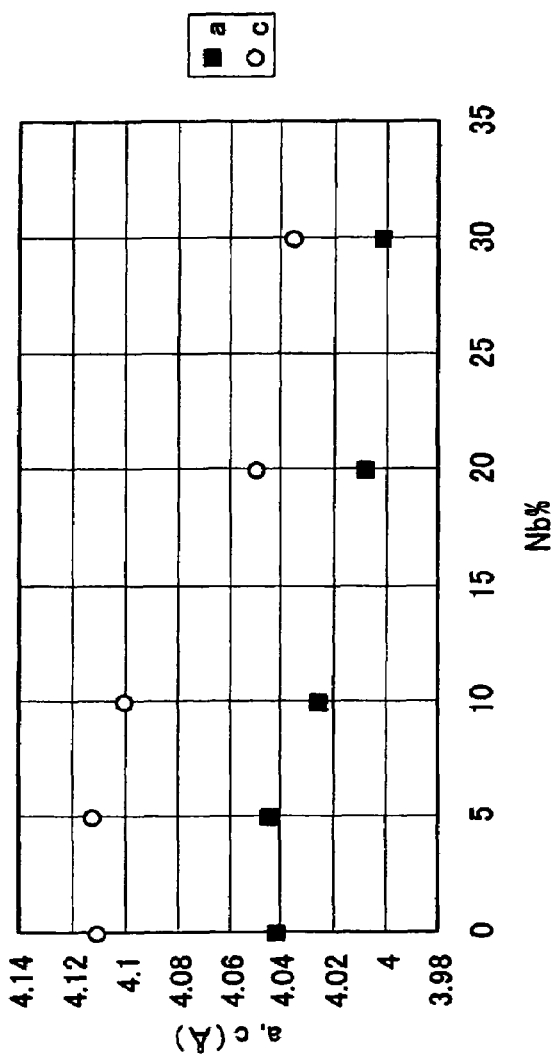
FIGS. 24A and 24B are illustrative of changes in lattice constant in a PZTN film in accordance with the third embodiment.

When an X-ray diffraction method was used to measure the crystal lattice constants of PZTN films obtained by this embodiment of the invention, wherein the quantity of added Nb ranged from 0 mol % to 30 mol %, the results were as shown in FIGS. 24A and 24B. It is clear from FIGS. 24A and 24B that the lattice constant along the a axis (or the b axis) became closer to the lattice constant along the c axis as the quantity of added Nb increased. In addition, V(abc) in FIG. 24A is an index of volumetric changes in lattice constant (a,b,c). The ratio $V/V_0$ in FIG. 24A is the ratio of the volume V(abc) of the PZTN crystal with respect to an index $V_0$ which is a volumetric change of the lattice constant of a PZT crystal to which no Nb was added. It can be confirmed from the V(abc) or $V/V_0$ column that the crystal lattice of the PZTN crystal becomes smaller as the quantity of added Nb increases.

Figure 25:
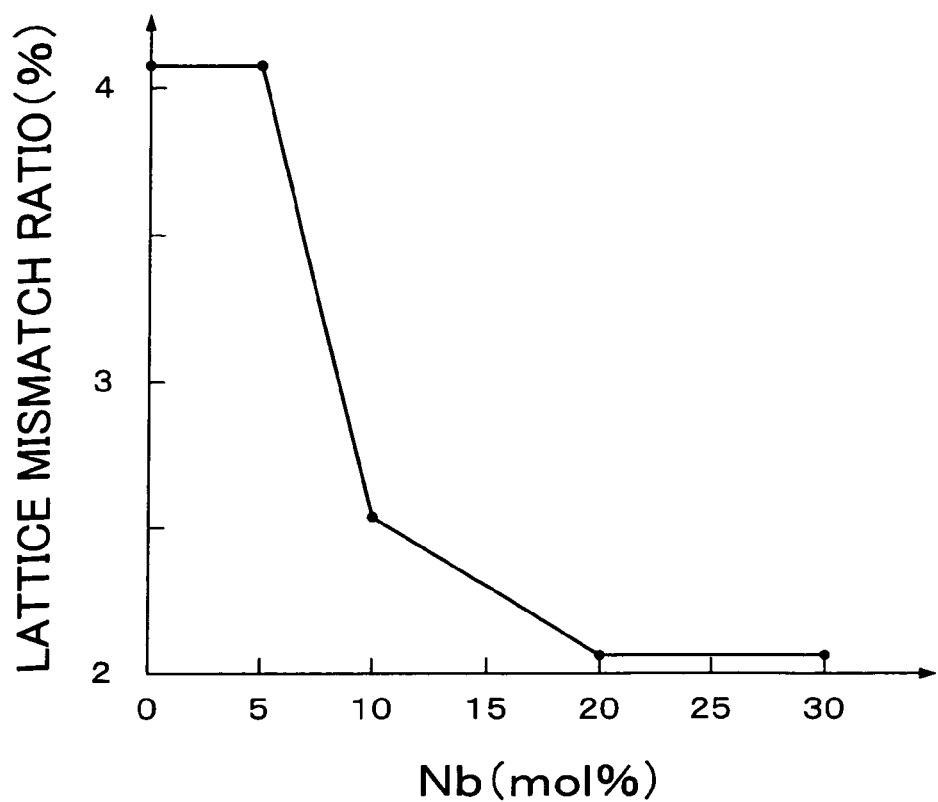
FIG. 25 is illustrative of changes in lattice mismatch ratio between PZTN films and Pt metal films in accordance with the third embodiment.

The lattice mismatch ratios with respect to a lattice constant (a,b,c=3.96) for Pt metal film were calculated from the lattice constants of PZTN films formed with the addition of Nb in this manner, and the quantity of added Nb (mol %) was plotted along the horizontal axis in FIG. 25. It was confirmed from FIG. 25 that the effects of including Nb into a PZT-family ferroelectric film are not limited to the effect of improving the ferroelectric characteristic of each of the above described embodiments, but they also include the effect of approximating the lattice constant thereof to the lattice constant of crystals of platinum-group metals such as Pt. It was confirmed that this effect is particularly obvious in the region in which the quantity of added Nb is greater than or equal to 5 mol %.

It has therefore been confirmed that use of the method of the present invention reduces lattice mismatches between the metal film that is the electrode material and the ferroelectric film, such that the lattice mismatch ratio is improved to the order of 2% at a quantity of added Nb of 30 mol %, by way of example. This is considered to be because strong bonds having both ionic bonding between Nb atoms that have substituted for Ti atoms at the B sites in the PZTN crystal structure and O atoms and covalence, these bonds act in directions that compress the crystal lattice, causing changes in the direction in which the lattice constant decreases.

In addition, platinum-group metals such as Pt are chemically stable substances that are ideal as the electrode material for ferroelectric memory or a piezoelectric actuator, so that the method of this embodiment makes it possible to alleviate lattice mismatches more than in the conventional art, even when a PZTN film is formed directly on this Pt metal film, and also improve the interface characteristic thereof. The method of this embodiment therefore makes it possible to reduce fatigue deterioration of PZT-family ferroelectric films, making it suitable for application to elements such as ferroelectric memory or piezoelectric actuators.

REFERENCE EXAMPLE

For this example, $PbZr_{0.4}Ti_{0.6}O_3$ ferroelectric films were manufactured.

A solution including approximately 20% excess Pb is used for the conventional method, but this is to restrain volatile Pb and reduce the crystallization temperature. However, since it is unclear what happens to excess Pb in the completed thin films, excessive quantities of Pb should be suppressed to a minimum.

Figure 26:
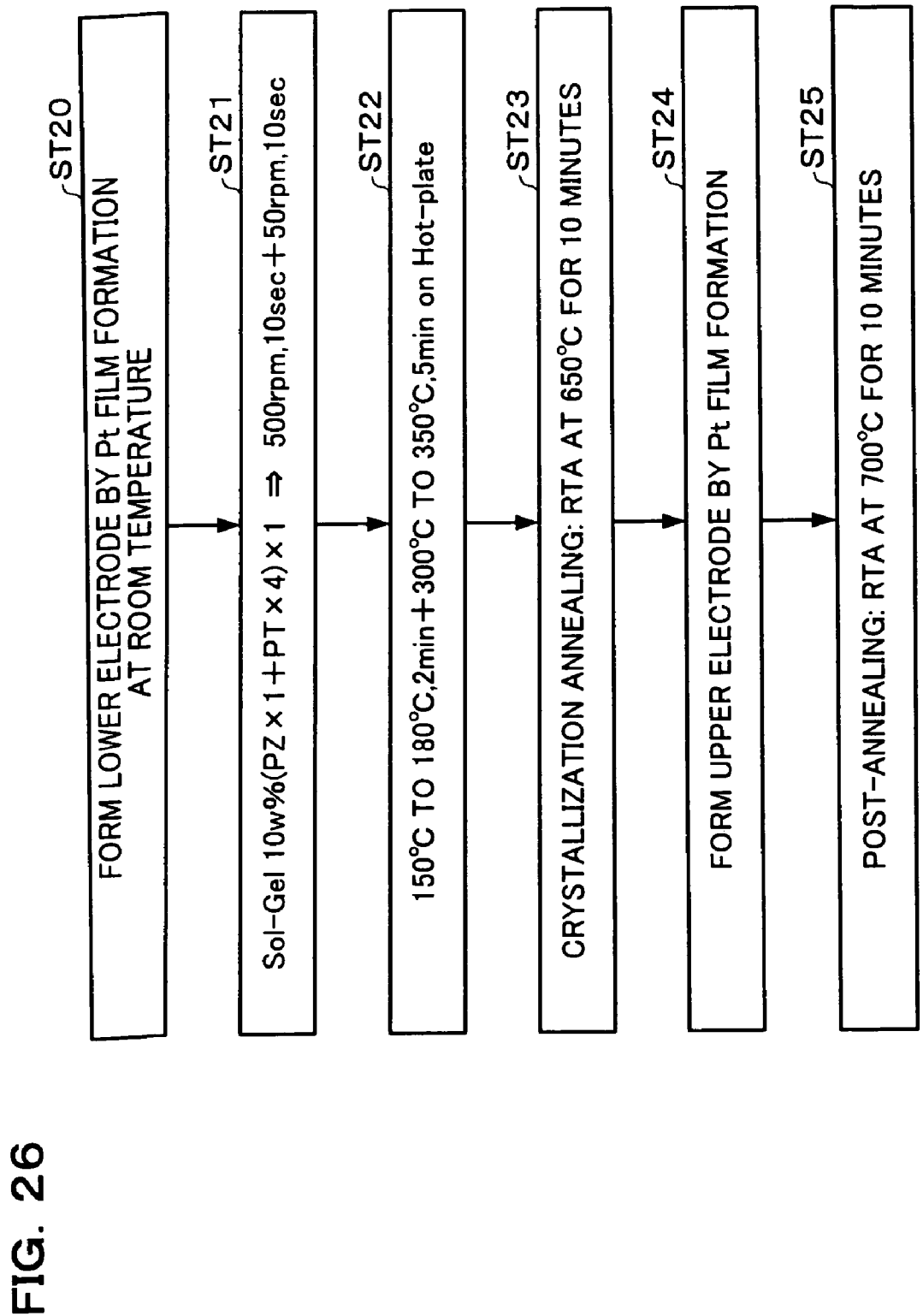
FIG. 26 is a flowchart of the formation of a conventional PZT film by a spin-coating method, as a reference example.

In this case, a 10 wt % density of a sol-gel solution for $PbZr_{0.4}Ti_{0.6}O_3$ (solvent: n-butanol) having 0, 5, 10, 15, or 20% excess Pb was used, to which was added 1 mol % of 10 wt % density of a sol-gel solution for forming $PbSiO_3$ (solvent: n-butanol), was used to form 200-nm $PbZr_{0.4}Ti_{0.6}O_3$ ferroelectric films by the processes of steps ST20 to ST25 of FIG. 26. The surface morphologies in this case are shown in FIGS. 27A to 27C and XRD patterns thereof are shown in FIGS. 28A to 28C.

Although an excess of approximately 20% Pb is necessary in the conventional art, it is clear that crystallization proceeds sufficiently with a 5% excess of Pb. This shows that the addition of just 1 mol % of the $PbSiO_3$ catalyst lowers the crystallization temperature of PZT, so that most of the excess Pb is not needed. Thereonafter the solutions for forming PZT, $PbTiO_3$, and $PbZrTiO_3$ all had 5% excess Pb.

Figure 29A:
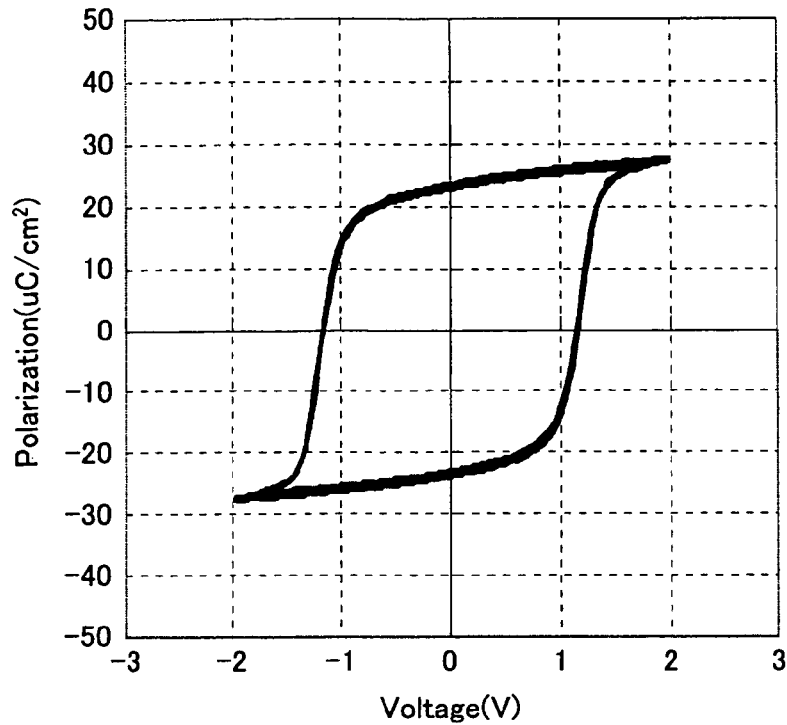
FIGS. 29A and 29B show the hysteresis loops of tetragonal PZT films, as reference examples.
Figure 29B:
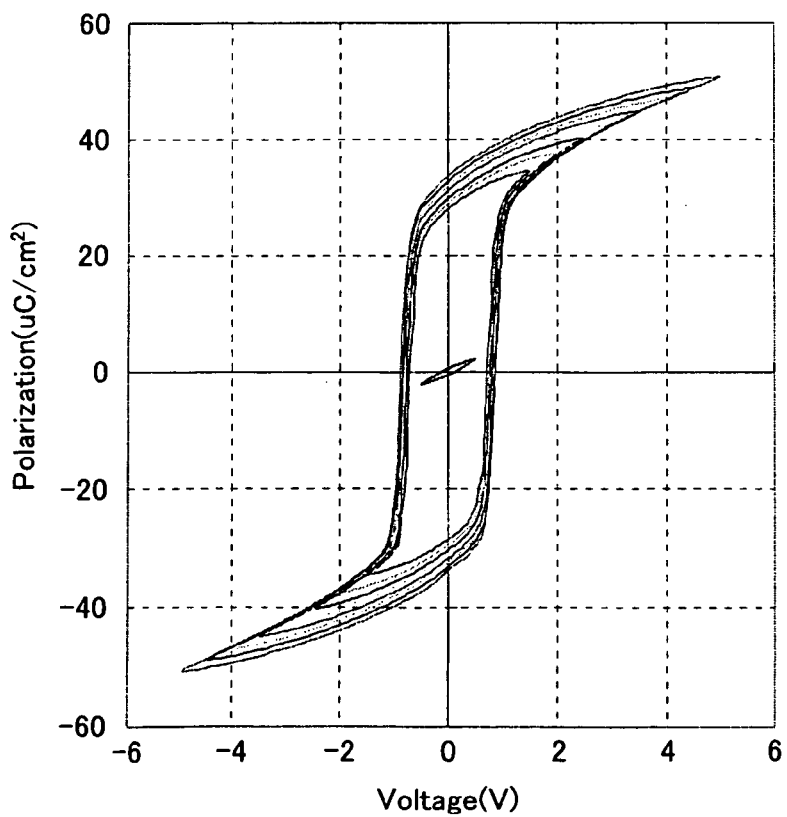

Next, a mixed solution of 10 wt % density of a sol-gel solution for forming $PbZrO_3$ (solvent: n-butanol) and 10 wt % density of a sol-gel solution for forming $PbTiO_3$ (solvent: n-butanol) in the ratio 4:6, to which was added 1 mol % of 10 wt % density of a sol-gel solution for forming $PbSiO_3$ (solvent: n-butanol), was used in accordance with the flow shown in FIG. 2 to manufacture 200-nm $PbZr_{0.4}Ti_{0.6}O_3$ ferroelectric films. The hysteresis characteristics in this case were favorable, as shown in FIGS. 29A and 29B. However, it was clear they were simultaneously leaky.

Figure 30:
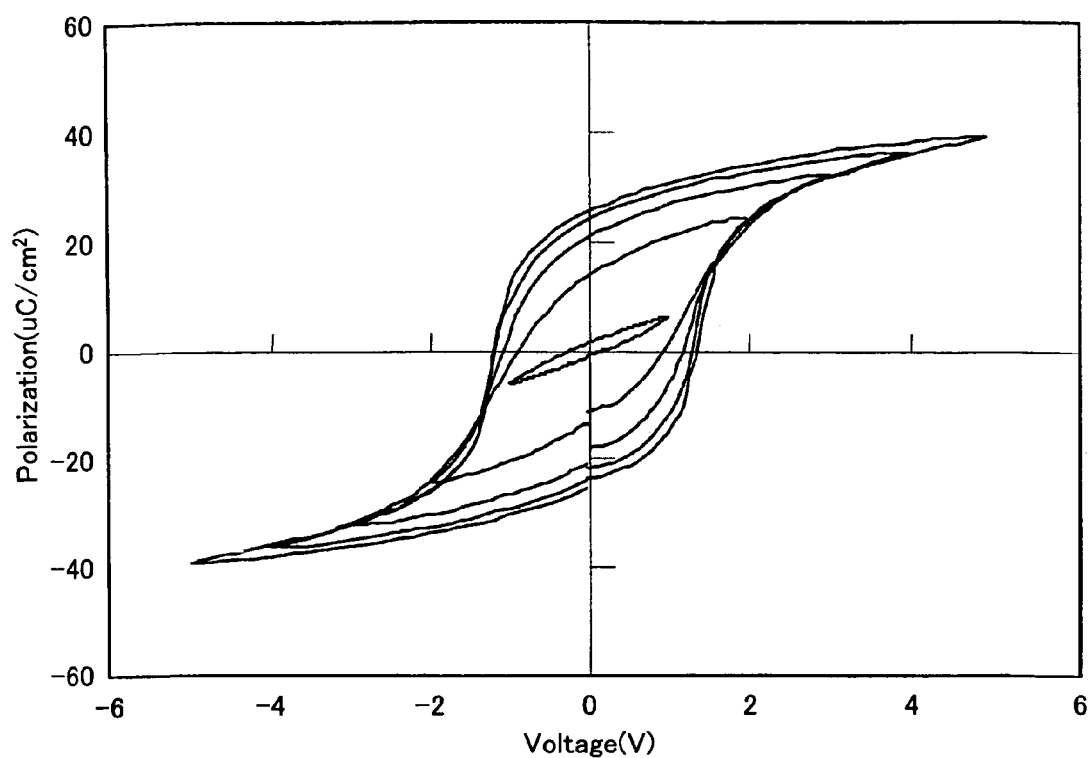
FIG. 30 shows the hysteresis loop of a conventional tetragonal PZT film, as a reference example.

For comparison, a 200-nm $PbZr_{0.4}Ti_{0.6}O_3$ ferroelectric thin film was manufactured by a conventional method and the previously-described flow of FIG. 26, using a mixed solution of 10 wt % density of a sol-gel solution for forming $PbSiO_3$ (solvent: n-butanol) in 10 wt % density of a sol-gel solution for $PbZr_{0.4}Ti_{0.6}O_3$ (solvent: n-butanol). The hysteresis characteristic in this case was not particularly impressive, as shown in FIG. 30.

Figure 31B:
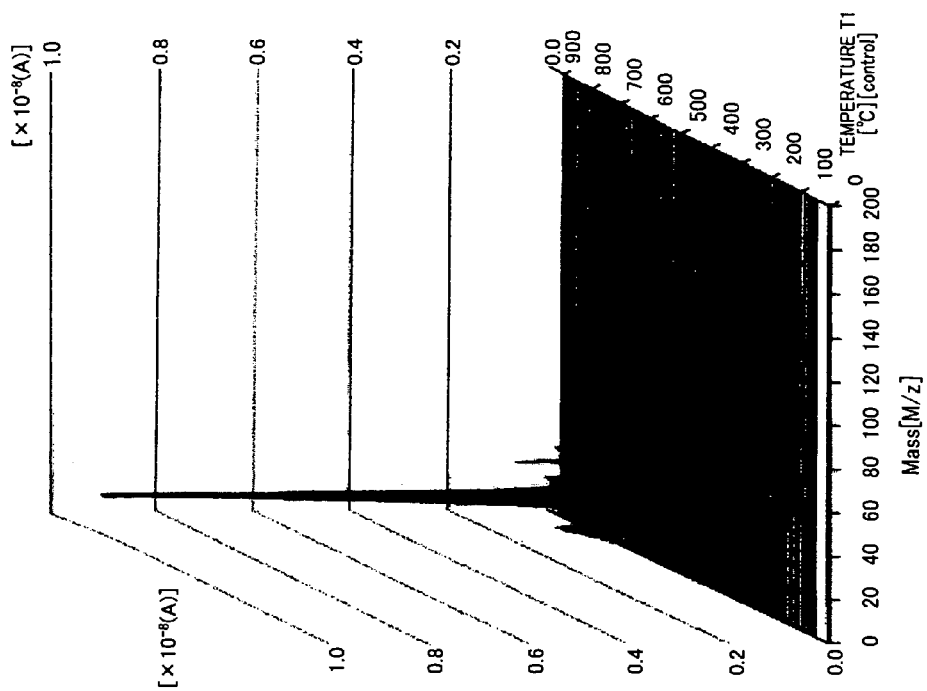
FIGS. 31A and 31B show the results of degassing analysis on tetragonal PZT films as reference examples.
Figure 31A:
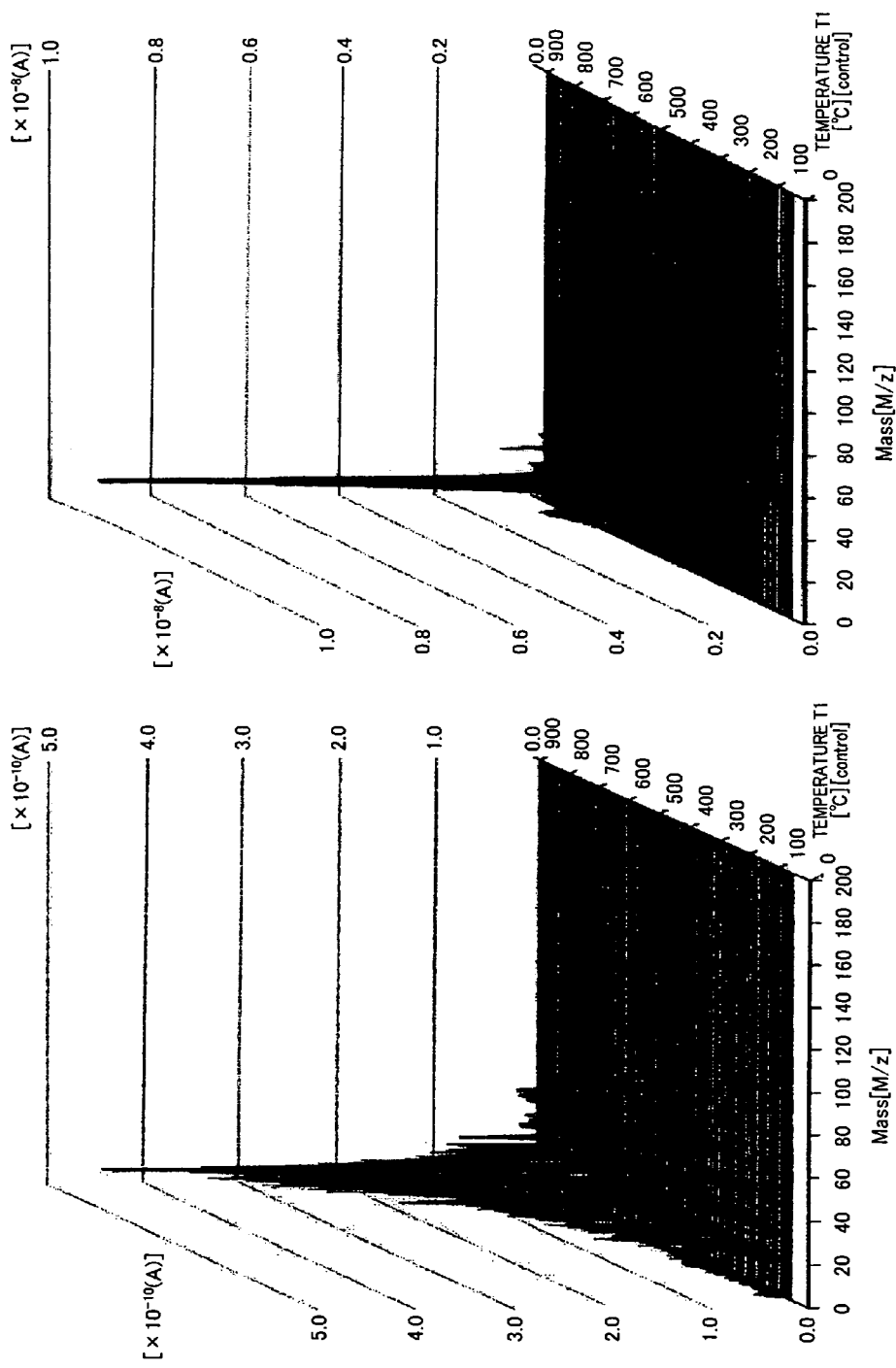

When degassing analysis was performed on each of these ferroelectric films, the results were as shown in FIGS. 31A and 31B.

As shown in FIG. 31A, it was confirmed that the conventional ferroelectric film manufactured by PZT sol-gel solutions always degases with respect to H and C, as the temperature rises from room temperature to 1000° C.

With the ferroelectric film of the present invention formed by using a solution that is a 4:6 mixture of 10 wt % density of a sol-gel solution for forming $PbZrO_3$ (solvent: n-butanol) and 10 wt % density of a sol-gel solution for forming $PbTiO_3$ (solvent: n-butanol), however, analysis showed that degassing was mostly not seen.

This is thought to be because the use of a solution that is a 4:6 mixture of 10 wt % density of a sol-gel solution for forming $PbZrO_3$ (solvent: n-butanol) and 10 wt % density of a sol-gel solution for forming $PbTiO_3$ (solvent: n-butanol) ensures that $PbTiO_3$ crystallizes on the Pt from the 10 wt % density of the sol-gel solution for forming $PbTiO_3$ (solvent: n-butanol) within the initial mixed solution and this acts as initial crystallization seeds, and also that lattice mismatches between the Pt and the PZT disappear, facilitating the crystallization of the PZT. The use of a mixed solution is also considered to form a suitable interface between the $PbTiO_3$ and the PZT, which is linked to favorable squareness of hysteresis loop.

2. Method of Manufacturing Ferroelectric Capacitor

Figure 32A:
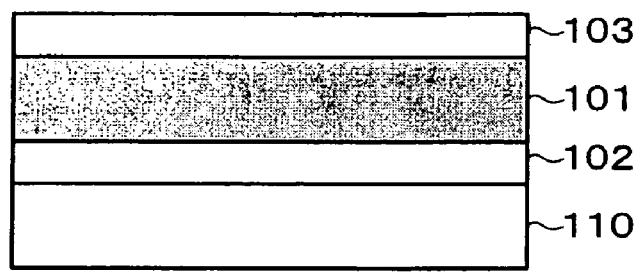
FIGS. 32A to 32C show a process of manufacturing a ferroelectric capacitor.
Figure 32B:
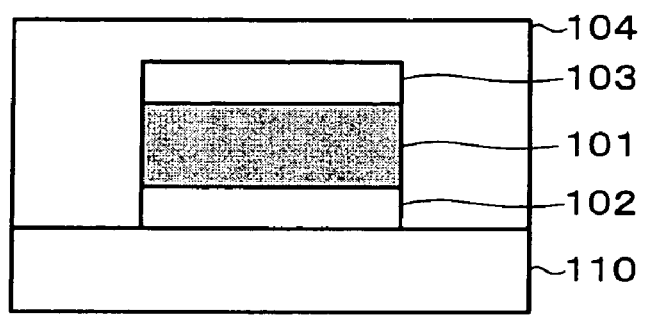
Figure 32C:
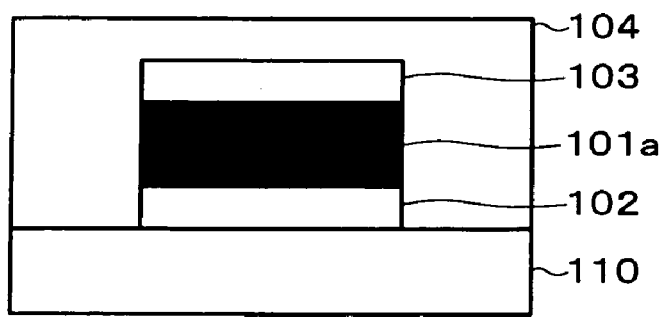

Sections showing an example of a method of manufacturing a ferroelectric capacitor in accordance with this embodiment of the invention are shown schematically in FIGS. 32A to 32C.

1) First of all, as shown in FIG. 32A, a lower electrode 102, the ferroelectric film 101, and an upper electrode 103 are formed in sequence as a stack on a given substrate 110.

The substrate 110 is not particularly limited and thus any preferred substance can be used therefore, depending on the application of the ferroelectric capacitor, such as a semiconductor substrate or a resin substrate, by way of example.

Either a precious metal such as Pt, Ir, or Ru alone or a compound material having such a precious metal as a main component can be employed as the lower electrode 102 and the upper electrode 103. A known film formation method could be used for forming the lower electrode 102 and the upper electrode 103, such as sputtering or vapor deposition. Since the diffusion of ferroelectric elements into the lower electrode 102 or the upper electrode 103 would cause variations in the composition of the interface between that electrode and the ferroelectric film 101, which would adversely affect the squareness of the hysteresis loop, a compact structure that does not permit the diffusion of ferroelectric elements into the lower electrode 102 or the upper electrode 103 is desired. In this case, a method of forming the films by sputtering by a gas having a large mass, or a method of dispersing an oxide of a substance such as Y or L into a precious metal electrode could be employed in order to increase the compactness of the lower electrode 102 and the upper electrode 103.

The ferroelectric film 101 includes Pb, Zr, Ti, and Nb as constituent elements, and thus is called a PZTN complex oxide. The ferroelectric film 101 can be formed by using a spin-coating method or the like to paint sol-gel solutions including Pb, Zr, Ti, and Nb onto the lower electrode 102. Mixtures of a first sol-gel solution in which a condensation polymer for forming $PbZrO_3$ Perovskite crystals by Pb and Zr is dissolved in a non-aqueous state in a solvent such as n-butanol; a second solution in which a condensation polymer for forming $PbTiO_3$ Perovskite crystals by Pb and Ti, from among constituent metal elements for the PZTN ferroelectric phase, is dissolved in a non-aqueous state in a solvent such as n-butanol; and a third sol-gel solution in which a condensation polymer for forming $PbTiO_3$ Perovskite crystals by Pb and Ti, from among constituent metal elements for the PZTN ferroelectric phase, is dissolved in a non-aqueous state in a solvent such as n-butanol could be used as these sol-gel solutions. In addition, during the formation of the ferroelectric film 101, a sol-gel solution including a silicate or germanate for reducing the crystallization temperature of the PZTN complex oxide could be added. More specifically, at least 1 mol % but less than 5 mol % of a fourth sol-gel solution in which a condensation polymer for forming $PbSiO_3$ crystals is dissolved in a non-aqueous state in a solvent such as n-butanol could be further added to the above-described mixture of sol-gel solutions. The mixing in of this fourth sol-gel solution makes it possible for the crystallization to occur within a temperature range that enables the creation of elements at a crystallization temperature for the PZTN complex oxide of 700° C., although the inclusion of Nb as a constituent element would normally increase the crystallization temperature.

It is preferable that the painted film for the ferroelectric film 101 is subjected to preliminary thermal processing at a temperature (such as not more than 400° C.) that does not cause crystallization of the PZTN complex oxide in an oxidizing atmosphere, to put the PZTN complex oxide into an amorphous state. This enables the advance of the previously described process while preventing the diffusion of constituent elements in a state in which the ferroelectric film 101 is in an amorphous state, with no grain boundaries. The performing of this preliminary thermal processing in an oxidizing atmosphere has the effect of introducing into the ferroelectric film 101 the oxygen component that is necessary for the crystallization of the PZTN complex oxide after the formation of a protective film, which will be described later.

2) Next, as shown in FIG. 32B, the lower electrode 102, the ferroelectric film 101, and the upper electrode 103 are etched to a desired shape, and a protective film 104 of silicon dioxide ($SiO_2$) is formed to cover them. The protective film 164 in this case can be formed by a CVD method, using trimethylsilane (TMS). With trimethylsilane (TMS), there is a smaller quantity of hydrogen generated during the CVD process, in comparison with the tetraethyl orthosilicate (TEOS) that is generally used for forming a silicon dioxide film. If trimethylsilane (TMS) is used for that reason, it is possible to reduce processing damage to the ferroelectric film 101 due to the reductive reaction. Since the process of using trimethylsilane (TMS) to form the protective film 104 can be done at a lower temperature (from room temperature to 350° C.) than the process using TEOS (a film-formation temperature of at least 400° C.), it is possible to maintain the amorphous state achieved by the process of (1), preventing crystallization of the PZTN complex oxide by the heat generated by this process of forming the protective film 104.

3) Next, as shown in FIG. 32C, thermal processing is performed to crystallize the PZTN complex oxide that configures the ferroelectric film 101, making it possible to obtain a ferroelectric capacitor having a PZTN ferroelectric crystal film 101a. This thermal processing could be done, not in an oxygen atmosphere, but in an atmosphere of a non-oxidizing gas such as Ar or $N_2$ or in air, to enable the crystallization of the PZTN complex oxide.

Figure 33A:
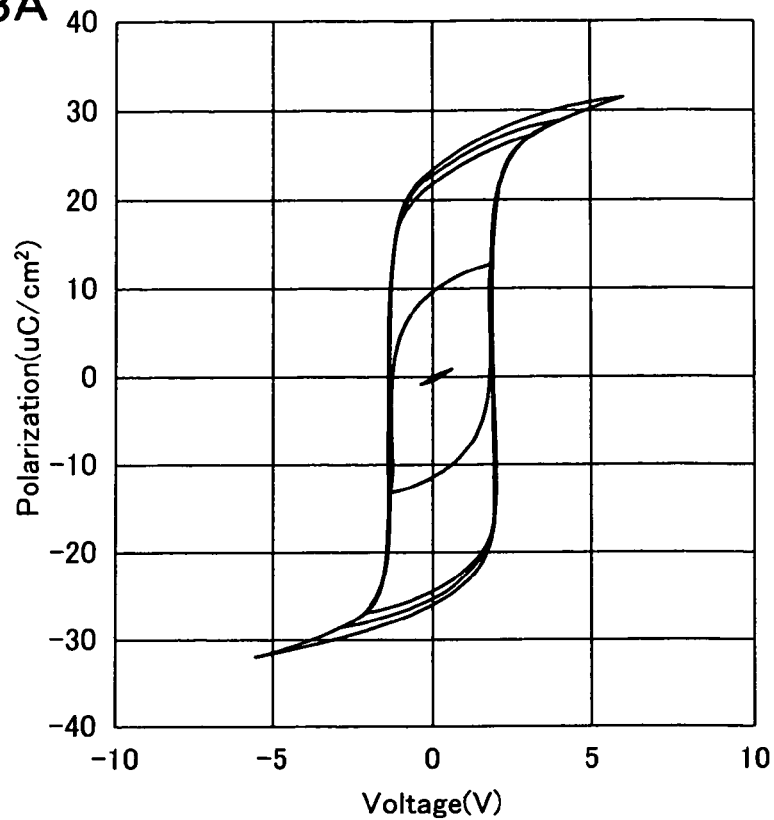
FIGS. 33A and 33B show the hysteresis characteristics of ferroelectric capacitors.
Figure 33B:
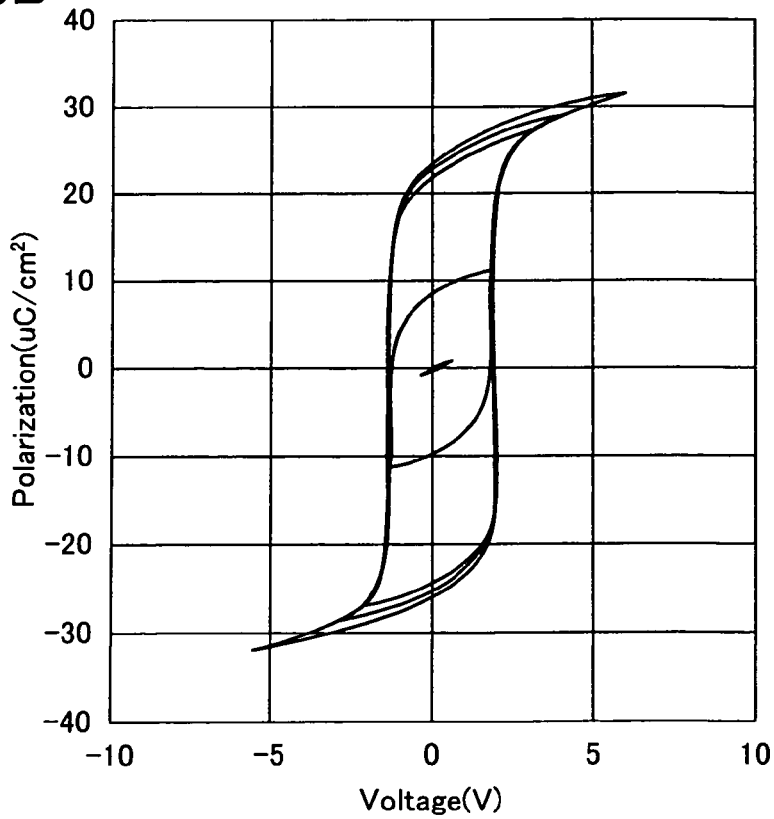

FIGS. 33A and 33B show results obtained by measuring the hysteresis characteristics of capacitors in which the manufacture method of this embodiment was employed to form a $SiO_2$ protective film by using TMS over a ferroelectric capacitor formed of a Pt lower electrode, a PZTN ferroelectric film, and a Pt upper electrode, when the PZTN ferroelectric film was subjected to thermal processing in an oxygen atmosphere or air after this $SiO_2$ protective film was formed. FIG. 33A shows the results of thermal processing in an oxygen atmosphere and FIG. 33B shows the results of thermal processing in air. FIGS. 33A and 33B show that hysteresis characteristics with good squareness were obtained, regardless of whether the thermal processing was done in an oxygen atmosphere or air, even though a hydrogen-resisting barrier film was not formed. This is because preliminary thermal processing was performed in an oxidizing atmosphere during the formation of the ferroelectric film 101 so that the oxygen necessary for the crystallization had previously entered the film. In other words, the manufacture method of this embodiment makes it possible to crystallize the ferroelectric film without being dependent on the atmosphere for thermal processing. In addition, when the thermal processing for crystallization is performed in a non-oxidizing gas atmosphere, it is possible to prevent oxidation damage due to high-temperature thermal processing on peripheral components (for example, metal wiring) other than the capacitor, when applied to a method of manufacturing a ferroelectric memory that will be described later. Note that since the thermal processing for crystallizing the PZTN complex oxide in this process is not very dependent on the type of gas in the atmosphere, contact holes for forming metal wiring for connecting the upper electrode 103 to the exterior can be formed after the protective film 104 is formed.

Figure 34:
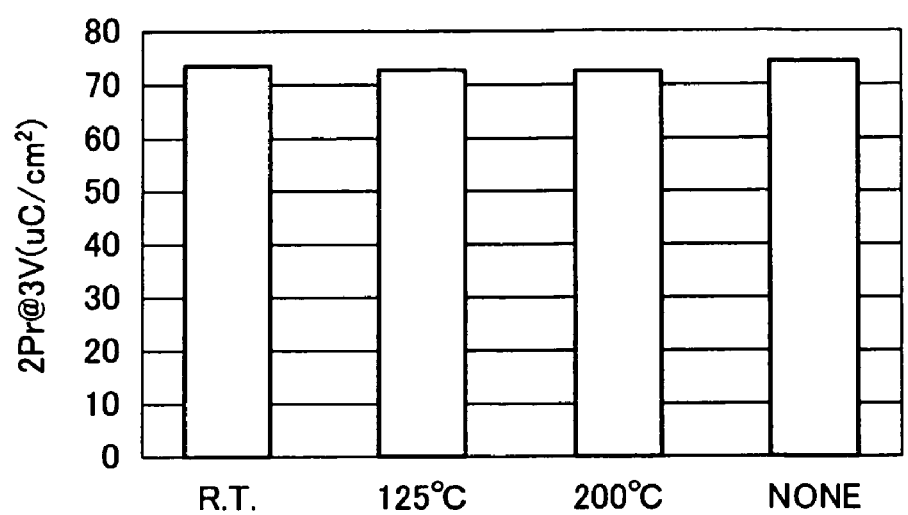
FIG. 34 shows the electrical characteristics of ferroelectric capacitors

FIG. 34 shows the results of measurements obtained by measuring the hysteresis characteristic for examples in which the manufacture method of this embodiment was employed to form a $SiO_2$ protective film by using TMS over a ferroelectric capacitor formed of a Pt lower electrode, a PZTN ferroelectric film, and a Pt upper electrode, and the PZTN ferroelectric film was crystallized after the formation of this $SiO_2$ protective film, where the formation temperature of the $SiO_2$ protective film was room temperature, 125° C., and 200° C.; and the hysteresis characteristic of a reference example in which the PZTN ferroelectric film was crystallized without the $SiO_2$ protective film being formed, and calculating the corresponding change in residual polarization magnitude 2 Pr. From FIG. 34 it can be seen that there was no change in residual polarization magnitude 2 Pr, whether the $SiO_2$ protective film was formed at room temperature, 125° C., or 200° C., which confirms that the formation of the $SiO_2$ protective film does not result in an inferior product. In other words, by performing the thermal processing for crystallizing the PZTN complex oxide even after damage is done by hydrogen during the processing of the ferroelectric film 101 in the formation of the protective film 104, the manufacture method of this embodiment ensures that the PZTN complex oxide is crystallized while any such damage is repaired. This makes it possible to omit the process of forming a barrier film for protecting against reductive reactions of the ferroelectric film 101, which is necessary in the conventional art, enabling an increase in productivity and a reduction in production costs.

3. Ferroelectric Memory

The configuration of a simple matrix type of ferroelectric memory device 300 in accordance with an embodiment of the present invention is shown in FIGS. 35A and 35B. FIG. 35A is a plan view thereof and FIG. 35B is a section taken along a line A-A in FIG. 35A. The ferroelectric memory device 300 has a predetermined array of word lines 301 to 303 and a predetermined array of bit lines 304 to 306 formed on a substrate 308. A ferroelectric film 307 formed of the PZTN described with respect to this embodiment is inserted between the word lines 301 to 303 and the bit lines 304 to 306, and ferroelectric capacitors are formed at the intersection regions between the word lines 301 to 303 and the bit lines 304 to 306.

In the ferroelectric memory device 300 in which memory cells configured of this simple matrix are arrayed, the operations of writing to and reading from the ferroelectric capacitors formed at the intersections between the word lines 301 to 303 and the bit lines 304 to 306 are done by peripheral drive circuits and a read amplifier circuit (called "peripheral circuit" although not shown in the figures). This peripheral circuit could be formed of MOS transistors on another substrate than the memory cell array, or the peripheral circuit could be integrated on the same substrate as the memory cell array.

Figure 36:
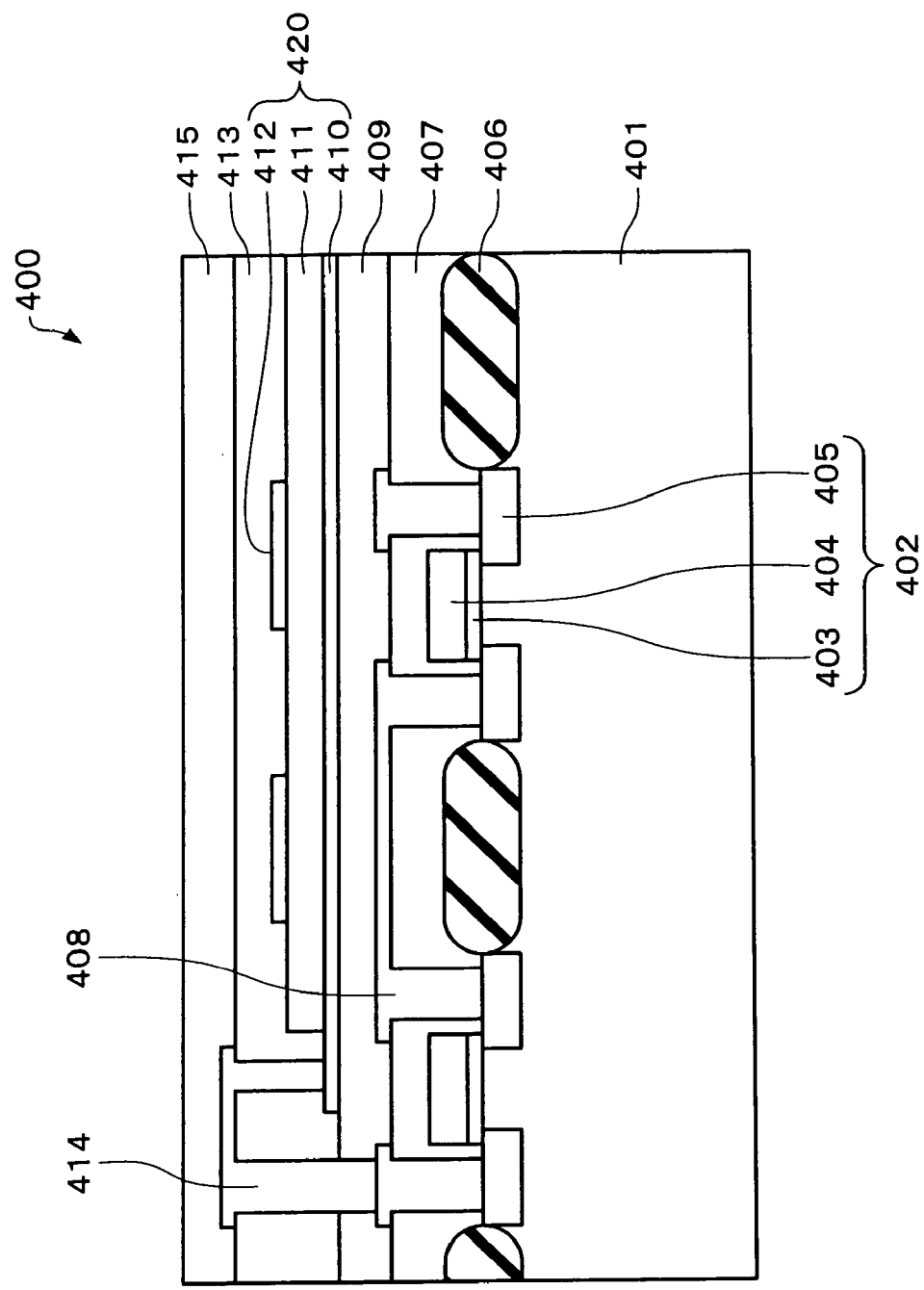
FIG. 36 is a section through an example of a ferroelectric memory device in which a memory cell array and a peripheral circuit are integrated together on the same substrate.

FIG. 36 is a section through an example of the ferroelectric memory device 300 in which the memory cell array is integrated on the same substrate as the peripheral circuit.

In FIG. 36, a MOS transistor 402 is formed on a monocrystalline silicon substrate 401, and this transistor formation region supports a peripheral circuit. The MOS transistor 402 is formed of the monocrystalline silicon substrate 401, a source/drain region 405, a gate isolation film 403, and a gate electrode 404.

The ferroelectric memory device 300 includes an element separation oxide layer 406, a first interlayer dielectric 407, a first wiring layer 408, and a second interlayer dielectric 409.

The ferroelectric memory device 300 has a memory cell array formed of ferroelectric capacitors 420, where each ferroelectric memory cell is formed of a lower electrode (first electrode or second electrode) 410 that becomes a word line or bit line, a ferroelectric film 411 including a ferroelectric phase and an ordinary paraelectric phase, and an upper electrode (second electrode or first electrode) 412 that becomes a bit line or a word line.

This ferroelectric memory device 300 also has a third interlayer dielectric 413 on the ferroelectric capacitor 420, and the memory cell array and the peripheral circuit are connected by a second wiring layer 414. Note that a protective film 415 is formed over the third interlayer dielectric 413 and the second wiring layer 414 of the ferroelectric memory device 300.

The ferroelectric memory device 300 having the configuration described above makes it possible to integrate a memory cell array and a peripheral circuit on the same substrate. Note that the ferroelectric memory device 300 shown in FIG. 36 is configured of a memory cell array on top of the peripheral circuit, but the configuration could equally well be such that the memory cell array is connected to the peripheral circuit in a planar manner, without disposing the memory cell array on the peripheral circuit.

Since the ferroelectric capacitor 420 used in this embodiment is configured of the PZTN described above, the squareness of the hysteresis loop is extremely good and it has a stable disturbance characteristic. In addition, the reduction in the processing temperature for this ferroelectric capacitor 420 reduces damage to peripheral circuits and other components, and also reduces processing damage (particularly that due to hydrogen reduction), so that any deterioration in the hysteresis loop due to damage can be suppressed. The use of this ferroelectric capacitor 420 therefore enables practicable application of the simple matrix type of ferroelectric memory device 300.

Figure 37A:
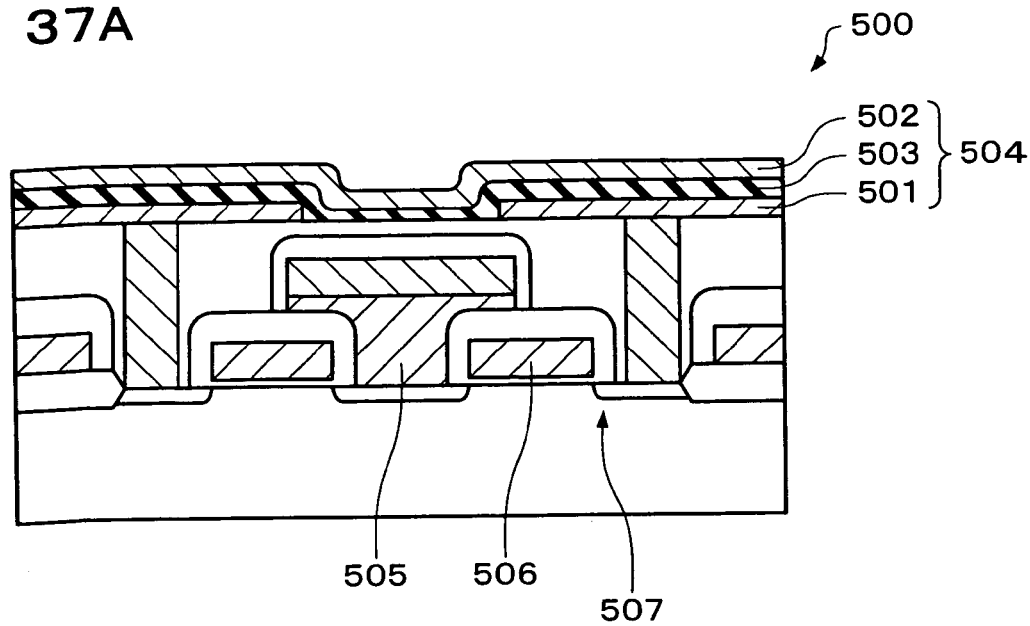
FIG. 37A is a schematic section through a 1T1C type of ferroelectric memory and FIG. 37B is an equivalent circuit schematically showing the 1T1C type of ferroelectric memory.
Figure 37B:
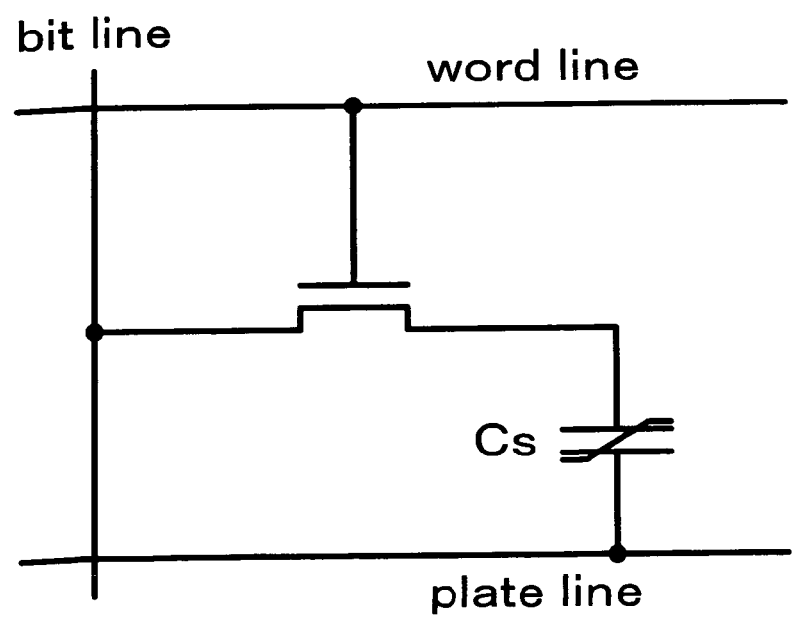

A configurational view of a 1T1C type of ferroelectric memory device 500 that is a variant example is shown in FIG. 37A. an equivalent circuit diagram of the ferroelectric memory device 500 is shown in FIG. 37B.

The ferroelectric memory device 500 is a memory device of a configuration that closely resembles DRAM, having a capacitor 504 (1C) formed of a lower electrode 501, an upper electrode 502 connected to a plate line, and a ferroelectric film 503 to which the PZTN ferroelectric of this embodiment is applied; and a transistor element 507 (1T) for switching wherein either the source or the drain electrode is connected to a data line 505 and a gate electrode 506 is connected to a word line, as shown in FIG. 37A. There are hopes that this structure will replace SRAM since writing and reading with respect to a 1T1C type of memory can be done at high speeds of not more than 100 ns and also the data written thereto is non-volatile.

4. Method of Manufacturing Ferroelectric Memory

The description now turns to a case in which the manufacture method described in "2. Method of Manufacturing Ferroelectric Capacitor" is applied to a method of manufacturing ferroelectric memory.

Figure 38A:
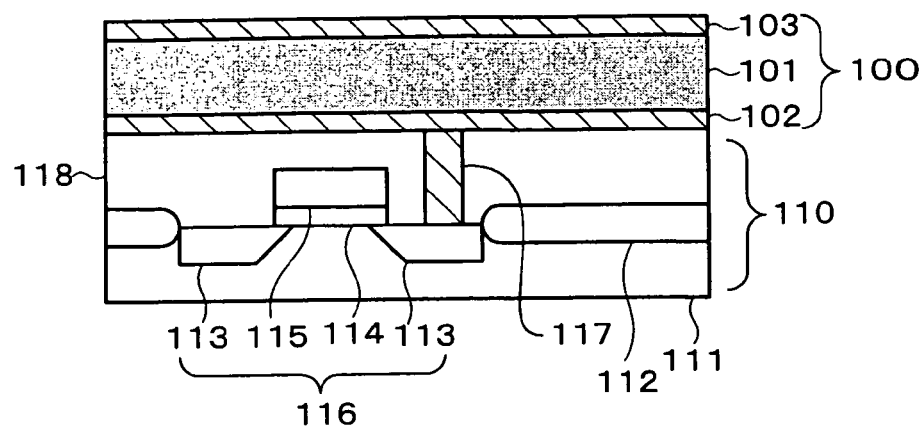
FIGS. 38A to 38C show the process of manufacturing ferroelectric memory.
Figure 38B:
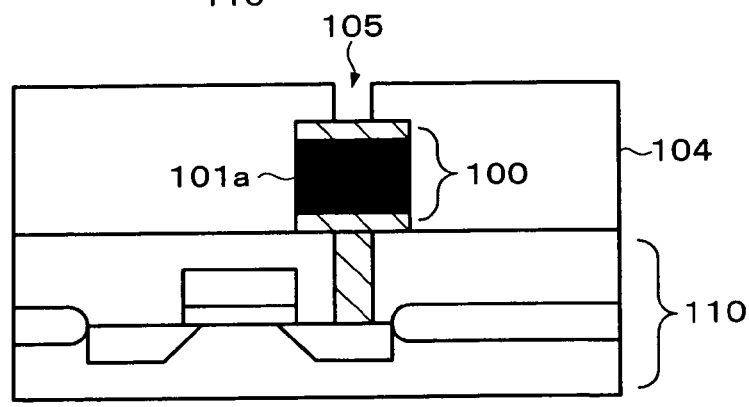
Figure 38C:
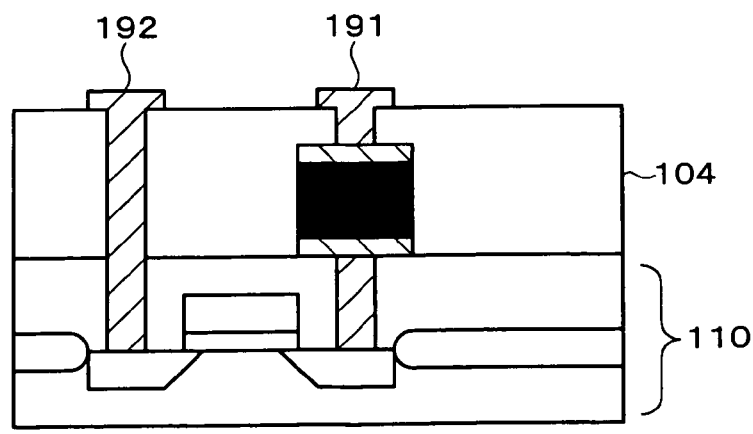

FIGS. 38A to 38C are schematic sections showing an example of the process of manufacturing the ferroelectric memory in accordance with this embodiment.

With this embodiment, the lower electrode 102, the PZTN ferroelectric film 101, and the upper electrode 103 of the ferroelectric capacitor 100 are formed sequentially on the substrate 110, as shown in FIG. 38A. During this time, the ferroelectric film 101 is subjected to preliminary thermal processing in an oxidizing atmosphere, to put it into an amorphous state. Note that the substrate 110 could have a configuration such that a transistor 116 for cell selection is formed on a semiconductor substrate 111, as shown by way of example in FIG. 38A. This transistor 116 could be configured of a source and drain 113, a gate oxide layer 114, and a gate electrode 115. A plug electrode 117 formed of tungsten or the like is formed over either the source or the drain 113, enabling the use of a stack structure that is formed to enable connection to the lower electrode 102 of the ferroelectric capacitor 100. The cells are isolated by an element separation region 112 in the substrate 110 between the cells, and the transistor 116 can have an interlayer dielectric 118 formed of an oxide layer or the like above the transistor 116.

The fabrication process in accordance with this embodiment patterns the ferroelectric capacitor 100 to the desired size and shape, as shown in FIG. 38B. The SiO$_2$ protective film 104 is formed by using trimethylsilane (TMS) to cover the ferroelectric capacitor 100, a contact hole 105 for connection to the exterior is formed, and then thermal processing is preformed to crystallize the PZTN ferroelectric and form the ferroelectric film 101a. During the crystallization of the PZTN ferroelectric, the thermal processing for the crystallization could be performed in a non-oxidizing atmosphere, This makes it possible to prevent any oxidation damage due to high-temperature thermal processing to peripheral components (such as metal wiring) outside of the ferroelectric capacitor 100.

Finally, a contact hole for connecting the transistor 116 to the exterior is formed in the SiO$_2$ protective film 104 and the ferroelectric memory is completed by the formation of metal wiring layers 191 and 192, as shown in FIG. 38C. The fabrication process of this embodiment enables the omission of the process of forming a barrier film for protecting the ferroelectric film 101 from reductive reactions, which is necessary in the conventional art, thus enabling an increase in productivity and a reduction in production costs. Since this enables the formation of the ferroelectric capacitor 100 that has a favorably square hysteresis characteristic even although the process of forming that barrier layer is omitted, it makes it possible to obtain ferroelectric memory with superlative characteristics.

Note that the descriptions above dealt with the process of manufacturing a 1T1C type of ferroelectric memory but the method of manufacturing a ferroelectric capacitor in accordance with this embodiment can also be applied to methods of manufacturing ferroelectric memory that use other types of cell, such as the 2T2C type or the simple matrix type (crosspoint-type).

5. Piezoelectric Element and Inkjet-Type Recording Head

The description now turns to details of an inkjet type of recording head in accordance with an embodiment of the present invention.

In an inkjet-type recording head wherein part of a stress generating chamber that communicates with a nozzle aperture that ejects ink droplets is formed of a vibrating plate, where ink in the stress generating chamber is pressurized by distortions of this vibrating plate by a piezoelectric element and is ejected as ink droplets from a nozzle aperture, there are two methods of implementation: one using a piezoelectric actuator having longitudinal resonance mode by which a piezoelectric element resonates longitudinally to expand and contract in the axial direction and one using an piezoelectric actuator having a flexural resonance mode.

It is known to form a uniform piezoelectric layer by a film-formation technique over the entire surface of a vibrating plate, for use as an actuator of a flexural resonance mode, then divide that piezoelectric layer by a lithography method into shapes corresponding to stress generating chambers and form a piezoelectric element independently for each stress generating chamber.

Figure 39:
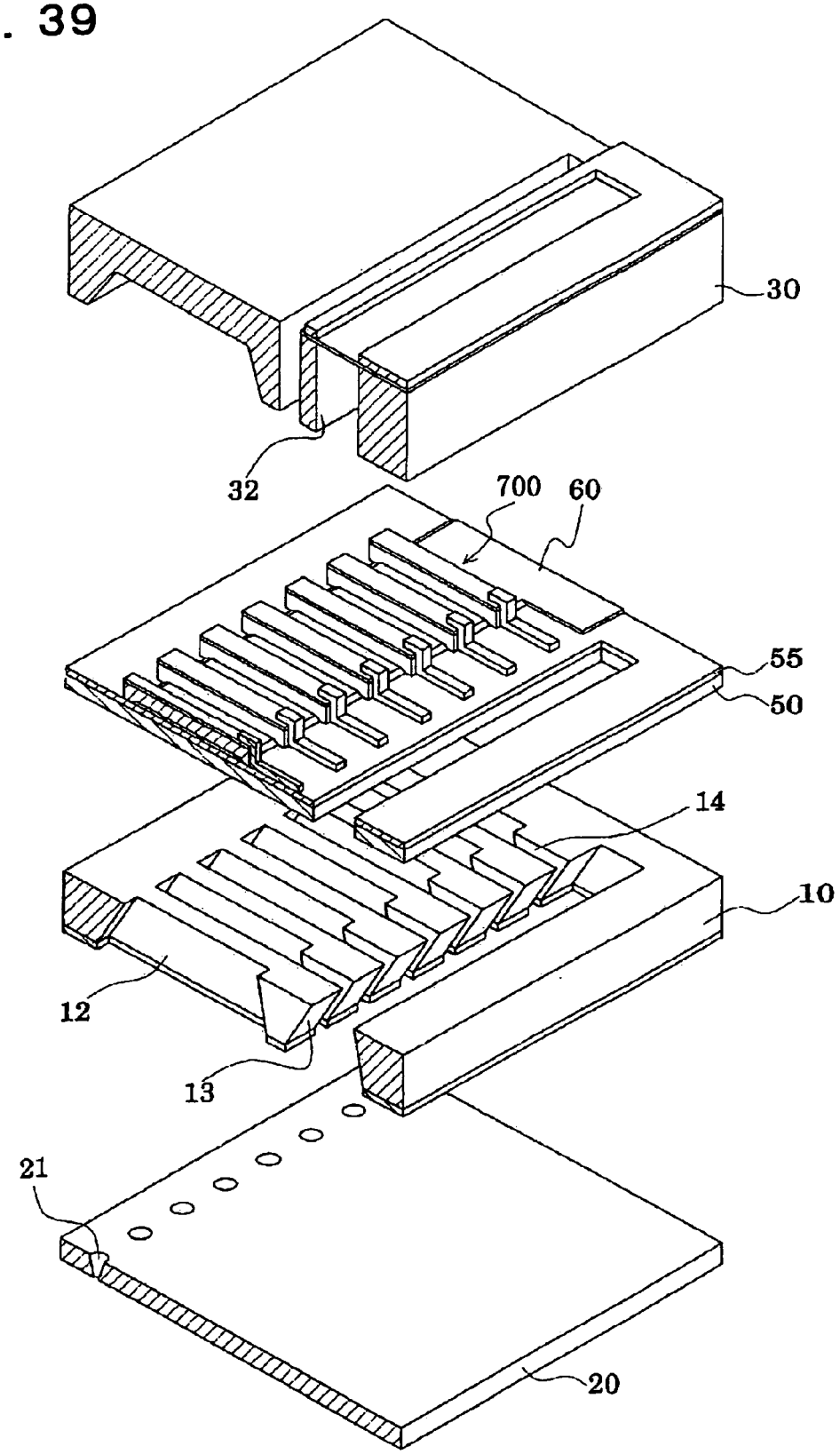
FIG. 39 is an exploded perspective view of a recording head.
Figure 40A:
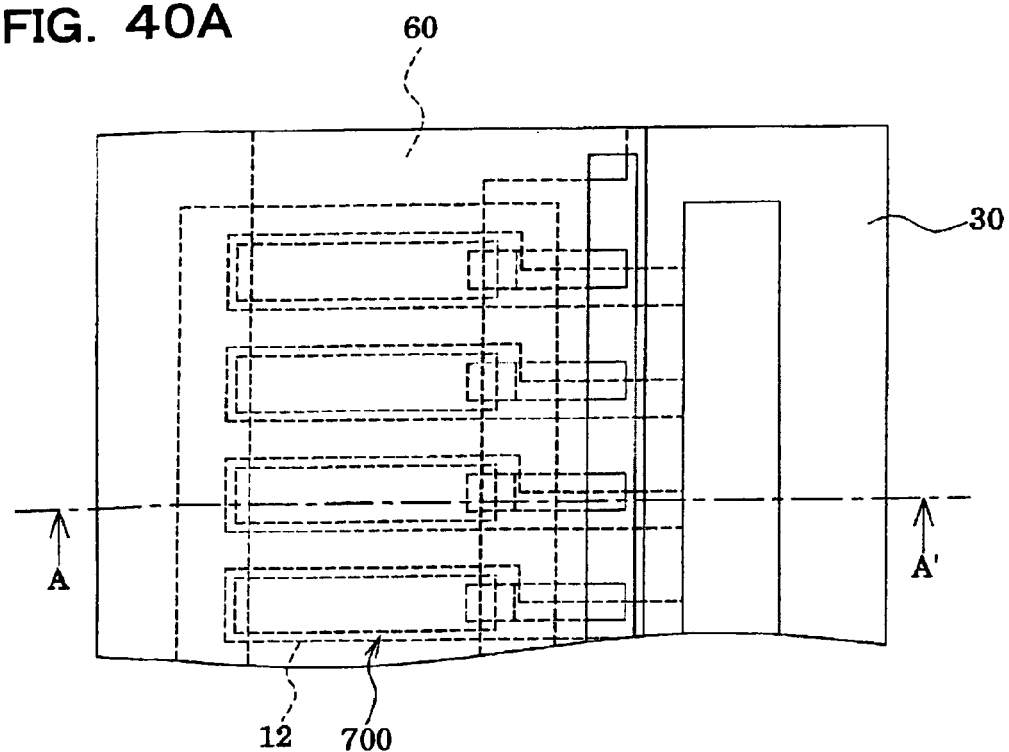
FIG. 40A is a plan view of the recording head and FIG. 40B is a section through the recording head.
Figure 40B:
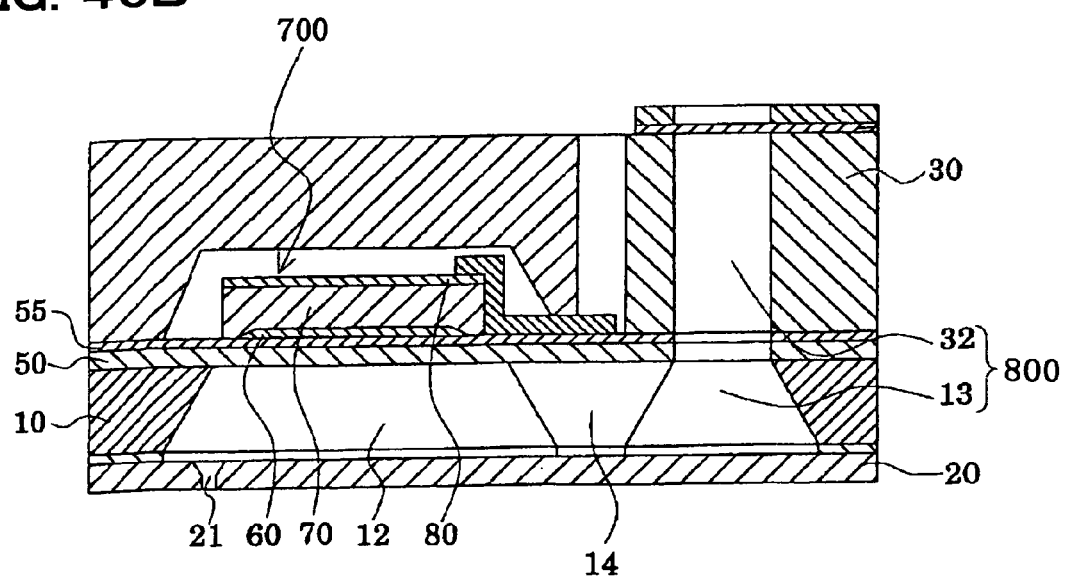
Figure 41:
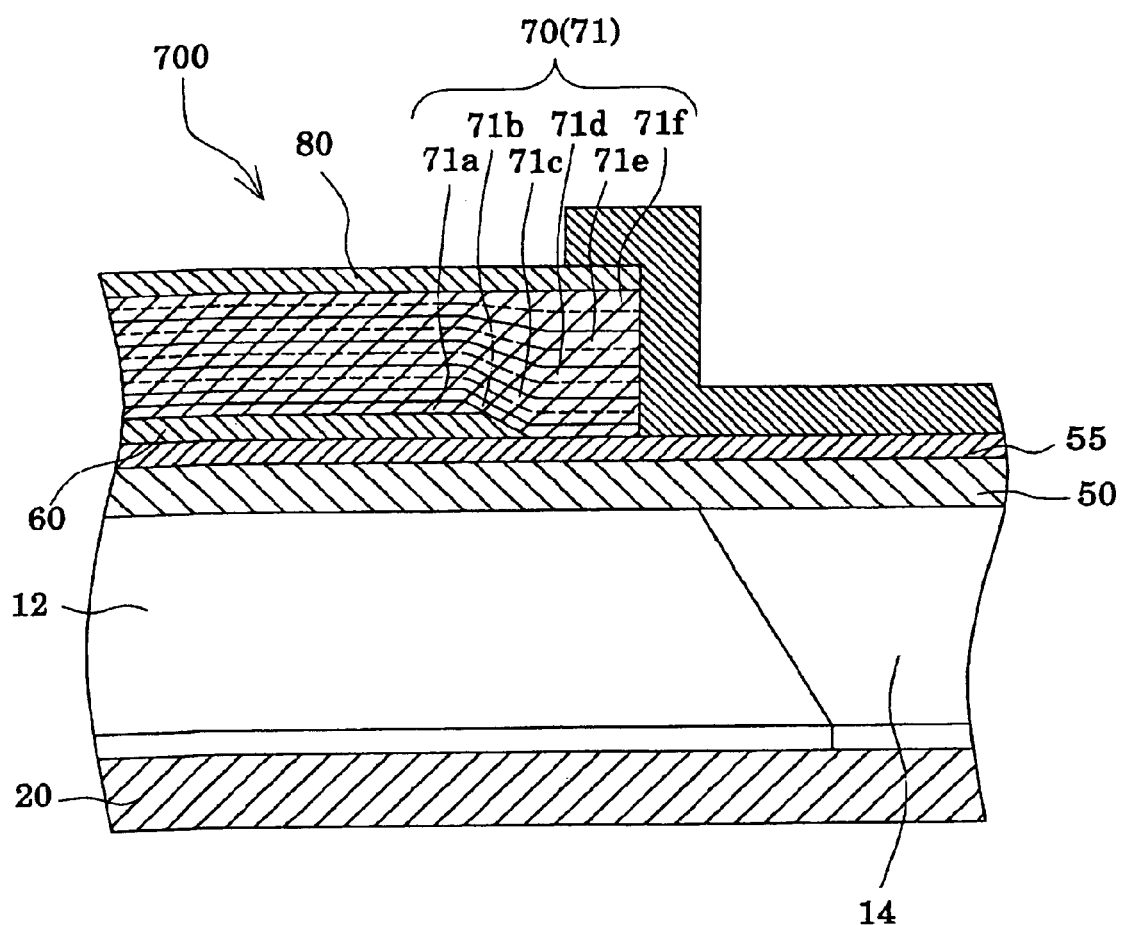
FIG. 41 is a schematic section through the layer structure of a piezoelectric element.

A partial perspective view of parts of an inkjet-type recording head in accordance with an embodiment of the present invention is shown in FIG. 39, a plan view and a section taken along the line A-A' of FIG. 39 are shown in FIGS. 40A and FIG. 40B, and a schematic view of the layer structure of a piezoelectric element 700 is shown in FIG. 41. As shown in these figures, a flow path shaping substrate 10 is formed of a (110)-orientation silicon monocrystalline substrate in accordance with this embodiment, and an elastic film 50 of thickness 1 to 2 μm is formed of silicon dioxide by previous thermal oxidation on one surface thereof. A plurality of stress generating chambers 12 are arrayed in the widthwise direction of the flow path shaping substrate 10. A connective portion 13 is formed in the longitudinal direction of a region on the outer side of the stress generating chambers 12 of the flow path shaping substrate 10 and the connective portion 13 and the stress generating chambers 12 communicate through an ink supply path 14 provided for each stress generating chamber 12. Note that the connective portion 13 forms part of a reservoir 800 that forms a common ink chamber for the stress generating chambers 12 communicating with a reservoir portion of a sealing substrate 30 that will be described later. Each ink supply path 14 is formed to width that is narrower than the stress generating chamber 12, to keep the resistance of ink flowing into the stress generating chamber 12 from the ink supply path 14 constant.

On an aperture surface side of the flow path shaping substrate 10, a nozzle plate 20 is affixed by adhesive or thermal bonding film. Nozzle apertures 21 pierce the nozzle plate 20 and communicate with an edge portion on the opposite side from the ink supply paths 14 of the stress generating chambers 12.

On the opposite side from the aperture surface of the flow path shaping substrate 10, the elastic film 50 of a thickness of approximately 1.0 μm, by way of example, is formed as mentioned previously, and a dielectric film 55 of a thickness of approximately 0.4 μm, by way of example, is formed on that elastic film 50. In addition, a lower electrode film 60 of a thickness such as approximately 0.2 μm, a piezoelectric layer 70 of a thickness such as approximately 1.0 μm, and an upper electrode film 80 of a thickness such as approximately 0.05 μm are formed in a stack on the dielectric film 55 by processing that will be described later, to form the piezoelectric element 700. In this case, the piezoelectric element 700 is the portion including the lower electrode film 60, the piezoelectric layer 70, and the upper electrode film 80. In general, one electrode of the piezoelectric element 700 is a common electrode and the other electrode and the piezoelectric layer 70 are patterned to form each stress generating chamber 12. A portion formed of the thus-patterned electrode and the piezoelectric layer 70 that generates piezoelectric strain by the application of a voltage to the two electrodes is called an active piezoelectric portion. With this embodiment, the lower electrode film 60 is the common electrode of the piezoelectric element 700 and the upper electrode film 80 is the other electrode of the piezoelectric element 700, but there is no obstacle to reversing these roles to suit the circumstances of the drive circuit or wiring. In either case, an active piezoelectric portion is formed for each stress generating chamber. In this case, the combination of the piezoelectric element 700 and the vibrating plate in which displacements are generated by the driving of that piezoelectric element 700 is called a piezoelectric actuator. Note that the piezoelectric layer 70 is provided independently for each stress generating chamber 12 and is configured of a plurality of layers of ferroelectric film 71 (71*a* to 71*f*).

Figure 42:
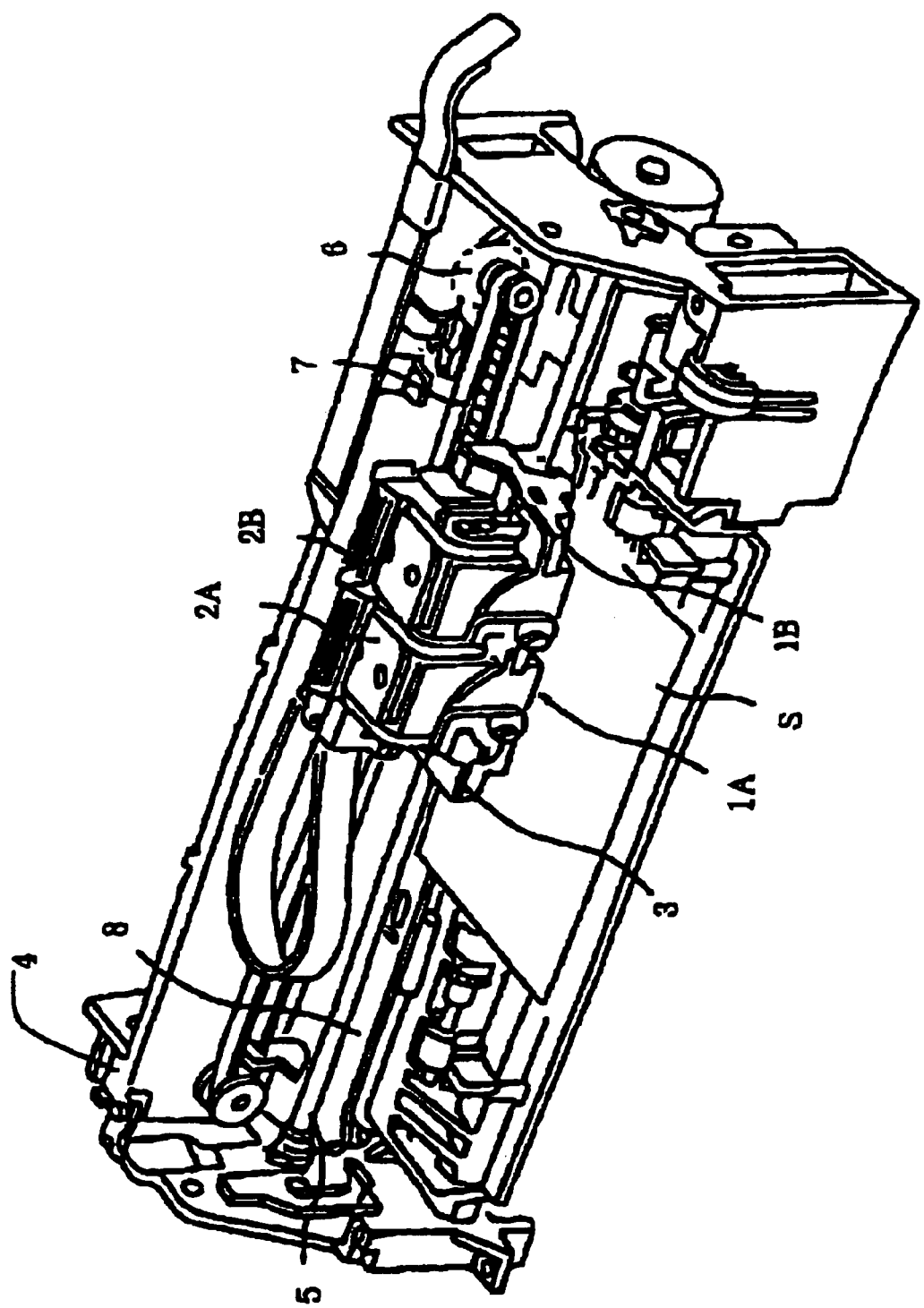
FIG. 42 is a schematic view of an example of an inkjet-type recording device.

An inkjet-type recording head forms part of a recording head unit that provides an ink flow path communicating with an ink cartridge or the like, and is mounted in an inkjet-type recording device. A schematic view of an example of this inkjet-type recording device is shown in FIG. 42. As shown in FIG. 42, recording head units 1A and 1B having inkjet-type recording heads are provided with removable cartridges 2A and 2B that form ink supply means, and a carriage in which these recording head units 1A and 1B are mounted is provided so as to be able to move freely in the axial direction of a carriage shaft 5 that is attached in a device body 4. These recording head units 1A and 1B are designed to eject substances that compose black ink and color ink, respectively. The carriage 3 in which the recording head units 1A and 1B are mounted is made to move along the carriage shaft 5 by the transfer of a driving force of a drive motor 6 to the carriage 3 through a plurality of gearwheels (not shown in the figure) and a timing belt 7. A platen 8 is also provided on the carriage shaft 5 in the device body and a sheet S that is a sheet of a recording medium such as paper supplied by paper-supply rollers (not shown in the figure) is transferred onto the platen 8.

Note that the description above relates to one example of an inkjet-type recording head that ejects ink as a liquid ejection head, but the present invention can also be applied widely to liquid ejection heads and liquid ejection devices in which piezoelectric elements are used. Examples of such a liquid ejection head include a recording head used in an image recording device such as a printer, a color jet head used for forming a color filter for a liquid-crystal display or the like, an organic EL display, an electrode material ejection head used for forming electrodes for a field emission display (FED) or the like, and a living organic ejection head used in the formation of biochips.

Since the piezoelectric element of this embodiment uses a PZTN film in accordance with this embodiment as described above as the piezoelectric layer, it achieves the following effects.

1) Since covalence is increased in the piezoelectric layer, the piezoelectric constant is increased.

2) It is easy to apply an electrical field that suppresses the generation of faults in the interface between the piezoelectric layer and the electrode, for suppressing any insufficiency of PbO in the piezoelectric layer, enabling an increase in the efficiency thereof as a piezoelectric element.

3) Since leakage currents in the piezoelectric layer are suppressed, it is possible to make a thin film of the piezoelectric layer.

A liquid ejection head and liquid ejection device in accordance with this embodiment makes use of a piezoelectric element including the above-described piezoelectric layer, enabling it to achieve the following effect in particular.

4) Since a reduction in fatigue deterioration of the piezoelectric layer is enabled, time-related changes in the displacement magnitude of the piezoelectric layer can be suppressed, enabling an increase in reliability.

The present invention has been described above with reference to preferred embodiments thereof but the present invention is not limited thereto and thus is it possible to implement other types of distortion within the range of the invention as laid out herein.

Figure 43A:
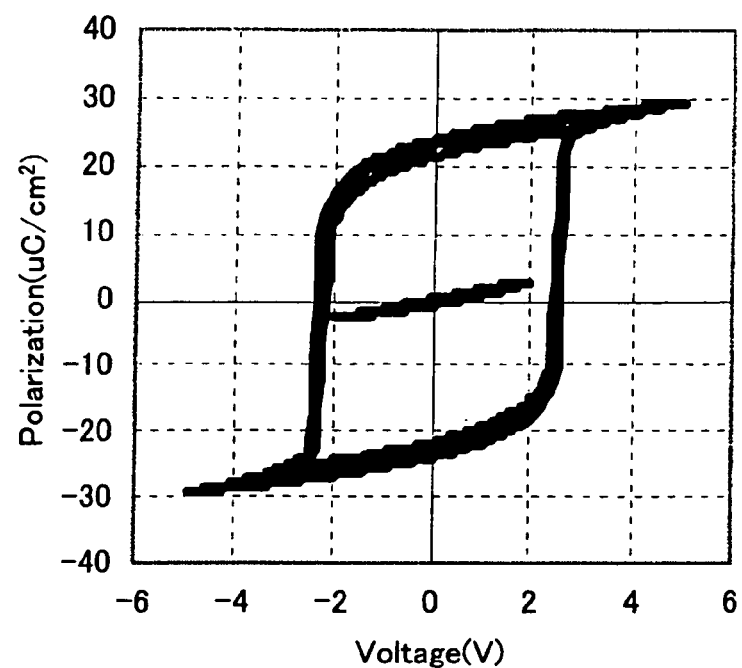
FIG. 43A shows the hysteresis characteristic of a ferroelectric film in which Ta has been added to PZT and FIG. 43B shows the hysteresis characteristic of a ferroelectric film in which W has been added to PZT.
Figure 43B:
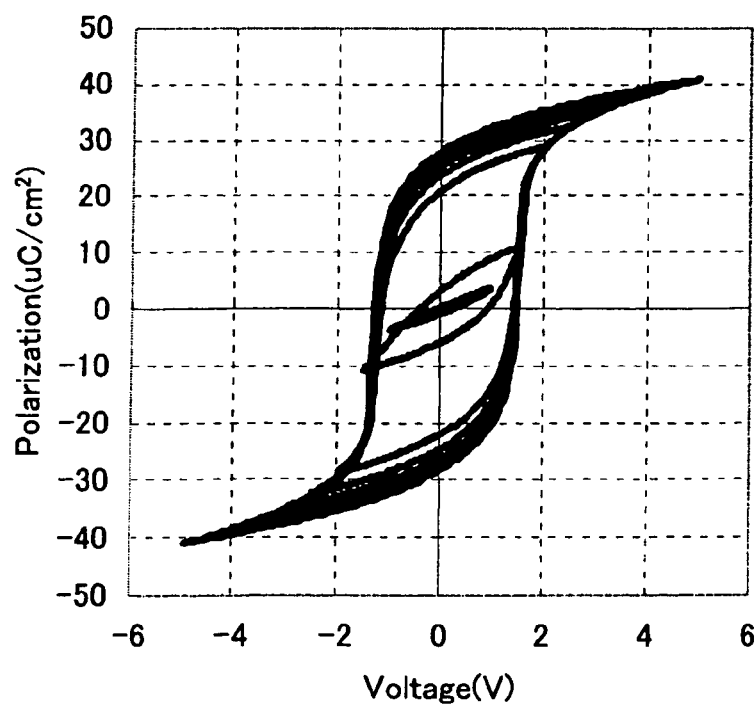
Figure 45C:
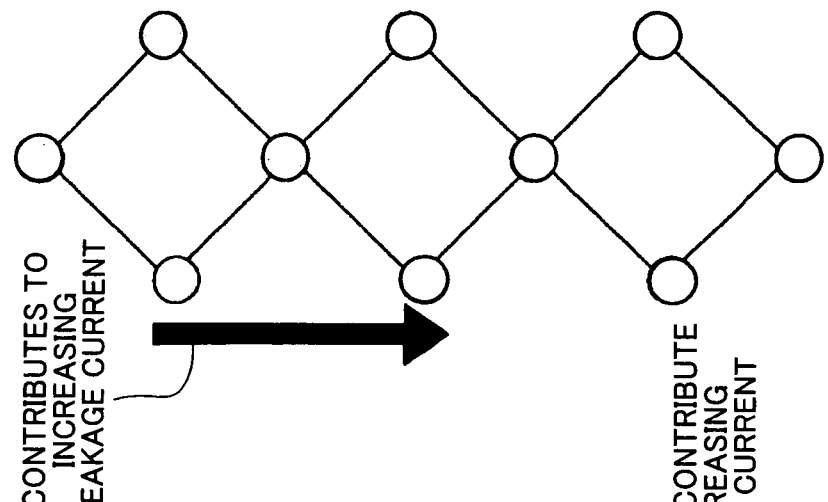
FIGS. 45A to 45C are illustrative of Schottky defects in the Brownmillerite crystal structure.
Figure 45B:
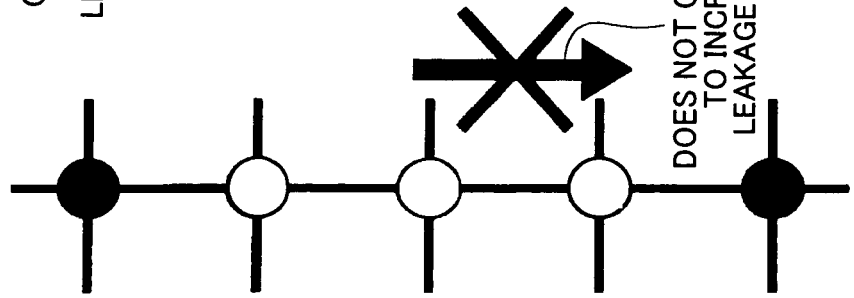
Figure 45A:
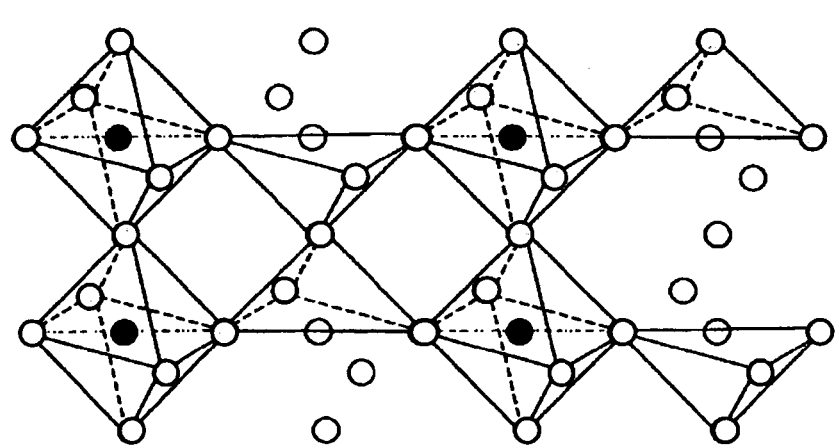

For example, the substitution of Ta, W, V, or Mo for the Nb in the PZT of the ferroelectric film 101, or the addition thereof, would have similar effects. The use of Mn as an addition would have effects similar to those of Nb. Similar thinking would lead to the substitution of elements of a valence of +3 or greater, to prevent the escape of Pb, and candidates therefor could be of the lanthanoide series, such as La, Ce, Pr, Nd, Pm, Sm, Eu, Gd, Tb, Dy, Ho, Er, Tm, Yb and Lu. In addition the additive that promotes crystallization could be a germanate (Ge) instead of a silicate. The hysteresis characteristic of a material in which 10 mol % Ta is added to the PZT in place of Nb is shown in FIG. 43A. The hysteresis characteristic of a material in which 10 mol % W is added to the PZT in place of Nb is shown in FIG. 43B. It is clear that the use of Ta would have a similar effect to that obtained by the addition of Nb. Similarly, the use of W have also a similar effect to that obtained by the addition of Nb, from the viewpoint of a hysteresis characteristic has good insulating properties.

What is claimed is:

1. A ferroelectric film that is described by $AB_{1-x}Nb_xO_3$, wherein an A element includes at least Pb, wherein a B element includes at least Zr and Ti, and wherein X is within the range of: $0.1 < X \leq 0.4$.

2. A ferroelectric film that is described by $AB_{1-x}Nb_xO_3$, wherein an A element includes at least Pb, wherein a B element includes at least Zr and Ti, wherein X is within the range of: $0.05 \leq X \leq 0.4$, and further comprising Si.

3. The ferroelectric film as defined by claim 2, wherein Si is within the range of: 0.5 to 5 mol %.

4. The ferroelectric film as defined by claim 2, further comprising Ge.

5. The ferroelectric film as defined by claim 2, having a crystal structure of at least one of tetragonal and rhombohedral systems.

6. The ferroelectric film as defined by claim 2, wherein an amount of Pb vacancy is less than 20 mol % of a stoichiometric composition of the $AB_{1-x}Nb_xO_3$.

7. The ferroelectric film as defined by claim 6, wherein the amount of Pb vacancy is half of X.

8. A ferroelectric memory device comprising:
a substrate,
a transistor formed on the substrate,
a ferroelectric capacitor formed above the substrate, and
wherein the ferroelectric capacitor comprises a ferroelectric film as defined by claim 2.

9. A piezoelectric actuator comprising:
a substrate,
a piezoelectric element formed above the substrate, and
wherein the piezoelectric element comprises a ferroelectric film as defined by claim 2.

* * * * *